(12) United States Patent
Treibergs et al.

(10) Patent No.: US 11,867,752 B1
(45) Date of Patent: Jan. 9, 2024

(54) CONTACT ASSEMBLY AND KELVIN TESTING SYSTEM HAVING CONTACT ASSEMBLY

(71) Applicant: Johnstech International Corporation, Minneapolis, MN (US)

(72) Inventors: Valts Treibergs, White Bear Township, MN (US); Max A. Carideo, Plymouth, MN (US); David Skodje, Minneapolis, MN (US); Melissa Hasskamp, Minneapolis, MN (US)

(73) Assignee: Johnstech International Corporation, Minneapolis, MN (US)

( * ) Notice: Subject to any disclaimer, the term of this patent is extended or adjusted under 35 U.S.C. 154(b) by 0 days.

(21) Appl. No.: 17/732,815

(22) Filed: Apr. 29, 2022

Related U.S. Application Data

(60) Provisional application No. 63/188,226, filed on May 13, 2021.

(51) Int. Cl.
  *G01R 31/28* (2006.01)
(52) U.S. Cl.
  CPC .................. *G01R 31/2886* (2013.01)
(58) Field of Classification Search
  CPC .............. G01R 31/2886; G01R 1/0466; H01R 13/2407
  See application file for complete search history.

(56) References Cited

U.S. PATENT DOCUMENTS

| | | | |
|---|---|---|---|
| 7,074,049 B2 | 7/2006 | O'Sullivan et al. | |
| 7,255,576 B2 | 8/2007 | O'Sullivan et al. | |
| 7,256,593 B2 | 8/2007 | Treibergs | |
| 7,338,293 B2 | 3/2008 | Gilk | |
| 7,639,026 B2 | 12/2009 | Shell et al. | |
| 7,722,361 B2 | 5/2010 | Lopez et al. | |
| 7,862,391 B2 | 1/2011 | Johnston et al. | |
| 7,918,669 B1* | 4/2011 | Tiengtum | G01R 1/0466 324/754.03 |
| 8,354,854 B2 | 1/2013 | Sherry | |
| 8,441,275 B1 | 5/2013 | Alladio | |
| 8,460,010 B2 | 6/2013 | Kimura et al. | |
| 8,523,579 B2 | 9/2013 | Johnston et al. | |
| 8,558,554 B2 | 10/2013 | Erdman | |
| 8,988,090 B2 | 3/2015 | Erdman et al. | |
| 9,328,201 B2 | 5/2016 | Ebert et al. | |
| 9,500,673 B2 | 11/2016 | Erdman et al. | |
| 9,606,143 B1 | 3/2017 | Sherry et al. | |
| 9,829,506 B2 | 11/2017 | Treibergs et al. | |

(Continued)

*Primary Examiner* — Akm Zakaria
(74) *Attorney, Agent, or Firm* — Hamre, Schumann, Mueller & Larson, P.C.

(57) ABSTRACT

A contact assembly for a Kelvin testing system for testing integrated circuit devices is disclosed. The contact assembly includes at least one grouping of blades including a first force blade, a second force blade, a first sense blade, and a second sense blade; an electrical insulation layer disposed between the first force blade and the first sense blade and between the second force blade and the second sense blade; and an elongated elastomer. The elastomer is configured to be retained by the first force blade, the second force blade, the first sense blade, and the second sense blade. Each of the first force blade, the second force blade, the first sense blade, and the second sense blade includes a recess having an opening and sized to receive and retain at least a portion of the elastomer.

16 Claims, 29 Drawing Sheets

(56) References Cited

U.S. PATENT DOCUMENTS

| | | | |
|---|---|---|---|
| 10,247,755 | B2 | 4/2019 | Erdman et al. |
| 10,725,069 | B1 | 7/2020 | Nelson et al. |
| 2006/0279301 | A1 | 12/2006 | Treibergs |
| 2010/0264935 | A1* | 10/2010 | Erdman ................ G01R 1/067 |
| | | | 324/537 |
| 2011/0024911 | A1* | 2/2011 | Shibuya ................ G01R 27/14 |
| | | | 257/E21.531 |
| 2014/0103952 | A1 | 4/2014 | Kuong et al. |
| 2014/0273307 | A1* | 9/2014 | Butsoongnoen ........ H01L 22/12 |
| | | | 438/15 |
| 2015/0241474 | A1* | 8/2015 | Landa ................ G01R 31/2851 |
| | | | 324/756.02 |
| 2016/0204537 | A1* | 7/2016 | Nazzaro ................ H01R 13/46 |
| | | | 439/78 |
| 2019/0072583 | A1* | 3/2019 | Tan .................... G01R 1/06783 |
| 2022/0107359 | A1 | 4/2022 | Treibergs et al. |

* cited by examiner

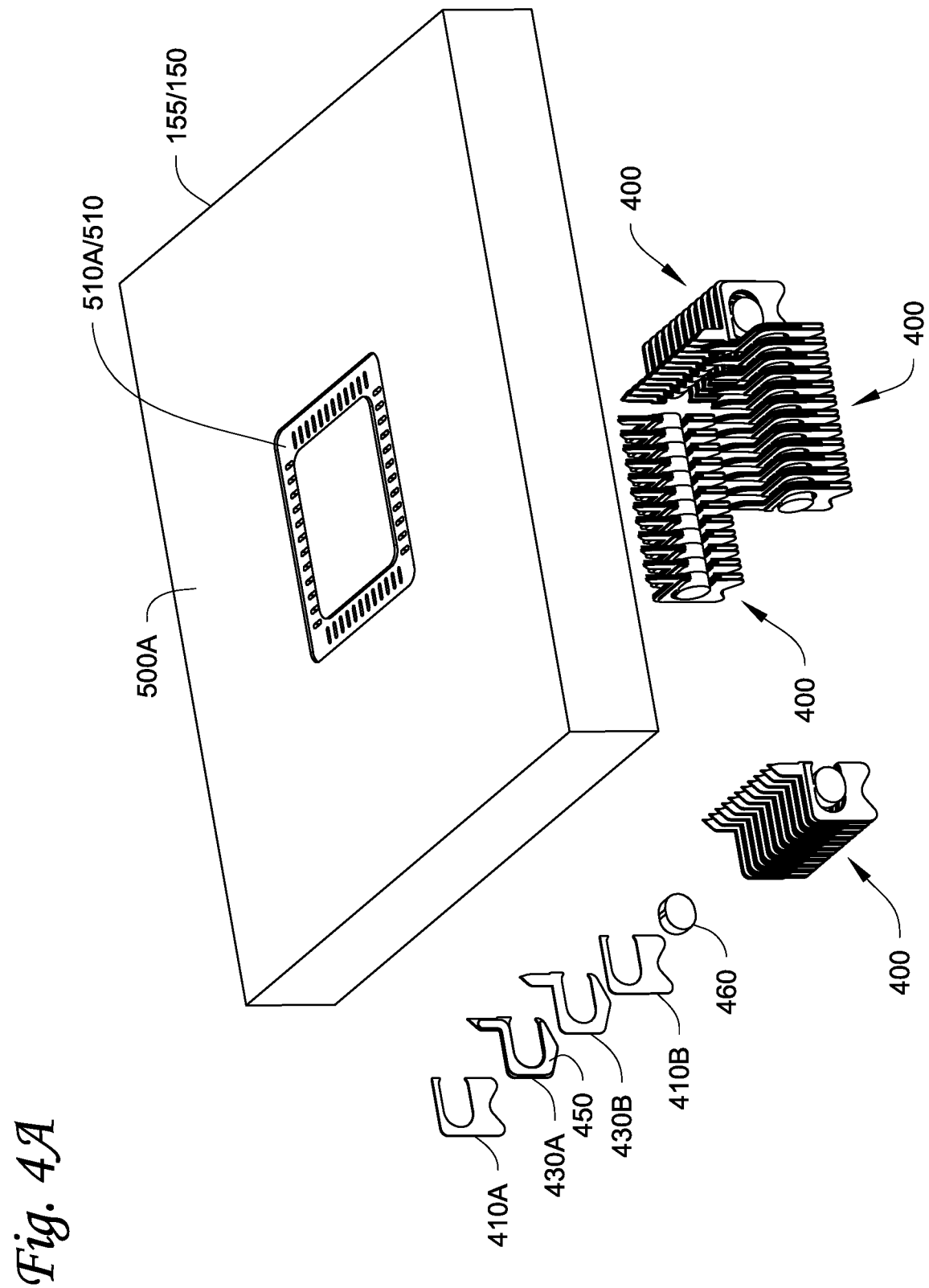

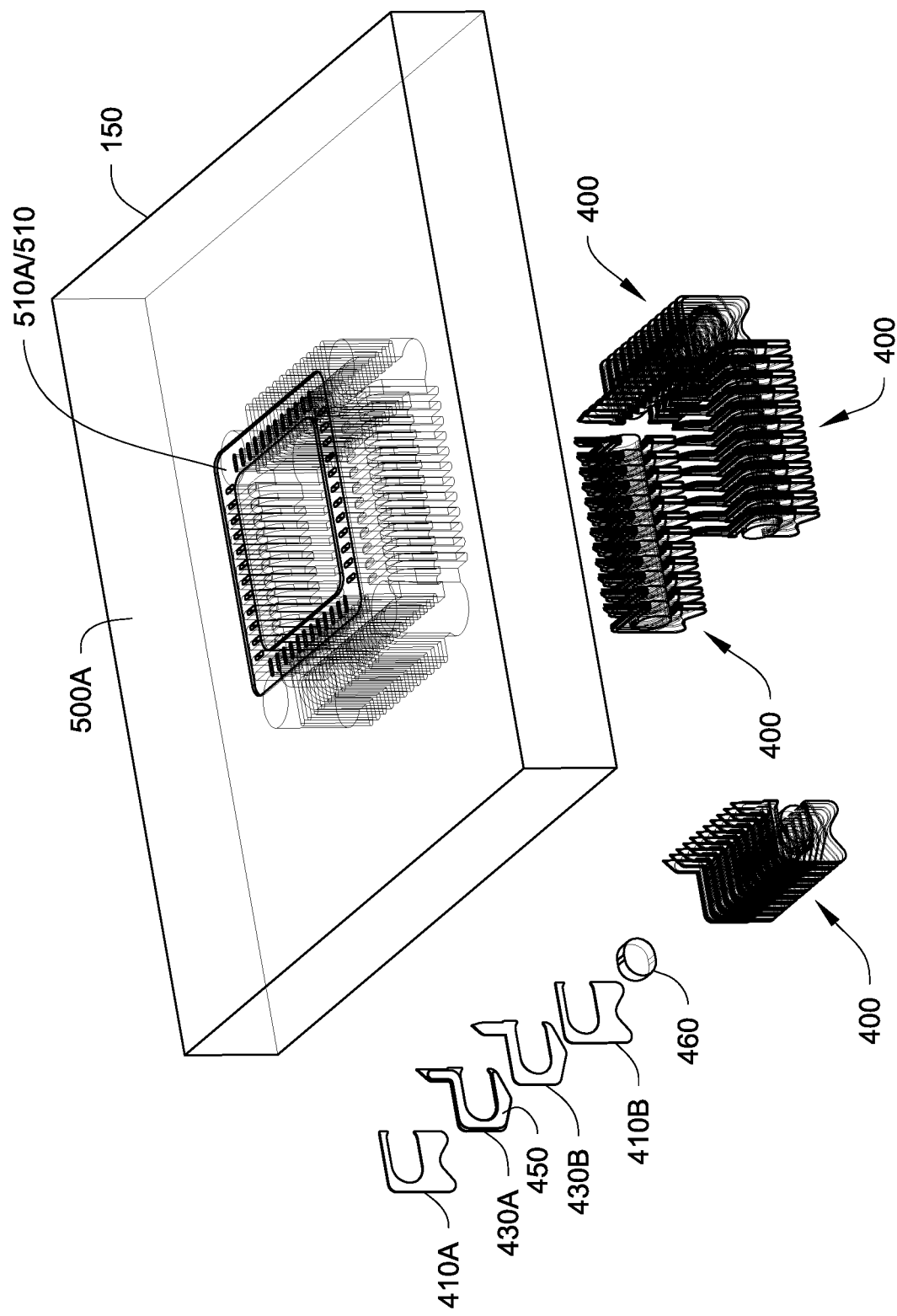

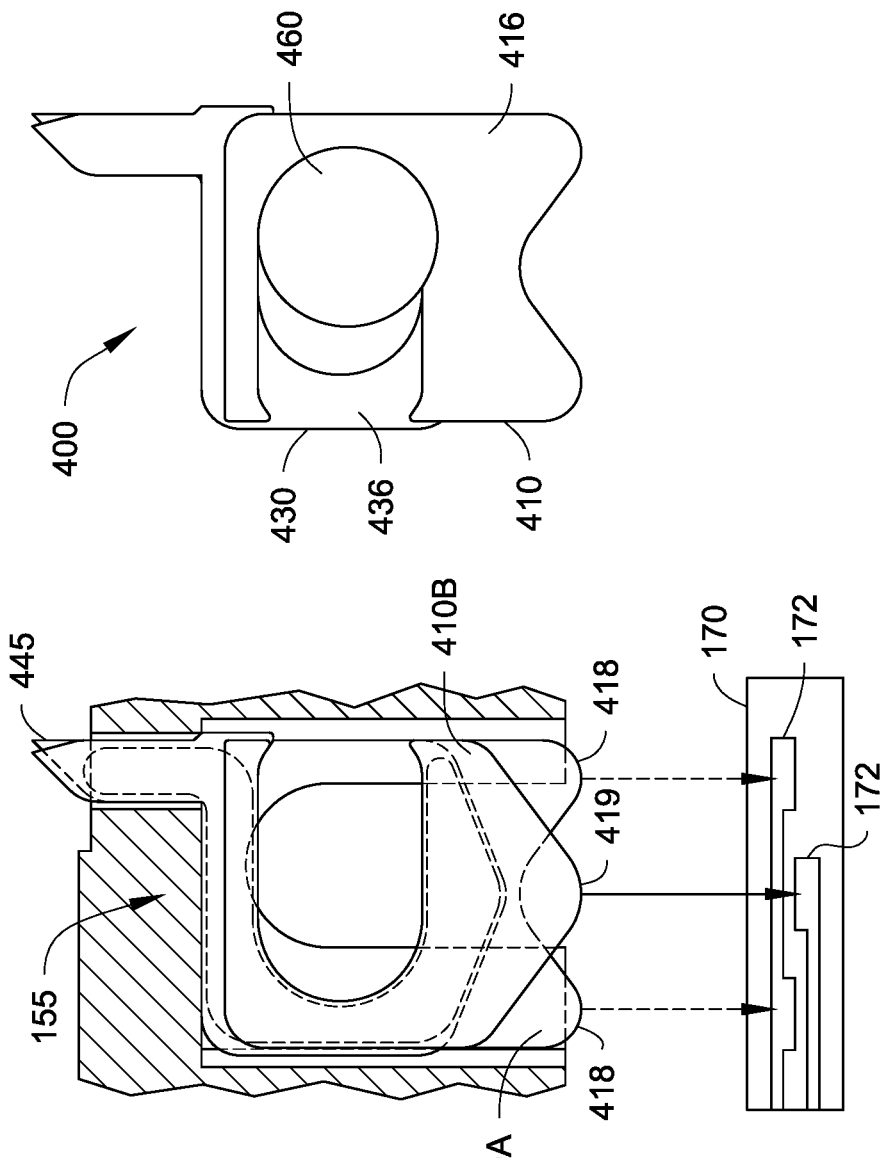

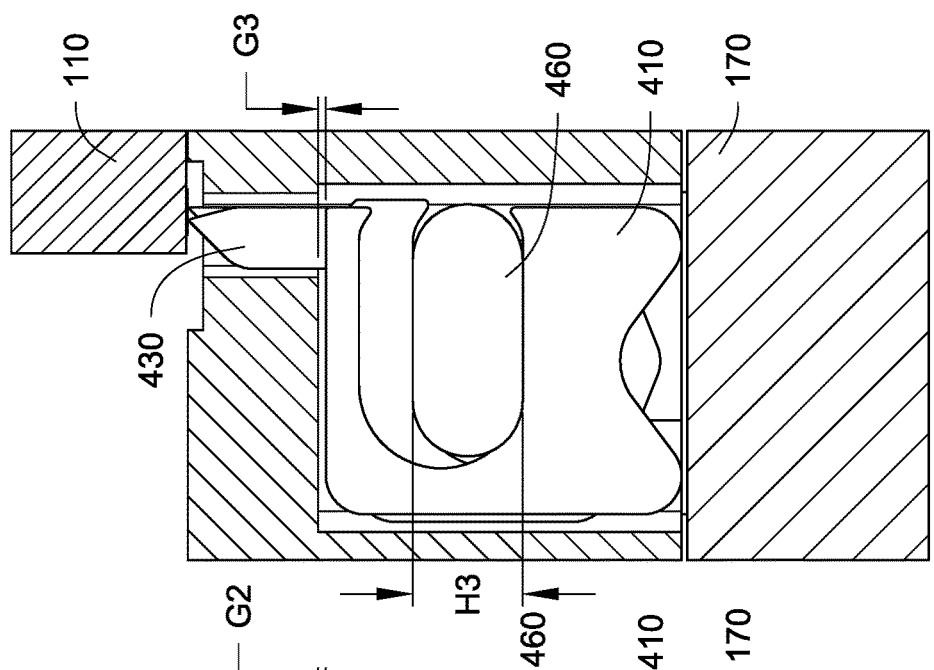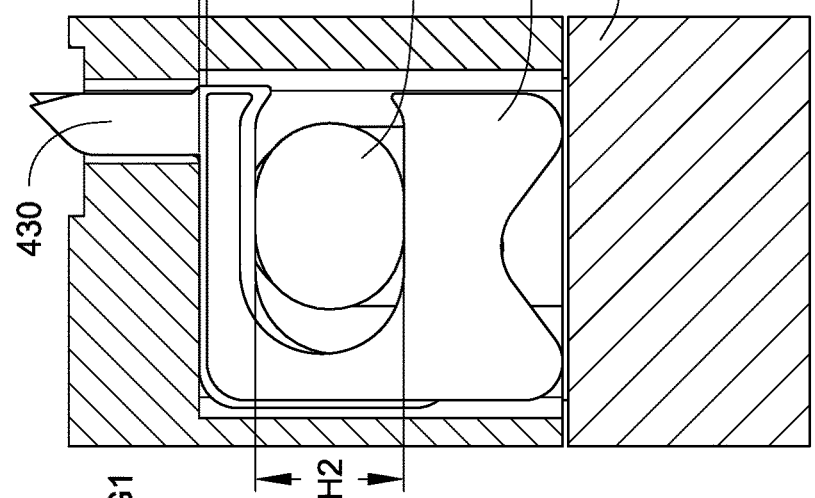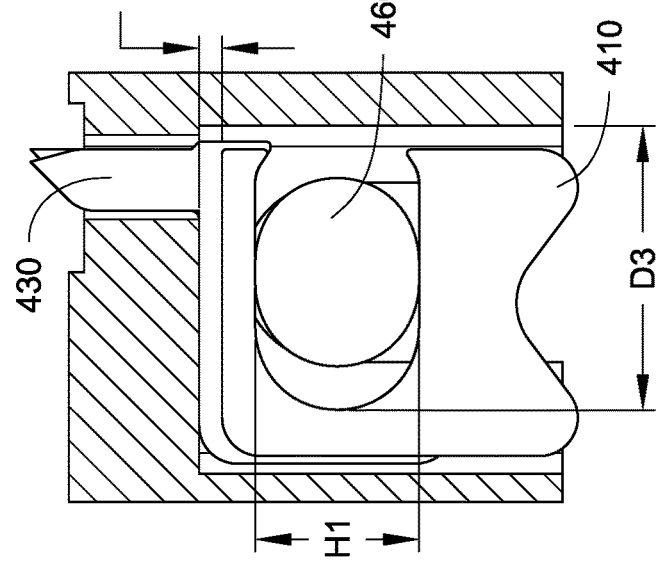

570

570

570

570

CONTACT ASSEMBLY AND KELVIN TESTING SYSTEM HAVING CONTACT ASSEMBLY

TECHNICAL FIELD

This disclosure relates generally to the field of testing microcircuits (e.g., chips such as semiconductor devices, integrated circuits, etc.). More specifically, the disclosure relates to a contact assembly that provide electrical connection to a device under test (DUT) by making contact to a load board of a Kelvin testing system, and relates to Kelvin testing systems having the contact assembly.

BACKGROUND

The manufacturing processes for microcircuits cannot guarantee that every microcircuit is fully functional. Dimensions of individual microcircuits are microscopic and process steps very complex, so small or subtle failures in a manufacturing process can often result in defective devices. Mounting a defective microcircuit on a circuit board is relatively costly. Installation usually involves soldering the microcircuit onto the circuit board. Once mounted on a circuit board, removing a microcircuit is problematic because the very act of melting the solder for a second time may ruin the circuit board. Thus, if the microcircuit is defective, the circuit board itself is probably ruined as well, meaning that the entire value added to the circuit board at that point is lost. For all these reasons, a microcircuit is usually tested before installation on a circuit board. Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacing between them, even small errors in making the contact will result in incorrect connections. A further problem in microcircuit test equipment arises in automated testing. Testing equipment may test one hundred devices a minute, or even more. The sheer number of tests cause wear on the tester contacts making electrical connections to the microcircuit terminals during testing. This wear dislodges conductive debris from both the tester contacts and the device under test (DUT) terminals that contaminates the testing equipment and the DUTs themselves. The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases. Test equipment in current use has an array of test contacts that mimic the pattern of the microcircuit terminal array. The array of test contacts is supported in a structure that precisely maintains the alignment of the contacts relative to each other. An alignment board or plate or template aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

There can be a type of testing known as "Kelvin" testing, which can accurately measure the resistance between two terminals (e.g., signal and power (S&P) terminals) on the DUT. Basically, Kelvin testing involves forcing a current to flow between the two terminals, measuring the voltage difference between the two terminals, and using Ohm's Law to derive the resistance between the terminals, given as the voltage divided by the current. Each terminal on the DUT is electrically connected to two contacts and their associated pads on the load board. One of the two pads, known as the "force" connection, supplies a known amount of current. The other pad, known as the "sense" connection, is a high-impedance connection that acts as a voltmeter, which does not draw any significant amount of current. In other words, each terminal on the DUT that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals and four contact pads.

The contacts that form the temporary electrical connections between the DUT and the load board may be used in several manners. In a "standard" test, each contact connects a particular terminal on the DUT to a particular pad on the load board, with the terminals and pads being in a one-to-one relationship. For these standard tests, each terminal corresponds to exactly one pad, and each pad corresponds to exactly one terminal. In a "Kelvin" test, there are two contacts contacting each terminal on the DUT, as described above. For these Kelvin tests, each terminal on the DUT corresponds to two pads on the load board, and each pad on the load board corresponds to exactly one terminal on the DUT. Although the testing scheme may vary, the mechanical structure and use of the contacts is essentially the same, regardless of the testing scheme.

BRIEF SUMMARY

Embodiments disclosed herein provide a solution that addresses each of the above-mentioned problems. Embodiments disclosed herein provide a contact assembly that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the contact assembly can be composed of multiple contact pieces in blade (or plate) structure with an insulation layer in between to separate the force blades and the sense blades. The contact pieces are retained by the elastomer and guided by the housing of the test contactor.

It will be appreciated that using a non-conductive elastomer material as mechanism for compliance and force may avoid inclusion of a convoluted conductive spring technologies that can introduce resonance frequencies when used external to the contact element, common of many spring pin Kelvin solutions. The elastomer can enable simple blades with 2D geometry that enables low cost manufacturing, tight pitch along one row or column with downside of not accommodating an array, and a large cross section for current carrying capacity while at a small pitch due to the large width to thickness ratio for each contact blade.

Also disclosed is a contact assembly for a Kelvin testing system for testing integrated circuit devices. The contact assembly includes at least one grouping of blades including a first force blade, a second force blade, a first sense blade, and a second sense blade; an electrical insulation layer disposed between the second force blade and the second sense blade; and an elongated elastomer. The elastomer is configured to be retained by the first force blade, the second force blade, the first sense blade, and the second sense blade. The first force blade, the second force blade, the first sense blade, and the second sense blade are disposed in a side by side generally parallel relationship. The first force blade, the second force blade, the first sense blade, and the second sense blade are configured to be longitudinally slidable with respect to each other. The second force blade and the second sense blade are disposed between the first force blade and the first sense blade. The first force blade and the second force blade are staggered in a longitudinal direction. The first sense blade and the second sense blade are staggered in the longitudinal direction. The second force blade and the second sense blade are disposed between the first force blade and the first sense blade. Each of the first force blade, the second force blade, the first sense blade, and the second sense blade includes an aperture having an opening and retention bumps and sized to receive and retain at least a portion of the elastomer. The first force blade, the second force blade, the first sense blade, and the second sense blade are electrically conductive; the insulation layer and the elastomer are non-conductive.

Also disclosed is a Kelvin testing system for testing integrated circuit devices. The testing system includes a device under test, a load board, and a contact assembly. The contact assembly includes at least one grouping of blades including a first force blade, a second force blade, a first sense blade, and a second sense blade; an electrical insulation layer disposed between the second force blade and the second sense blade; and an elongated elastomer. The elastomer is configured to be retained by the first force blade, the second force blade, the first sense blade, and the second sense blade. The first force blade, the second force blade, the first sense blade, and the second sense blade are disposed in a side by side generally parallel relationship. The first force blade, the second force blade, the first sense blade, and the second sense blade are configured to be longitudinally slidable with respect to each other. The second force blade and the second sense blade are disposed between the first force blade and the first sense blade. The first force blade and the second force blade are staggered in a longitudinal direction. The first sense blade and the second sense blade are staggered in the longitudinal direction. The second force blade and the second sense blade are disposed between the first force blade and the first sense blade. Each of the first force blade, the second force blade, the first sense blade, and the second sense blade includes an aperture having an opening and retention bumps and sized to receive and retain at least a portion of the elastomer. The first force blade, the second force blade, the first sense blade, and the second sense blade are electrically conductive; the insulation layer and the elastomer are non-conductive.

Also disclosed is a method of assembling and positioning a contact assembly in a Kelvin testing system for testing integrated circuit devices. The method includes attaching an insulation layer to an inner surface of a second force blade or an inner surface of a second sense blade to separate first and second force blades from first and second sense blades. The method also includes disposing the first force blade, the second force blade, the first sense blade, and the second sense blade in a side by side generally parallel relationship with the second force blade and the second sense blade being between the first force blade and the first sense blade. The method further includes orienting an opening of an aperture of each of the first force blade, the second force blade, the first sense blade, and the second sense blade to face a first direction. Also the method includes retaining an elastomer into the aperture of each of the first force blade, the second force blade, the first sense blade, and the second sense blade from the opening in a second direction opposite to the first direction. The method also includes installing the contact assembly into a housing from a bottom of the housing, loading the housing having the contact assembly onto a load board, and loading a device under test on the housing.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

FIG. 4A is an exploded view of contact assemblies with a housing of a socket, according to an embodiment.

FIG. 4B is a transparent view of FIG. 4A, according to an embodiment.

FIG. 9A illustrate a housing (with a contact assembly being stacked in the housing) to be installed onto a load board, according to an embodiment.

FIG. 9B illustrate a housing (with a contact assembly being stacked in the housing) to be installed onto a load board, according to another embodiment.

FIG. 10 is a side view of a contact assembly, according to an embodiment.

FIGS. 15A-15C are cross sectional views of a contact assembly being installed in a housing of a socket and being in different states, according to some embodiments.

Like reference numbers represent like parts throughout.

DETAILED DESCRIPTION

Figure 1A:
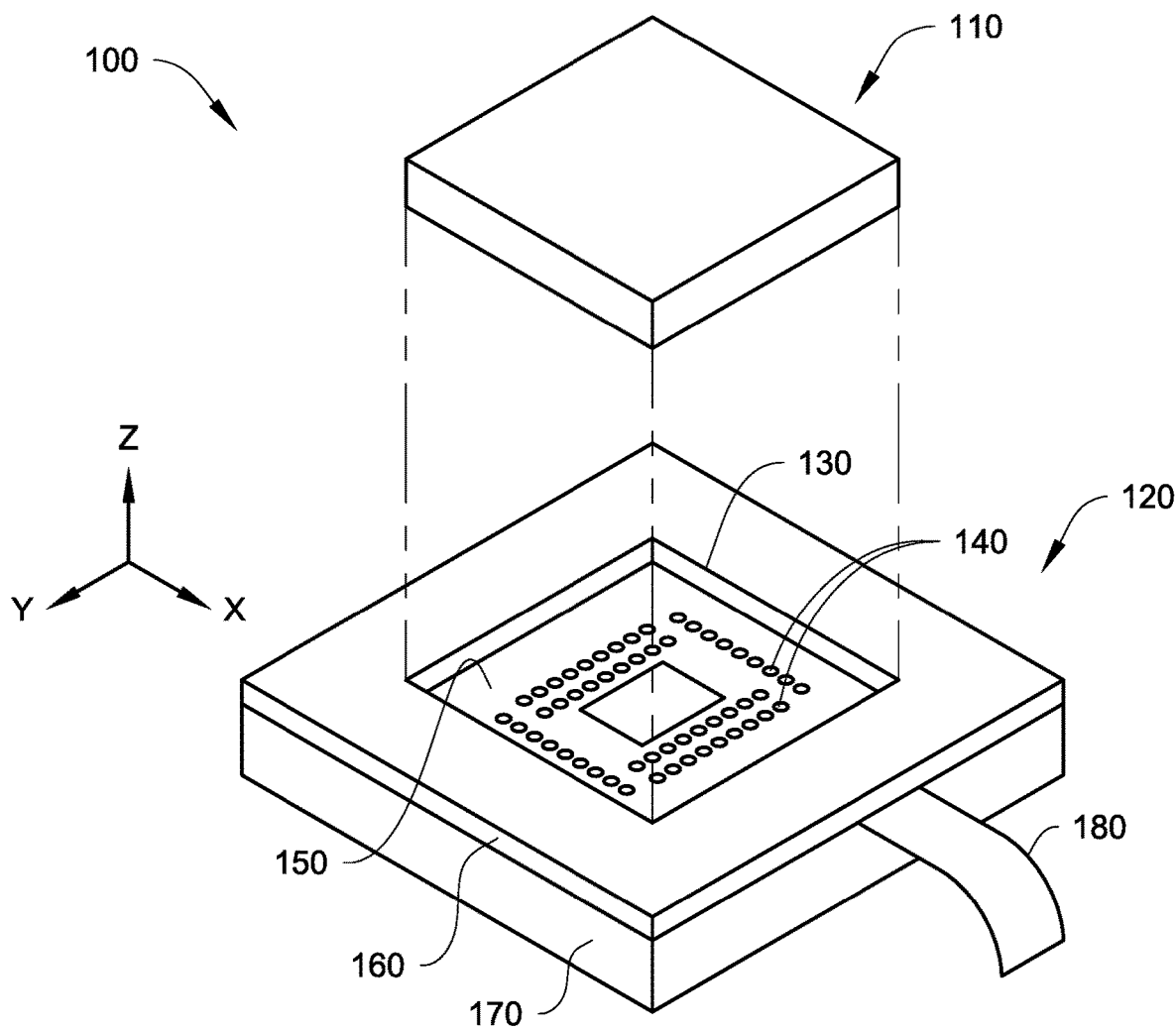
FIG. 1A is a perspective view of a part of a test system for receiving a DUT for testing, according to an embodiment.

A test contactor (i.e., a part of a test assembly including alignment plate, socket, etc.) can often provide electrical connection to a DUT including e.g., S&P terminals of the DUT by making metal-to-metal contact to the printed circuit board (e.g., the load board, including e.g., S&P terminals of the load board). A contact assembly that has compliance has advantages in testing by accommodating DUT package variation. It will be appreciated that the term "compliance" may refer to a property of a material of undergoing elastic deformation or change in volume when subjected to an applied force. Compliance can be equal to the reciprocal of stiffness.

The terminals of a DUT can be temporarily electrically connected to corresponding contact pads on a load board by a series of electrically conductive contacts (e.g., blades, plates, or the like). The terminals may be pads, balls, wires (leads) or other contact points. Each terminal that undergoes Kelvin testing connects with both a "force" (current/signal/test) contact and a "sense" (voltage/Kelvin) contact, with each contact electrically connecting to a respective, single contact pad on the load board. The force contact delivers a known amount of current to or from the terminal, and the sense contact measures a voltage at the terminal and draws a negligible amount of current to or from the terminal.

In Kelvin testing, each terminal electrically contacts two contacts simultaneously. One contact in the pair supplies the known amount of current (I), as is done in conventional testing, while the other contact in the pair measures a voltage (V) without drawing a significant amount of current. From known amounts of current (I) and voltage (V), Ohm's Law (V=IR) may be used to determine the resistance R (=V/I) between two particular terminals.

The force or "current" contact may be considered a low-resistance or low-impedance contact, while the sense or "voltage" contact may be considered a high-resistance or high-impedance contact. Note that a typical voltmeter operates in a manner similar to that of the high-resistance sense or "voltage" contacts.

It will be appreciated that electrical test performance of an individual contact blade can be driven by resistance internal to the contactor including resistance at the DUT and load board interfaces. Resistance of the contact blade can be minimized by keeping the electrical path short, linear, with a simple cross section, and minimal number of interfaces in the electrical path. One way to minimize the effect of variable resistance in test is to use Kelvin measurement to calibrate out the resistive losses due to the contactor internal and interface resistance. The challenge with Kelvin testing is fitting the Kelvin sense contact blade and the input signal contact blade on the same DUT pad, and then routing the respective signals to separate pads on the load board. Another challenge of Kelvin technology is maximizing the current carrying for the given space constraints. The current carrying capacity can be limited by the temperature rise due to electrical interfaces that act as constrictions, so an ideal contact assembly for current carrying capacity can dissipate heat quickly. Ideal solutions can maximize the input signal conductive cross section and minimize internal component interface in the contactor in the electrical path.

Embodiments disclosed herein provide a contact assembly for Kelvin testing includes, for example, a plurality of blades (or plates) or other adjacent conductive elements, which in some embodiments contain an aperture that accepts an elastomer that is used as a compliant member. The aperture, in some embodiments, in the blade stack is shaped such that the compressive forces on the elastomer allow it to bulge/expand into an open cavity instead of shearing the elastomer to stay within the linear elastic region of the elastomer force-deflection.

Embodiments disclosed herein can provide simple blades (with an insulation layer in between to separate the force blades and the sense blades) with low manufacturing cost, and elastomer compliance element with electrical path perpendicular to housing of the socket. Embodiments disclosed herein provide a contact assembly that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the contact assembly can be composed of a stack of blades (e.g., thin contact blades made of an electrical and/or thermal conductive material or plating).

FIG. 1A is a perspective view of a part of a test system 100 for receiving a DUT 110 for testing, according to an embodiment.

The test system 100 includes a test assembly 120 for a DUT (e.g., a microcircuit, etc.) 110. The test assembly 120 includes a load board 170 that supports an alignment plate 160 having an opening or aperture 130 that precisely defines the X and Y (see the coordinate indicators X and Y, where the coordinate X is perpendicular to the coordinate Y, and the coordinate Z is perpendicular to the plane of X and Y) positioning of the DUT 110 in test assembly 120. If the DUT 110 has orientation features, it is common practice to include cooperating features in aperture 130. Load board 170 carries on its surface, connection pads connected to a cable 180 by Signal and Power (S&P) conductors. Cable 180 connects to the electronics that perform that electrical testing of the DUT 110. Cable 180 may be very short or even internal to the test assembly 120 if the test electronics are integrated with the test assembly 120, or longer if the test electronics are on a separate chassis. It will be appreciated that the cable 180 can be optional. In another embodiment, the load board can be connected to test electronics by any other suitable means, including but not limited to e.g., spring loaded probes.

A test contact array 140 having a number of individual test contact elements precisely mirrors the S&P terminals (see 112 in FIG. 1B) carried on the surface of the DUT 110. When the DUT 110 is inserted in the aperture 130, S&P terminals of the DUT 110 precisely align with test contact array 140. The test assembly 120 is designed for compatibility with a test contact array 140 incorporating the device. Test contact array 140 is carried on a socket 150. Individual test contacts in array 140 are preferably formed on and in socket 150 using well-known photolithographic and laser machining processes. Socket 50 has alignment features such as holes or edge patterns located in the area between alignment plate 160 and load board 170 that provide for precise alignment of socket 150 with corresponding projecting features on alignment plate 160. All of the test contacts 140 are in precise alignment with the socket 150 alignment features. In this way, the test contacts of array 140 are placed in precise alignment with aperture 130.

Figure 1B:
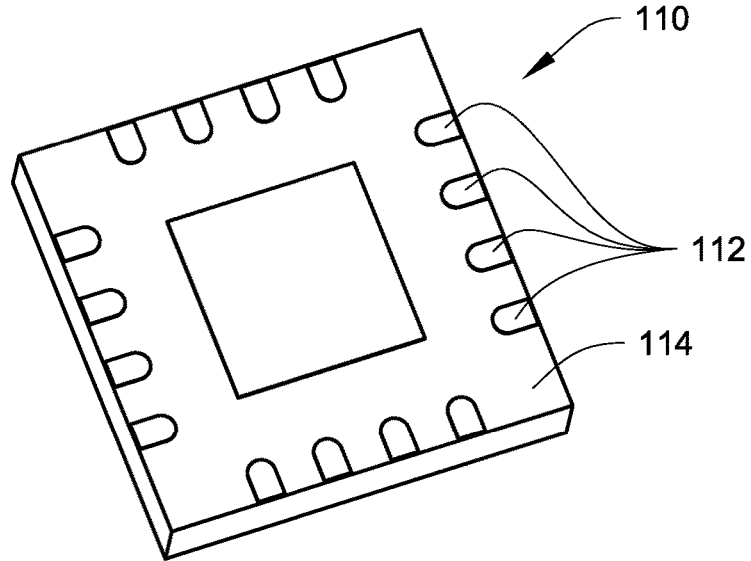
FIG. 1B is a perspective bottom view of a DUT, according to an embodiment.

FIG. 1B is a perspective bottom view of a DUT 110, according to an embodiment. The DUT (e.g., a microcircuit, etc.) 110 includes a top main surface (not shown), and a bottom main surface 114 opposite to the top main surface in the Z (see the coordinate indicators X, Y, and Z in FIG. 1A) direction. In one embodiment, the DUT 110 can have flat no-leads packages such as quad-flat no-leads (QFN) and dual-flat no-leads (DFN). Flat no-leads, also known as micro lead-frame (MLF) and SON (small-outline no leads), is a surface-mount technology, one of several package technologies that connect the DUT 110 to the surfaces of e.g., socket 150 or other printed circuit boards (PCBs) without through-holes. In one embodiment, flat no-lead can be a near chip scale plastic encapsulated package made with a planar copper lead frame substrate. Perimeter lands (e.g., terminals 112) on the package bottom provide electrical connections to the socket 150 or the PCB. Flat no-lead packages can include an exposed thermally conductive pad to improve heat transfer out of the DUT 110 (e.g., into the PCB). The QFN package can be similar to the quad-flat package (QFP). In an embodiment, the DUT 110 can be wafer-level chip scale package (WL-CSP), leaded package such as thin small outline package (TSOP) or diode outline (DO) package, or the like.

Figure 2A:
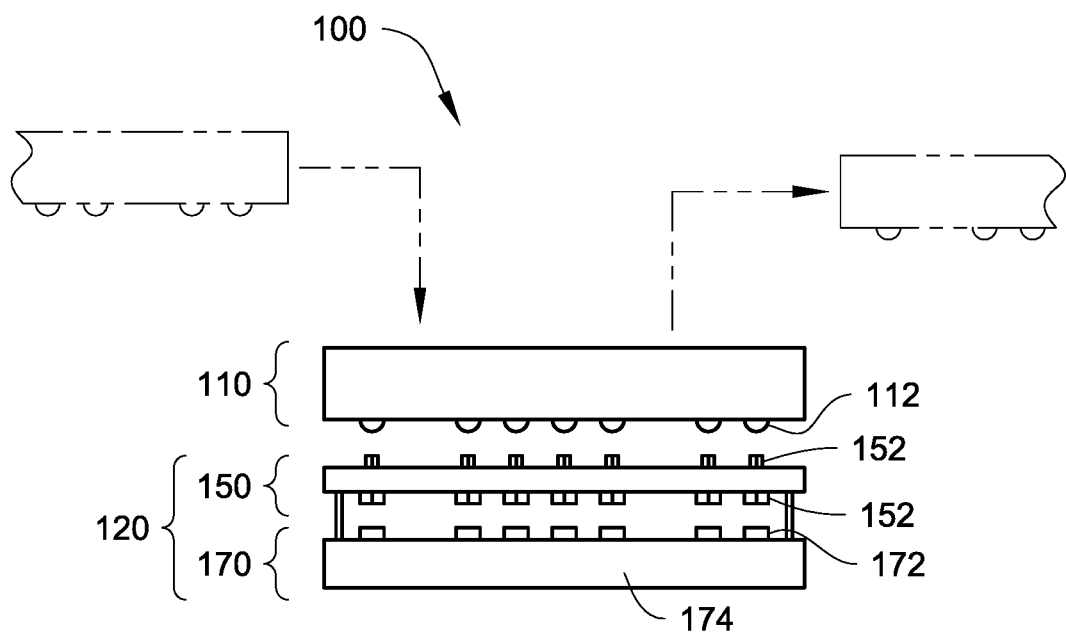
FIG. 2A is a side-view drawing of a portion of the test system for receiving a DUT for Kelvin testing, according to an embodiment.
Figure 2B:
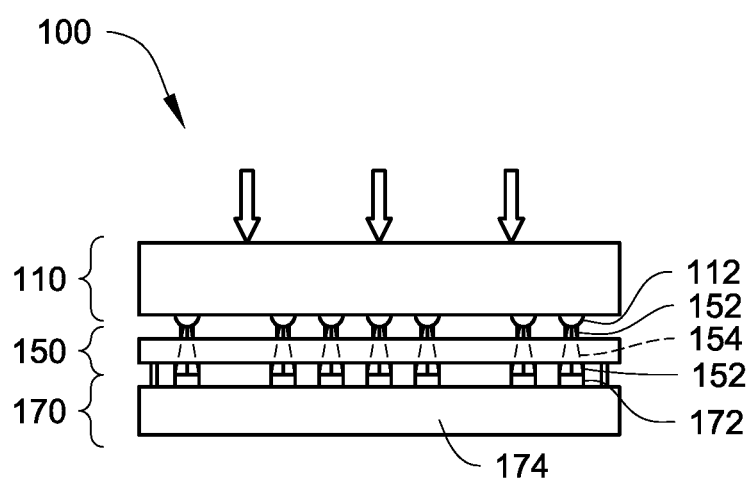
FIG. 2B is a side-view drawing of the test system of FIG. 2A, with the DUT electrically engaged, according to an embodiment.

FIG. 2A is a side-view drawing of a portion of the test system 100 for receiving the DUT 110 for Kelvin testing, according to an embodiment. FIG. 2B is a side-view drawing of the test system 100 of FIG. 2A, with the DUT 110 electrically engaged, according to an embodiment. In Kelvin testing, there are two pads/terminals on the load board 170 connected to each terminal on the DUT 110.

As shown in FIG. 2A, the DUT 110 is placed onto the test assembly 120, electrical testing is performed, and the DUT 110 is then removed from the test assembly 120. Any electrical connections are made by pressing components into electrical contact with other components; there is no soldering or de-soldering at any point in the testing of the DUT 110. The entire electrical test procedure may only last about a fraction of a second, so that rapid, accurate placement of the DUT 110 becomes important for ensuring that the test system 100 is used efficiently. The high throughput of the test assembly 120 usually requires robotic handling of the DUT 110. In most cases, an automated mechanical system places the DUT 110 onto the test assembly 120 prior to testing, and removes the DUT 110 once testing has been completed. The handling and placement mechanism may use mechanical and optical sensors to monitor the position of the DUT 110, and a combination of translation and rotation actuators to align and place the DUT 110 on or in the test assembly 120. Alternatively, the DUT 110 may be placed by hand, or placed by a combination of hand-fed and automated equipment.

The DUT 110 typically includes signal and power terminals 112 (see also terminals 112 of FIG. 1B) that connect to the socket 150 or other PCBs. The terminals may be on one side of the DUT 100, or may be on both sides of the DUT 110. For use in the test assembly 120, all the terminals 112 should be accessible from one side of the DUT 110, although it will be understood that there may be one or more elements on the opposite side of the DUT 110, or that there may be other elements and/or terminals on the opposite side that may not be tested by accessing terminals 112. Each terminal 112 is formed as a small, pad on button side of the DUT 110 or possibly a lead (e.g., half-ball shaped) protruding from the body of the DUT 110. Prior to testing, the pad or lead 112 is attached to an electrical lead that connects internally to other leads, to other electrical components, and/or to one or more chips in the DUT. The volume and size of the pads or leads may be controlled quite precisely, and there is typically not much difficulty caused by pad-to-pad or lead-to-lead size variations or placement variations. During testing, the terminals 112 remain solid, and there is no melting or reflowing of any solder.

The terminals 112 may be laid out in any suitable pattern on the surface of the DUT 110. In some cases, the terminals 112 may be in a generally square grid, which is the origin of an expression that describes the DUT 110, BGA, WL-CSP, QFN, DFN, TSOP, or DO for leaded parts. There may also be deviations away from a rectangular grid, including irregular spacing and geometries. It will be understood that the specific locations of the terminals may vary as needed, with corresponding locations of pads on the load board 170 and contacts on the socket 150 or housing being chosen to match those of the terminals 112. In general, the spacing between adjacent terminals 112 is in the range of 0.25 to 1.5 mm, with the spacing being commonly referred to as a "pitch". When viewed from the side, as in FIG. 2A, the DUT 110 displays a line of terminals 112, which may optionally include gaps and irregular spacing. These terminals 112 are made to be generally planar, or as planar as possible with typical manufacturing processes. In many cases, if there are chips or other elements on the DUT 110, the protrusion of the chips is usually less than the protrusion of the terminals 112 away from the DUT 110.

The test assembly 120 of FIG. 2A includes a load board 170. The load board 170 includes a load board substrate 174 and circuitry that is used to test electrically the DUT 110. Such circuitry may include driving electronics that can produce one or more AC voltages having one or more particular frequencies, and detection electronics that can sense the response of the DUT 110 to such driving voltages. The sensing may include detection of a current and/or voltage at one or more frequencies. In general, it is highly desirable that the features on the load board 170, when mounted, are aligned with corresponding features on the DUT 110. Typically, both the DUT 110 and the load board 170 are mechanically aligned to one or more locating features on the test assembly 120. The load board 170 may include one or more mechanical locating features, such as fiducials or precisely-located holes and/or edges, which ensure that the load board 170 may be precisely seated on the test assembly 120. These locating features typically ensure a lateral alignment (X, Y, see FIG. 1A) of the load board 170, and/or a longitudinal alignment (Z, see FIG. 1A) as well.

In general, the load board 170 may be a relatively complex and expensive component. The housing/test assembly 120 performs many functions including protecting the contact pads 172 of the load board 170 from wear and damage. Such an additional element may be an interposer socket 150. The socket 150 also mechanically aligns with the load board 170 with suitable locating features (not shown), and resides in the test assembly 120 above the load board 170, facing the DUT 110. The socket 150 includes a series of electrically conductive contacts 152, which extend longitudinally outward on either side of the socket 150. Each contact 152 may include a resilient element, such as a spring or an elastomer material, and is capable of conducting an electrical current to/from the load board 170 from/to the DUT 110 with sufficiently low resistance or impedance. Each contact 152 may be a single conductive unit, or may alternatively be formed as a combination of conductive elements. In Kelvin testing, each contact 152 connects one pair of contact pad 172 on the load board 170 to one terminal 112 on the DUT 110, although there may be testing schemes in which one or multiple contact pads 172 connect to a single terminal 112, or multiple terminals 112 connect to a single contact pad 172. For Kelvin testing, we assume in the text and drawings that a single contact 152 connects a pair of pad 172 to a single terminal 112, although it will be understood that any of the tester elements disclosed herein may be used to connect one or multiple contact pads 172 connect to a single terminal 112, or multiple terminals 112 to a single contact pad 172. Note that in Kelvin testing, there is a pair of contact pads 172 for every terminal 112, with one in the pair for current, and the other for voltage. There is also a pair of contacts 152 for every terminal 112 and every pair of contact pads 172, with each contact electrically connecting a contact pad 172 to the corresponding terminal 112. Note that the two contacts in each pair are generally electrically insulated from each other, and form electrical connections 154 between the terminal 112 and the contact pad 172.

Typically, the socket 150 electrically connects the load board pads 172 and the bottom contact surface of the DUT 110. Although the socket 150 may be removed and replaced relatively easily, compared with removal and replacement of the load board 170, we consider the socket 150 to be part of the test assembly 120 for this document. During operation, the test assembly 120 includes the load board 170, the socket 150, and the mechanical construction that mounts them and holds them in place (not shown). Each DUT 110 is placed against the test assembly 120, is tested electrically, and is removed from the test assembly 120. A single socket 150 may test many DUTs 110 before it wears out, and may typically last for several thousand tests or more before requiring replacement. In general, it is desirable that replacement of the socket 150 be relatively fast and simple, so that the test assembly 120 experiences only a small amount of down time for socket replacement. In some cases, the speed of replacement for the socket 150 may even be more important than the actual cost of each socket 150, with an increase in tester up-time resulting in a suitable cost savings during operation.

FIG. 2A shows the relationship between the test assembly 120 and the DUTs 110. When each DUT 110 is tested, it is placed into a suitable robotic handler with sufficiently accurate placement characteristics, so that a particular terminal 112 on the DUT 110 may be accurately and reliably placed (in X, Y and Z, see FIG. 1A) with respect to corresponding contacts 152 on the socket 150 and corresponding pair of contact pads 172 on the load board 170. The robotic handler (not shown) forces each DUT 110 into contact with the test assembly 120. The magnitude of the force depends on the exact configuration of the test, including the number of terminals 112 being tested, the force to be used for each terminal, typical manufacturing and alignment tolerances, and so forth. In general, the force is applied by the mechanical handler of the tester (not shown), acting on the DUT 110. In general, the force is generally longitudinal, and is generally normal of the load board 170.

FIG. 2B shows the test assembly 120 and DUT 110 in contact, with sufficient force being applied to the DUT 110 to engage the contacts 152 and form an electrical connection 154 between each terminal 112 and its corresponding pair of contact pads 172 on the load board 170. As stated above, there may alternatively be testing schemes in which multiple terminals 112 connect to a single contact pad 172, or multiple contact pads 172 connect to a single terminal 112, but for Kelvin testing in the drawings we assume that a single terminal 112 connects uniquely to a pair of contact pads 172.

Figure 3:
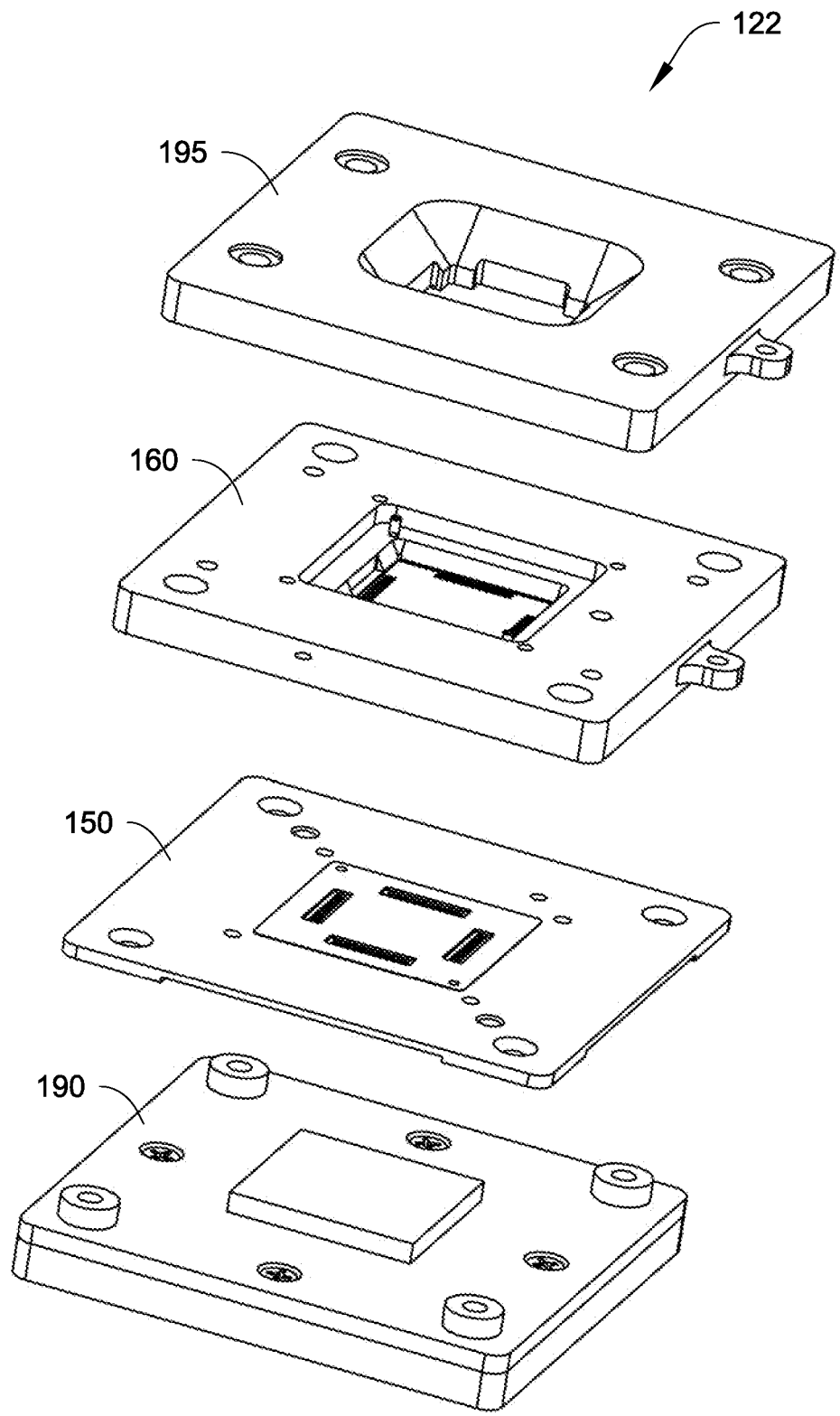
FIG. 3 is an exploded view of building blocks of a test contactor of a test assembly for the testing of a DUT, according to an embodiment.

FIG. 3 is an exploded view of the building blocks of a test contactor 122 of a test assembly 120 for the testing of a DUT, according to an embodiment. It will be appreciated that the connection assembly such as fasteners and/or parts that mount and manipulate the various building blocks of the testing assembly are not shown.

The test contactor 122 includes an optional stiffener 190, a socket 150, an alignment plate 160, and an optional clamping plate 195. The stiffener 190 can provide structural support to a load board (not shown also as known as daughter board, PCB, etc., see FIGS. 1A-2B) to minimize deflection to ensure socket 150 contacting with the load board. The load board is used to route signals from the DUT (via the socket 150) to a tester (not shown) or vice versa. The tester is used to test the DUT (e.g., by sending commands/inputs to the DUT and/or by receiving data/outputs from the DUT). The load board is mounted to a test head in the tester. In the test assembly 120, the load board is disposed between the stiffener 190 and the socket 150.

The socket 150 is used to provide a pathway for inputs/outputs of the DUT to the tester (via the load board). The device alignment plate 160 is to align the DUT to the socket 150. The alignment plate 160 is aligned and is attached to the stiffener 190 by e.g., fasteners that go through holes of the socket 150 and the load board. The alignment plate 160 has a recess/opening (e.g., in the middle of the alignment plate 150) with alignment features and a holder (e.g., Z direction up-stop) to hold the DUT and align the DUT to the socket 150 (so that the S&P pins/pads/leads/balls/lines/terminals of the DUT are aligned with the S&P pins/pads/leads/balls/lines/terminals of the socket 150).

The clamping plate 195 can be optional. The clamping plate 195 can hold the DUT firmly against the load board (via the alignment plate 160 and the socket 150) during testing. In one embodiment, vacuum (instead of the clamping plate 195) can be used as a hold down mechanism for the DUT. In another embodiment, the alignment of the DUT (by the alignment plate 160) can be made as flush as possible, and the DUT can be held at the corners rather than using a clamping plate.

FIG. 4A is an exploded view of contact assemblies 400 with a housing 155 of a socket 150, according to an embodiment. FIG. 4B is a transparent view of FIG. 4A, according to an embodiment.

Figure 12A:
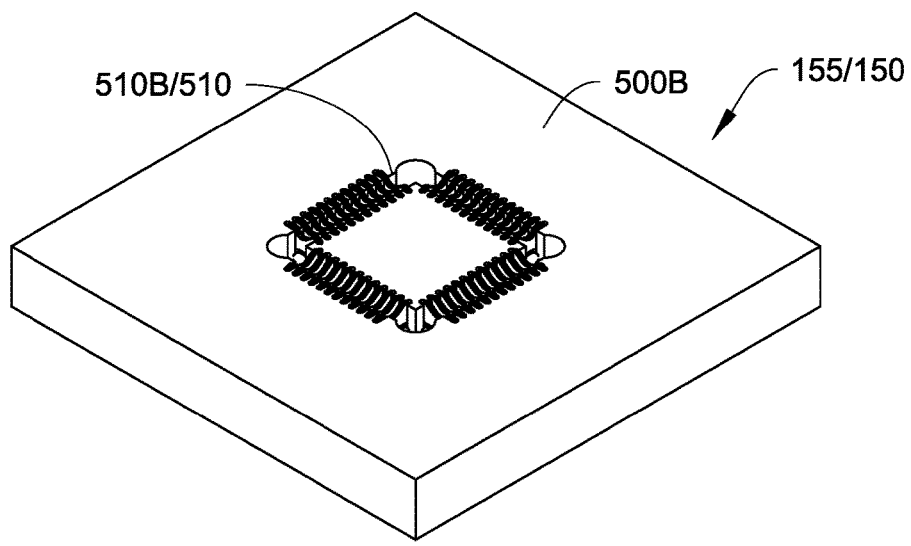
FIG. 12A is a perspective angled bottom view of a housing of a socket, according to an embodiment.

The housing 155 includes a top surface 500A and a bottom surface (500B, see FIG. 12A). Contact assemblies 400 are configured to be installed in the area 510 of the housing 155. As shown in FIGS. 4A and 4B, the area 510 has four sides forming a generally square or rectangular shape, each side is configured to accommodate one row of contact assemblies 400. Each row of contact assemblies 400 includes a plurality of contact assemblies 400 that share one elongated elastomer 460.

Each contact assembly 400 includes at least a pair of upper and lower force blades (410A, 430A), at least a pair of upper and lower sense blades (410B, 430B), and an insulation layer 450 that electrically separates the force blades (410A, 430A) from the sense blades (410B, 430B). The upper blades are configured to contact the DUT 110 and the lower blade are configured to contact the load board 170. Each contact assembly 400 also includes an elongated elastomer 460, which can be shared with other contact assemblies 400 in the same row. It will be appreciated that (410A, 430A) can also represent sense blades while (410B, 430B) can represent force blades. It will also be appreciated that the insulation layer 450 can be attached to the force blade 430A (see FIGS. 4A and 4B), attached to the force blade 430B or to other blade, or independent to the blades (410A, 410B, 430A, 430B) (see FIG. 7E), as long as the insulation layer 450 electrically separates the force blades from the sense blades.

Figure 6:
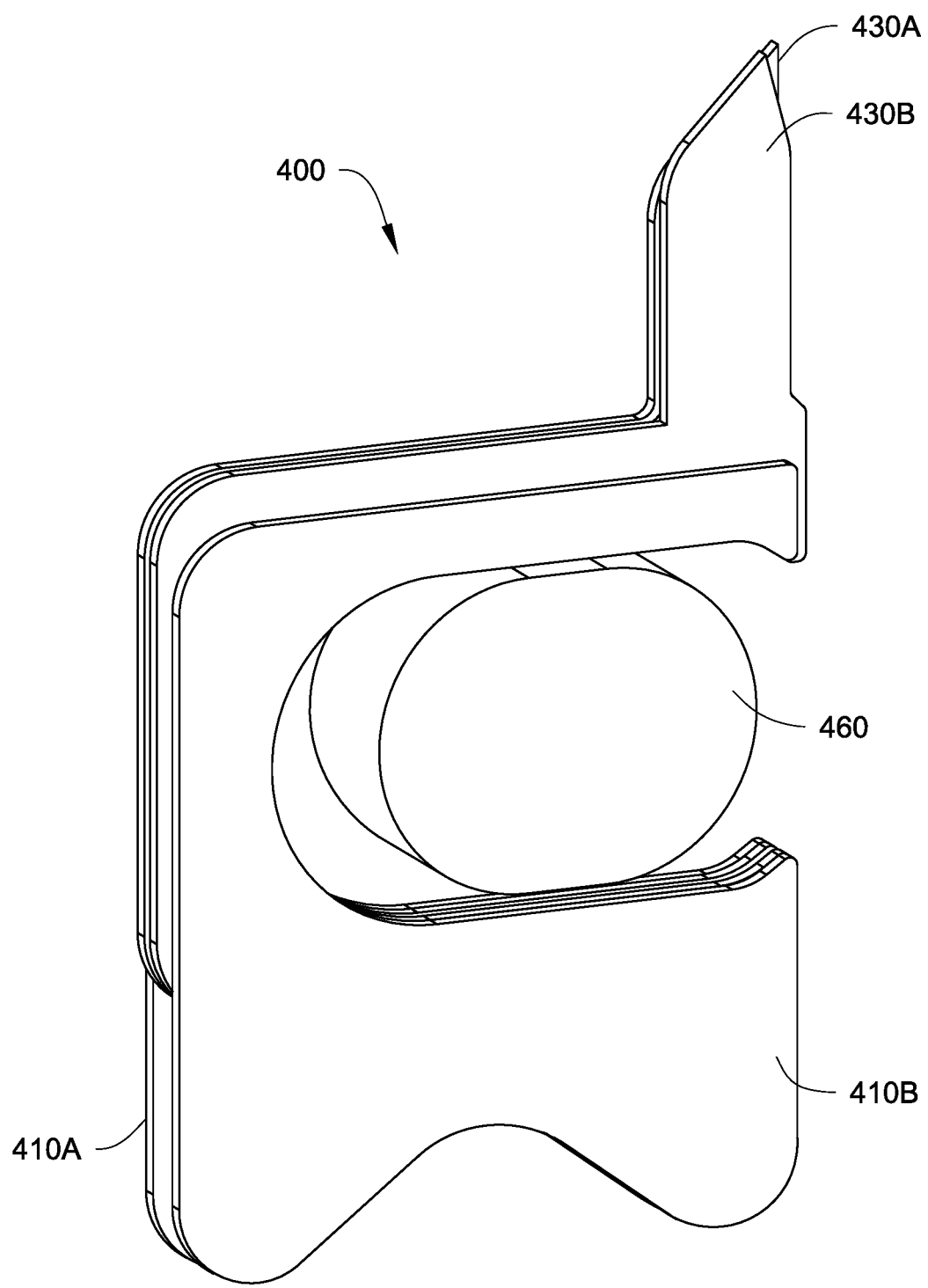
FIG. 6 is a perspective view of a contact assembly, according to an embodiment.

The force and sense blades are laterally (y axis) offset from each other while the upper (430A/B) and lower blades 410A/B are longitudinally (z axis) offset from each other, so that the protrusions 438 on the upper blade extend beyond the lower blade top edge, and the protrusions 418 on lower blade extend beyond the lower edge of the upper blade bottom edge. Therefore only one blade in the pair may touch the DUT 110 or the load board 170, while the blades are allowed to slide by each other during engagement with the DUT 110. In the embodiment such as shown in FIG. 6, the top each of the lower blade 410 is lower that the top (linear) edge of the upper blade 430, so that when the upper blade is deflected by engagement with the DUT 110, the top edges will be relatively aligned.

It will be appreciated that regarding the insulation layer 450, there can be a concern about lubricity between the force blade 430A and sense blade 430B since there can be independent movement between the force blade 430A and the sense blade 430B, and thus a sliding action may happen between the force blade 430A and the sense blade 430B. As such, the adherence of the insulation layer 450 to the force blade 430A (or to the sense blade 430B) may be critical when the insulation layer 450 is configured to be attached to the force blade 430A (or to the sense blade 430B).

In an embodiment, each blade (410A, 410B, 430A, 430B) can be plated with e.g., gold, etc. In another embodiment, each blade (410A, 410B, 430A, 430B) may not be plated if the metal of the blade (410A, 410B, 430A, 430B) is metallurgically suitable. In an embodiment, each blade (410A, 410B, 430A, 430B) can be made of any conductive material such as copper, copper alloys, nickel alloys, steels, precious metals, etc. It will be appreciated that flexibility may not be a requirement with respect to the blade (410A, 410B, 430A, 430B). Elastomer 460 can be made of any elastic rubber-like material such as silicone, etc. In an embodiment, the elastomer 460 may be made of non-conductive material. The insulation layer 450 may be made of non-conductive material. In another embodiment, the elastomer may also be conductive but only so long as it is non-conductive in portions between groups of blades, so that the group of blades does not short to other groups. If the exterior of the elastomer is conductive, then it must be non-conductive, such as by masking in those section between groups of blades. A group of blades may be, for example two force blades or two sense blades. A group is not limited to two blades together, but may be as few as two and as many as DUT contact spacing will allow.

In an embodiment, in a cross sectional view, the elastomer 460 can be generally round, and the elastomer 460 can have a generally cylindrical shape. In other embodiments, in a cross section view, the elastomer 460 can be general hexagonal, generally pentagonal, or the like. In an embodiment, the elastomer 460 can be hollow.

In an embodiment, the elastomer 460 can have an axially symmetric with ideally constant cross section. Round elastomer 460 can allow multiple low-cost manufacturing methods and prevent installation errors that may occur with asymmetrical elastomers. The elastomer 460 can be a single piece with multiple contact assemblies 400 sharing the same elastomer. It will be appreciated that elastomer segments may be shown for one contact assembly 400 as a convenience to show elastomer 460 position. The cross-section shape can be symmetrical around the vertical axis, and separately the horizontal axis, otherwise there can be very little limitation to x-section shape.

In another embodiment, the elastomer 460 can be a tall rectangle elastomer that allows increased compliance without exceeding the strength of the elastomer 460. In yet another embodiment, the elastomer 460 can be a short rectangular elastomer 460 which can allow increase in force without changing compliance. It will be appreciated that both tall and short rectangle elastomers may cause assembly errors due to orientation of the elastomer 460.

Figure 5A:
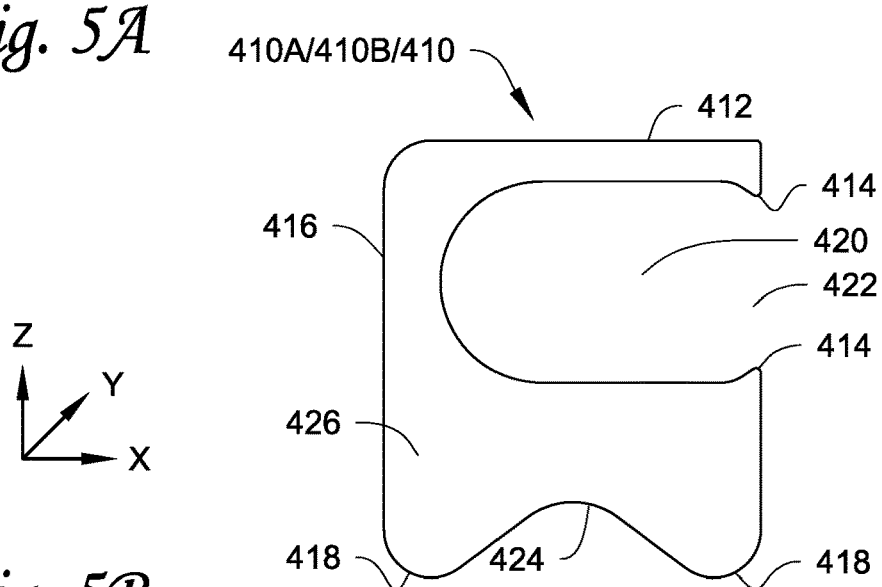
FIG. 5A is a side view of a load board contact blade, according to an embodiment.

FIG. 5A is a side view of a load board contact blade 410, according to an embodiment. The blade 410 can be a force blade 410A or a sense blade 410B, configured to electrically connect to a load board terminal/pad (e.g., a force pad or a sense pad of a pair of pads 172 on the load board 170 of FIG. 2A).

The blade 410 includes a retention arm 412 having a generally flat top and a retention bump 414, a guide arm 416, and a body/bottom having a retention bump 414. The retention bumps 414 protrude toward each other in the longitudinal/height/vertical direction (e.g., Z direction). The retention arm 412, the guide arm 416, and the body of the blade 410 form an aperture 420 to receive an elastomer. In an embodiment, the aperture 420 is generally a C-shape having an opening 422.

As shown in FIG. 5A, the body of the blade 410 includes two hump-shaped protrusions 418 arranged in a side by side relationship in a width/transverse direction (e.g., X direction) with a recess 424 in between. In another embodiment (see FIG. 9B), the body of the blade 410 can include one hump-shaped protrusion disposed in the middle of the body in the width direction (X direction). The protrusion(s) 418 is configured to electrically connect to a contact terminal/pad (e.g., one of a pair of contact pads 172 on the load board 170 of FIG. 2A). See also FIGS. 9A and 9B.

The blade 410 includes two sides 426 (one is shown and the other is hidden in the back in a thickness direction (Y direction)). The sides 426 can serve as electrical interface(s) between the blade 410 and side(s) of adjacent blade(s).

Figure 5B:
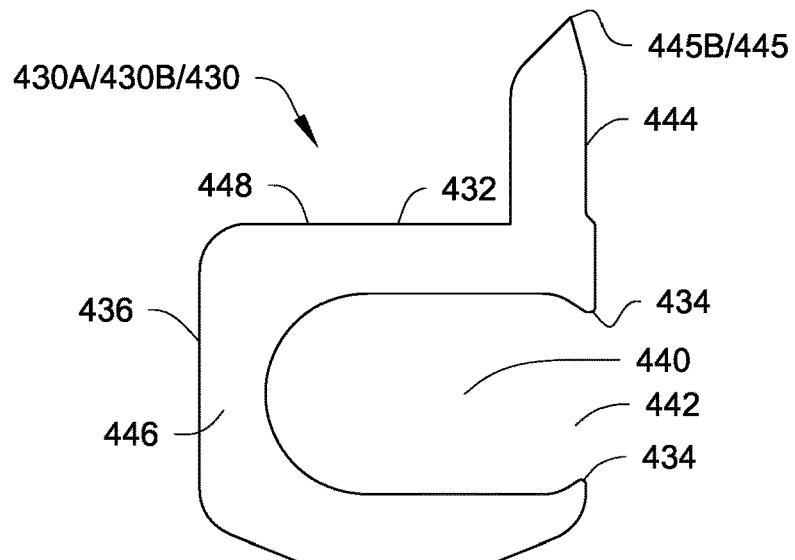
FIG. 5B is a side view of a DUT contact blade, according to an embodiment.
Figure 5C:
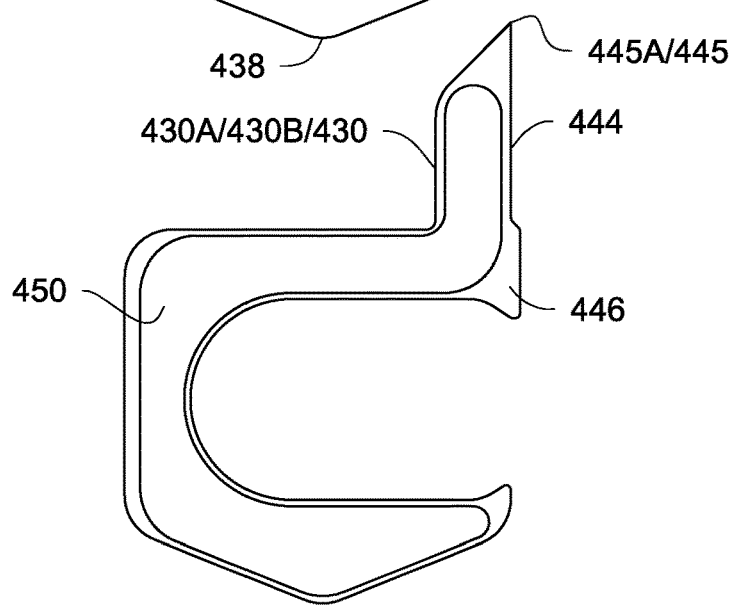
FIG. 5C is a side view of an insulation layer attached to a DUT contact blade, according to an embodiment.

FIG. 5B is a side view of a DUT contact blade 430, according to an embodiment. FIG. 5C is a side view of an insulation layer 450 attached to a DUT contact blade 430, according to an embodiment. The blade 430 can be a force blade 430A or a sense blade 430B, configured to electrically connect to a DUT terminal/pad (e.g., a terminal 112 on the DUT 110 of FIG. 2A).

The blade 410 includes a retention arm 432 having a generally flat up-stop 448 and a retention bump 434, a guide arm 436, and a body/bottom having a retention bump 434 and a hump-shaped protrusion 438. The protrusion 438 is disposed in the middle of the body of the blade 430 in the width direction (X direction). The retention bumps 434 protrude toward each other in the longitudinal/height/vertical direction (e.g., Z direction). The retention arm 432, the guide arm 436, and the body of the blade 430 form an aperture 440 to receive an elastomer. In an embodiment, the aperture 440 is generally a C-shape having an opening 442. It will be appreciated that C-shaped can include other shapes which have a recesses area to accommodate the elastomer, but which are discontinuous, i.e. have an opening for inserting the elastomer.

The blade 430 also includes two sides 446 (one is shown and the other is hidden in the back in a thickness direction (Y direction)). The sides 446 can serve as electrical interface(s) between the blade 430 and side(s) of adjacent blade(s).

The blade 430 further includes a stem 444 protruding upwards from the up-stop 448 of the retention arm 432 in the longitudinal direction (Z direction), a generally triangle tip 445 disposed above the stem 444. The tip 445 is configured to electrically connect to a contact terminal/pad (e.g., a terminal 112 on the DUT 110 of FIG. 2A). In an embodiment, the stem 444 is offset to the rightmost or leftmost edge of the blade. This will create a slight turning moment when the tips on the stem 444 engages the DUT 110. The degree of allowable turning moment can be controlled by the housing tip slot 530 (see FIG. 14A) in which it slides. A small turning moment can be useful to give the tip some rocking action to break oxide buildup on the DUT pad/terminal.

The tip 445 can be 445A of FIG. 5C or 445B of FIG. 5B. Tip 445A has a side extending in the longitudinal direction (Z direction), and there can be an offset (see FIG. 8A) between the tip 445A of one blade 430A and the tip 445B of another blade 430B.

As shown in FIG. 5C, the insulation layer 450 is attached to the blade 430. It will be appreciated that the insulation layer 450 can also be attached to the blade 410. In some embodiments, the insulation layer 450 can be non-conductive and be glued, fixed, attached, coated, plated, painted, sprayed, made of photoresist, or by any other suitable attaching means, to the blade 410 or 430, as long as the insulation layer 450 has mechanical robustness and/or strength to electrically isolate the two contact elements (force and sense). In an embodiment, the insulation layer 450 can be attached on a side (426 or 446) of the blade (410 or 430), covering at least a part of the entire side (426 or 446) of the blade (410 or 430). In another embodiment, the insulation layer 450 can be loose insulator (independent to the blades (410 or 430), see FIG. 7E) instead of being attached to the blade (410 or 430).

FIG. 6 is a perspective view of a contact assembly 400, according to an embodiment. The contact assembly 400 includes force blades (410A, 430A), sense blades (410B, 430B), and an elastomer 460 received in the apertures of the blades (410A, 410B, 430A, 430B). In an embodiment, the apertures of the blades (410A, 410B, 430A, 430B) can be generally identical to each other in plan view. The force blade 410A and the sense blade 410B can be generally identical to each other. The force blade 430A and the sense blade 430B can be generally identical to each other, except that there can be an offset between the tips of the blades (430A, 430B) (see also FIG. 8A).

As shown in FIG. 6, the first force blade 410A and the second force blade 430A are staggered in a longitudinal direction. The first sense blade 410B and the second sense blade 430B are staggered in the longitudinal direction. That is, in the vertical/longitudinal/height direction (Z direction), the blades 410 and 430 are designed/arranged/shaped so that a top (and/or a bottom) surface of the blade 410 and a top (and/or a bottom) surface of the blade 430 are not aligned with each other or not in the same plane.

In an embodiment, the blades (430A, 430B) are disposed between the blades (410A, 410B). The insulation layer 450 is disposed between the blades (430A, 430B), to electrically separate the force blades (410A, 430A) from the sense blades (410B, 430B). The openings (422, 442) of the apertures (420, 440) of the blades (410A, 410B, 430A, 430B) are facing a same direction so that the elastomer 460 can be received in the apertures (420, 440) via the openings (422, 442).

In an embodiment, one force blade 410A can be configured to electrically connect to a contact terminal/pad (e.g., one of a pair of contact pads 172 on the load board 170 of FIG. 2A) via a bottom (load board contact) of the force blade 410A. The force blades 410A and 430A can be configured to electrically connect to each other via e.g., side surfaces (426, 446) of 410A and 430A contacting with each other. The other force blade 430A can be configured to electrically connect to a contact terminal/pad (e.g., a terminal 112 on the DUT 110 of FIG. 2A) via a tip (DUT contact) 445A of the force blade 430A.

In an embodiment, one sense blade 410B can be configured to electrically connect to a contact terminal/pad (e.g., the other of the pair of contact pads 172 on the load board 170 of FIG. 2A) via a bottom (load board contact) of the sense blade 410B. The sense blades 410B and 430B can be configured to electrically connect to each other via e.g., side surfaces (426, 446) of 410B and 430B contacting with each other. The other sense blade 430B can be configured to electrically connect to the contact terminal/pad (e.g., the terminal 112 on the DUT 110 of FIG. 2A) via a tip (DUT contact) 445B of the sense blade 430B.

In an embodiment, a terminal 112 on the DUT 110 of FIG. 2A, the force blades (410A, 430A), and one of a pair of contact pads 172 on the load board 170 of FIG. 2A, form the force line. The same terminal 112 on the DUT 110 of FIG. 2A, the sense blades (410B, 430B), and the other of the pair of contact pads 172 on the load board 170 of FIG. 2A, form the sense line. The insulation layer 450 electrically separates the force blades (410A, 430A) from the sense blades (410B, 430B).

FIGS. 7A-7F are cross sectional views of a contact assembly 400 electrically connected to a terminal/pad 112 of a DUT 110, according to some embodiments.

Figure 7A:
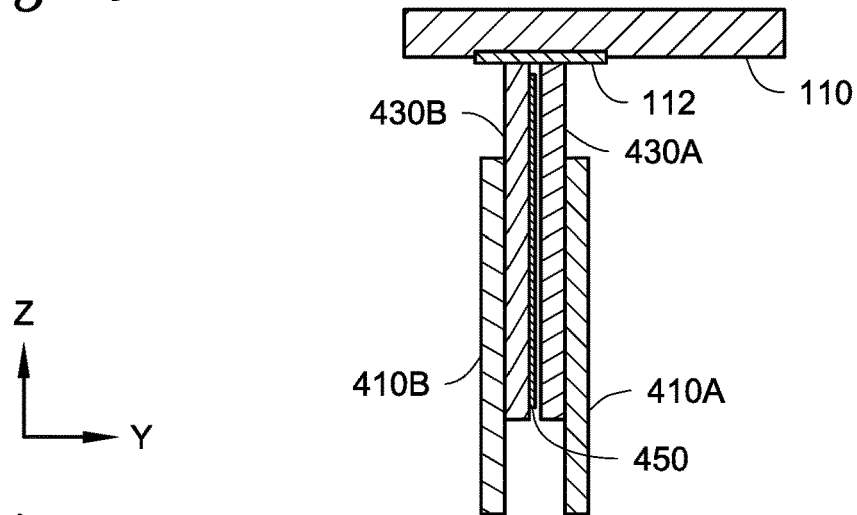
FIGS. 7A-7F are cross sectional views of a contact assembly electrically connected to a terminal of a DUT, according to some embodiments.

As shown in FIG. 7A, the force blade 430A and the sense blade 430B are disposed between the force blade 410A and the sense blade 410B in the thickness direction (Y direction). The force blades (410A, 430A) are electrically connected to each other via side surfaces (426, 446) of the force blades (410A, 430A). The sense blades (410B, 430B) are electrically connected to each other via side surfaces (426, 446) of the sense blades (410B, 430B). The insulation layer 450 is attached to an inner surface 446 of the sense blade 430B, to electrically separate the force blades (410A, 430A) from the sense blades (410B, 430B). In another embodiment, the insulation layer 450 can be attached to an inner surface 446 of the force blade 430A, to electrically separate the force blades (410A, 430A) from the sense blades (410B, 430B). The tips (445A, 445B) of the force blade 430A and the sense blade 430B are electrically connected to a terminal/pad 112 of a DUT 110. The bottom of the force blade 410A is configured to connect to one pad (force pad) of a pair of contact pads 172 on the load board 170 of FIG. 2A. The bottom of the sense blade 410B is configured to connect to the other pad (sense pad) of the pair of contact pads 172 on the load board 170 of FIG. 2A. The bottoms of the blades (430A, 430B) are disposed above the bottoms of the blades (410A, 410B) in the longitudinal direction (Z direction), and may not touch the contact pads 172 on the load board 170 of FIG. 2A in any states (e.g., free state, preload state, or load state, see FIGS. 14A-14B). The tops of the blades (410A, 410B) are disposed below the tops of the blades (430A, 430B) in the longitudinal direction (Z direction), and may not touch the terminal/pad 112 on the DUT 110 in any states (e.g., free state, preload state, or load state, see FIGS. 14A-14B).

As shown in FIG. 7A, from left to right, the contact blades (410, 430) stack in the contact assembly in the following order: load board Kelvin/sense contact blade 410B, DUT Kelvin/sense contact blade 430B (with insulation layer 450), DUT signal/force/test contact blade 430A, and load board signal/force/test contact blade 410A. Such embodiment can allow to fit on smaller DUT pad 112 since the DUT force blade 430A and the DUT sense blade 430B are close together on the DUT pad 112. The load board force blade 410A and the load board sense blade 410B are spaced farthest apart allowing maximum space for the customer to configure the load board with enough spacing between the signal and Kelvin traces. With the insulation layer 450 on the Kelvin contact/sense blade 430B, it can be structural and add to the strength of the body of the contact blade 430B and allow the conductive layer (e.g., the blade(s)) to be thinner and reduce the overall thickness of the contact assembly 400. Another embodiment with insulation layer 450 on the DUT signal contact blade 430A may work, but it would be desire to maximize cross section of the blade 430A for current carrying capacity, so little advantage to insulation on the DUT signal contact blade 430A. In addition, with the insulation layer 450 directly between the test contact blades (430A, 410A) and the Kelvin contact blades (430B, 410B), there are few elements in the stack ensuring the electrical isolation of the test contact blades (430A, 410A) and Kelvin contact blades (430B, 410B), which may reduce variation in separation of the contact blades (410, 430), and allow a simple housing 155 geometry to allow many contact blades (410, 430) to share a housing contact assembly slot. Furthermore, such embodiment can provide reduced wear on the insulation layer 450. With the insulation layer 450 between the two center contact blades (430A, 430B) that move together, then the relative movement between the adjacent contact blade and the insulation layer 450 can be reduced.

It will be appreciated that such embodiment may result in conductive debris bridging DUT signal contact blade 430A to DUT Kelvin contact blade 430B. The small spacing of DUT contact blades (430A, 430B) is conductive contamination bridging the gap between the DUT signal contact blade 430A and the DUT Kelvin contact blade 430B. Debris conducting the kelvin electrode to the adjacent blade instead of the DUT pad 112 can still calibrate the test signal for load board 170 to blade interface and bulk blade electrical losses but bypass the signal contact blade to DUT pad 112 interface losses. Also the one sided of the contact blade may provide the shear force for compliance. Since the DUT signal contact blade 430A and the DUT Kelvin contact blade 430B are both actuated by the DUT pad 112, they move together and the elastomer shear forces only act on one side of each DUT contact blade where they move in opposition to the load board contact blades 410. This may reduce the force available compared to if both sides of the contact blade stressed the elastomer 460 in shear. Additionally, such configuration may lack redundancy if elastomer 460 defects or tears occur in the elastomer 460 at the shear interface, then the contact blade can fully lose function. One feature to mitigate such issues can be DUT tips (445A, 445B) offset in both the X-axis and Y-axis directions to reduce the probability of conductive debris bridging the gap between the DUT contact tips (445A, 445B).

Figure 7B:
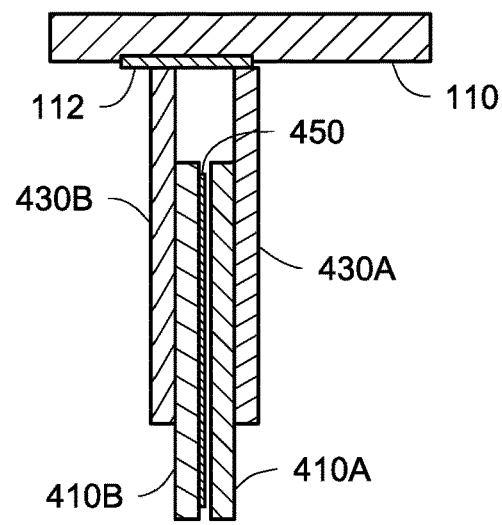

FIGS. 7B-7F are the same (or similar to) FIG. 7A, except the configurations described below. As shown in FIG. 7B, the force blade 410A and the sense blade 410B are disposed between the force blade 430A and the sense blade 430B in the thickness direction (Y direction). The insulation layer 450 is attached to an inner surface 426 of the sense blade 410B, to electrically separate the force blades (410A, 430A) from the sense blades (410B, 430B). In another embodiment, the insulation layer 450 can be attached to an inner surface 426 of the force blade 410A, to electrically separate the force blades (410A, 430A) from the sense blades (410B, 430B). The configuration as shown in FIG. 7B can maximize the distance between the DUT contact blades (430A, 430B) to reduce probability of conductive debris bridging, but may make the load board 170 layout for separation of the test signal line and the Kelvin signal line more difficult for the customer and may require the customer to have a larger DUT pad 112 size.

Figure 7C:
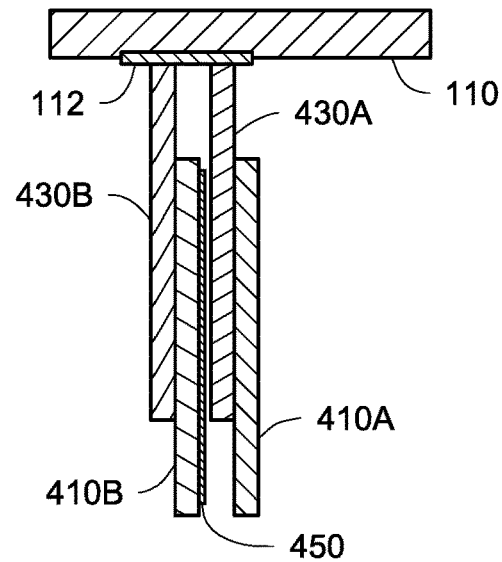

As shown in FIG. 7C, the force blade 430A and the sense blade 410B are disposed between the force blade 410A and the sense blade 430B in the thickness direction (Y direction). As shown in FIG. 7C, the insulation layer 450 is attached to an inner surface 426 of the sense blade 410B, to electrically separate the force blades (410A, 430A) from the sense blades (410B, 430B).

It will be appreciated that alternating the DUT contact blades and the load board contact blades allows for both sides of the DUT signal contact blade to load the elastomer 460 in shear with opposition in movement with the load board contact blades and increased the force available at the DUT pad 112 to DUT signal contact blade interface to improve electrical contact. Additionally, the configuration can increase the spacing between the DUT Kelvin contact blade 430B and the DUT signal contact blade 430A to reduce the potential for conductive debris bridging, at the disadvantage of requiring an intermediately larger DUT pad. The insulation layer 450 between the load board Kelvin contact blade 410B and the blade 430A can experience relatively more movement due to opposition of the blade actuation, which may increase wear on the insulation layer 450.

Figure 7D:
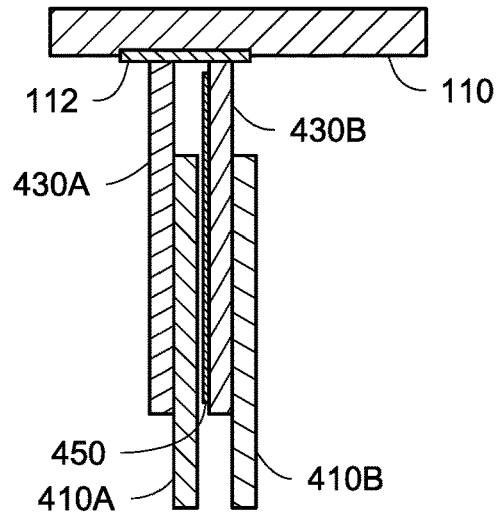

As shown in FIG. 7D, the insulation layer 450 is attached to an inner surface 446 of the sense blade 430B, to electrically separate the force blades (410A, 430A) from the sense blades (410B, 430B). This embodiment has similar advantages to the contact assembly configuration in FIG. 7C, except that the highest force potential is with the DUT Kelvin contact blade 430B, where blade resistance is less important and therefore may have less advantageous than FIG. 7C.

Figure 7E:
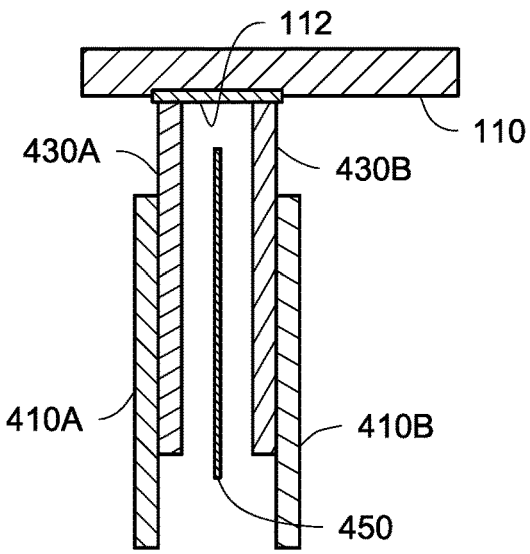

As shown in FIG. 7E, the insulation layer 450 is a loose/separate layer independent to the blades (410A, 410B, 430A, 430B), to electrically separate the force blades (410A, 430A) from the sense blades (410B, 430B). The insulation layer 450 may float retained only by the elastomer 460 and neighboring contact blades. In an embodiment, the insulation layer 450 can be a part of housing 155 (of the socket 150) including a slot for the force blades (410A, 430A) and a slot for the sense blades (410B, 430B). It will be appreciated that the order of the blades/layer can be (410A, 430A, 450, 430B, 410B), (410A, 430A, 450, 410B, 430B), (430A, 410A, 450, 430B, 410B), (430A, 410A, 450, 410B, 430B), or the like.

Such embodiments can allow the conductive contact blades to be made where the DUT signal contact blade 430A and the DUT Kelvin contact blade 430B share the same geometry and therefore reduce order errors and reduce the number of components to manufacture. Also alternative nonconductive material components (450) are easier to layer on a separate component to make sandwiched layers to control various surface properties separate from its dielectric insulation function. Such embodiments can provide a low friction layer on the outside with a high dielectric constant layers inside; a hard layer over high dielectric constant layer to prevent debris embedding in softer dielectric and affecting friction; hard layers over elastic layer to compress and push apart the Kelvin contact blades and signal contact blades, and have low interface friction; and/or a solid elastomer component between the middle contact blades to push apart the Kelvin contact blades and signal contact blades.

Figure 7F:
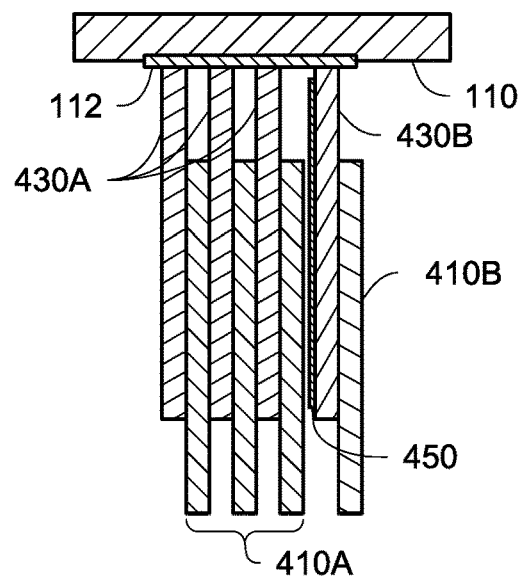

As shown in FIG. 7F, there can be more than one pairs of force blades (410A, 430A). The pairs of force blades (410A, 430A) are disposed successively in the thickness direction (Y direction). It will be appreciated that for the force line, there can be any suitable pairs of the force blades (410A, 430A), and the number of the pairs may be limited by the shape and size of the DUT terminal/pad and/or load board terminal/pad. More force blades can help pump more power on the force line. The sense/measurement line may need less power than the force line. Such embodiment can work for high power QFNs (such as for motor applications having large terminals/pads and providing e.g., tens or hundreds of amperes of power).

As shown in FIG. 7F, the contact assembly 400 is not limited to a stack of four contact blades. Although at minimum four contact blades are needed to route a kelvin signal and a test signal to DUT 110 and load board 170, the contact assembly 400 can be increased in number of contact blades for a variety of reasons with alternative configurations available. It will be appreciated that issues may arise when stacking more contact blades with the addition of tolerances increases the locating error. It will also be appreciated that such embodiments can accommodate increased current carrying capacity, where one set of sense blades (410B, 430B) can be configured, with multiple sets of force blades (410A, 430A) to carry addition current, the sense blade set can be placed on the edge or in the middle of the contact assembly 400. It will further be appreciated that such embodiments can reduce ground impedance, allow the customer to make a single ground pad on the DUT 110 and get a higher density of contact blades on the larger ground pad, than individual DUT ground pads would allow, by increasing housing slot width and adding addition sets of force blades (410A, 430A). Also it will also be appreciated that such embodiments can achieve reduced pitch on adjacent DUT Pads 112. The number of adjacent pads 112 that can achieve reduced pitch is limited by the stack of thickness tolerances until the location of each blade tip on the designated DUT pad 112 is not achievable.

It will be appreciated that embodiment discloses herein can provide configurable Kelvin test pad locations that can selectively apply Kelvin test to individual DUT pads 112 and increase current carrying capacity to another DUT pad 112 by sharing a common load board pad and/or substituting the insulator thickness with a conductive material.

FIGS. 8A-8H illustrate side views of various configurations of the tips 445 of the DUT contact blade 430, according to some embodiments.

Figure 8A:
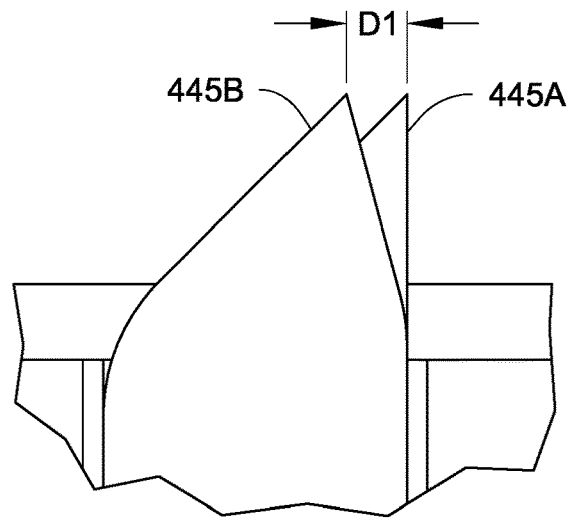
FIGS. 8A-8H illustrate side views of various configurations of the tips of the DUT contact blade, according to some embodiments.

As shown in FIG. 8A, a lateral offset D1 can be provided between the tips (445A, 445B) of a pair of DUT contact blades (430A, 430B) in a side view so that the tips do not contact the DUT pad/terminal at points directly lateral from each other. With the offset D1, the contact points can be both lateral and longitudinally offset from each other which can minimize debris bridging the contact blades. The tips (445A, 445B) are close together at the Z plane or at the same Z plane. Each of the tips (445A, 445B) has a sharp tip geometry with a triangular face geometry on both the DUT test blade 530A and DUT Kelvin contact blade 430B. There is a spacing D1 between the tips (445A, 445B) configured to e.g., remove (or allow for) debris and to ensure that the force blade 430A and the sense blade 430B are not electrically connected (shorted out) because of e.g., electrically conductive debris.

It will be appreciated that such embodiment can provide contact tip offset D1 at the DUT 110 to blades (430A, 430B) electrical interfaces, minimize overlap of the blades (430A, 430B) tip (445A, 445B) faces to reduce the probability of shorting due to conductive debris. The size of the offset D1 can be configurable based on DUT pad 112 size and blades (430A, 430B) tip (445A, 445B) geometry.

Figure 8B:
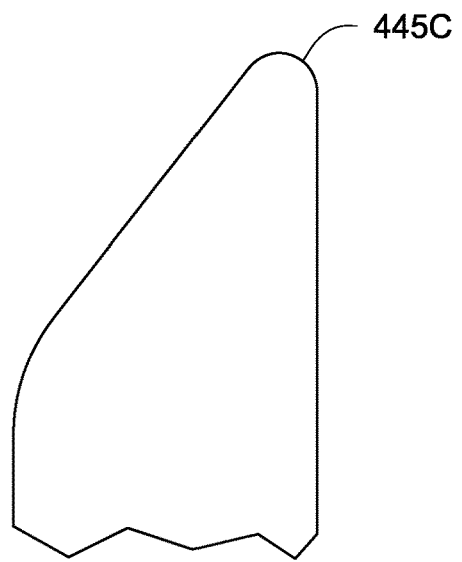

As shown in FIG. 8B, the tip 445 can be a tip with radius 445C. In an embodiment the radius can be any suitable number (e.g., at or about one micron, at or about ten microns, at or about one hundred microns, or the like). Compared with sharp tip, the tip 445C can be longer lasting and can resist wear. When the contact assembly 400 is actuated (e.g., in a load state, see FIG. 14C), the tip(s) 445 may get scraping motion or effects from actuating (e.g., the pad 112 of the DUT 110 may push the contact assembly 400 down with applied force, and the blade(s) 430 may bias towards the wall of the slot of the housing 155), which may cause debris (e.g., electrically conductive debris) that should be avoided/removed.

The embodiment disclosed in FIG. 8B can provide radius tip 445C that can slow wear by distributing force over a wider blade patch in the DUT 110 to blade interface. The reduced pressure at the tip 445C to DUT 110 interface can result in longer tip 445C life.

Figure 8C:
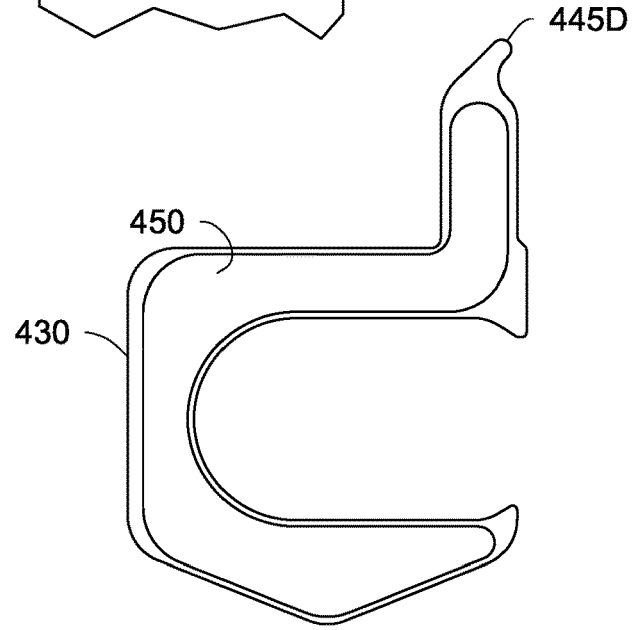
Figure 8D:
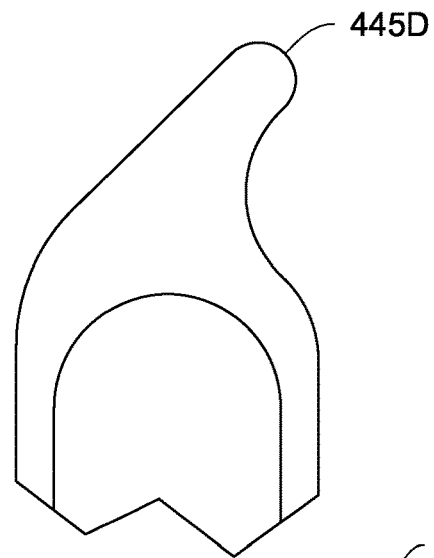
Figure 8E:
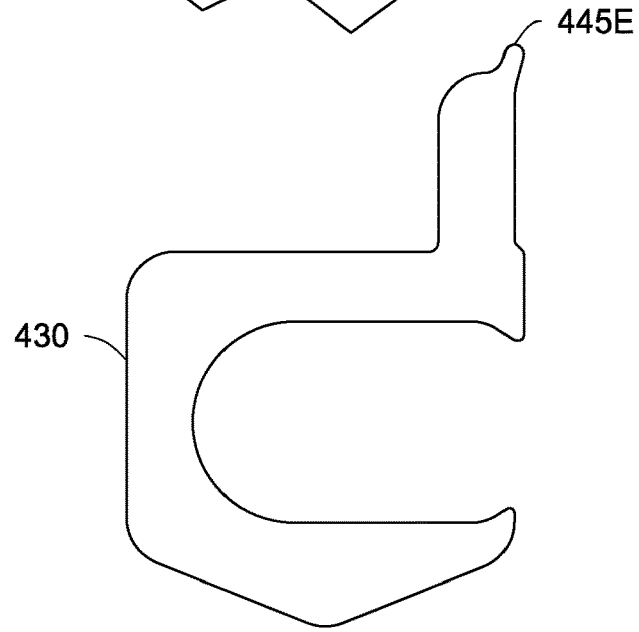
Figure 8F:
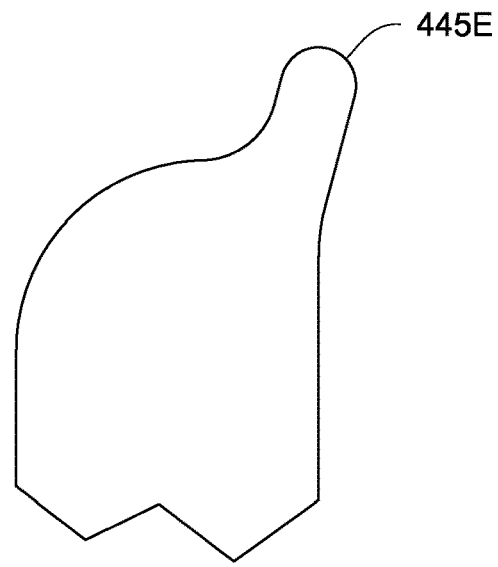
Figure 8G:
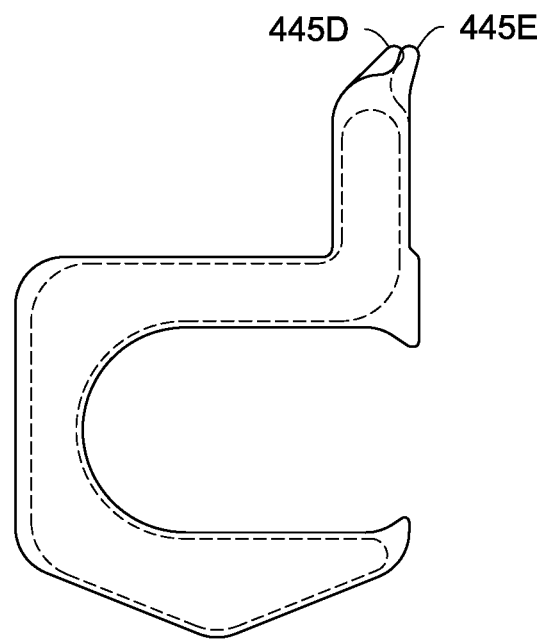
Figure 8H:
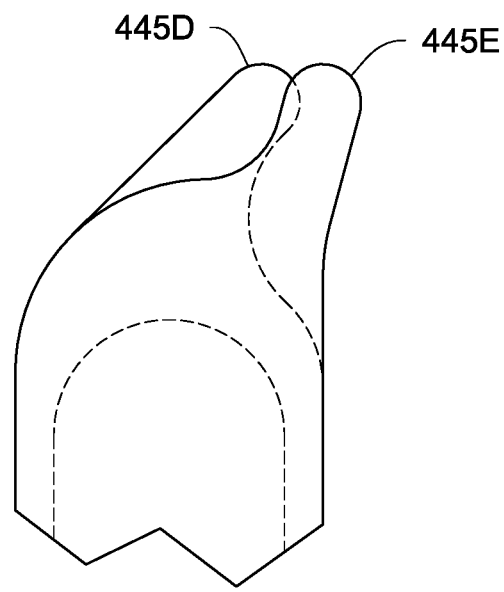

FIG. 8C shows another embodiment of the tip 445 (445D), and FIG. 8D is an enlarged view of the tip 445D. FIG. 8E shows yet another embodiment of the tip 445 (with tip extension 445E), and FIG. 8F is an enlarged view of the tip 445E. FIG. 8G shows the tips (445D, 445E) for a pair of DUT contact blades 430, and FIG. 8H is an enlarged view of the tips (445D, 445E). Such embodiment can minimize the adjacent overlap of the tip extensions (445D, 445E), and provide debris clearance between the tips (445D, 445E) configured to optimize the structure so that debris does not build up or debris can fall away. The tip extensions are preferably a narrowing of the distal end of the top into a bulbous end which is further offset laterally from the stem 444.

It will be appreciated that embodiments disclosed in FIGS. 8C-8H can minimizes the adjacent DUT contact blade (430A, 430B) faces in the tip (445D, 445E) to reduce shorting due to conductive debris. Geometry is not limited to what is shown in FIG. 8C-8H. The strength of the tip (445D, 445E) may be reduced by removal of material to reduce the adjacent face area (see FIGS. 8G-8H), increasing issue with tip (445D, 445E) bending during exceptional events such as DUT 110 jamming or DUT 110 presentation issues.

FIG. 9A illustrate a housing 155 (with a contact assembly 400 being stacked in the housing) to be loaded/installed onto a load board 170, according to an embodiment. FIG. 9B illustrate a housing 155 (with a contact assembly 400 being stacked in the housing) to be loaded/installed onto a load board 170, according to another embodiment.

As shown in FIGS. 9A and 9B, the contact assembly 400 is stacked into slots of the housing 155, with tip(s) 455 protruding upwards from a top surface (of a recess) of the housing 155 in the longitudinal direction (Z direction), and with two hump-shaped spaced apart protrusion(s) protruding downwards from a bottom surface of the housing 155 in the longitudinal direction (Z direction).

As shown in FIG. 9A, each of the load board contact blades (410A, 410B) can have two spaced apart hump-shaped protrusions 418 with a recess 424 therebetween. The protrusions 418 of the blade 410A are configured to contact one pad 172 of a pair of contact pads on the load board 170. The protrusions 418 of the blade 410B are configured to contact the other pad 172 of the pair of contact pads on the load board 170. In an embodiment, one of the blades (410A, 410B) can be a force blade, and the other one of the blades (410A, 410B) can be a sense blade. In FIG. 9B, the protrusion 419 on blade 410B can be configured to engage the load board 170 in the lateral spaced between protrusions 418. This protects the load board 170 by distributing the contact force from each protrusion over a greater area on the load board 170, preferably in both x and y axes.

Embodiment shown in FIG. 9A uses the same component/blade for the Kelvin load board contact blade (410B) and the test load board contact blade (410A) with two load board interfaces per contact blade (410A or 410B). Such embodiment can provide reduced number of components and less assembly issues due to blades (410A, 410B) assembling in incorrect order, since swapping these blades (410A, 410B) does not cause an issue. It will be appreciated that the traces on the load board may have to be adjacent and close to each other because the load board to blade(s) interfaces are adjacent on the Kelvin load board contact blade and the test load board contact blade.

As shown in FIG. 9B, the load board contact blade 410A can have two hump-shaped protrusions 418, and the load board contact blade 410B can have one hump-shaped protrusion 419 disposed in the middle of the bottom of the blade 410B in the width direction (X direction). The protrusions 418 of the blade 410A are configured to contact one pad 172 of a pair of contact pads on the load board 170. The protrusion 419 of the blade 410B is configured to contact the other pad 172 of the pair of contact pads on the load board 170. In an embodiment, one of the blades (410A, 410B) can be a force blade, and the other one of the blades (410A, 410B) can be a sense blade. Such embodiment can provide extra leeway for the load board design regarding spacing, lines, circuit routing, or the like so as to optimize the load board layout.

The embodiment of FIG. 9B that has unique Kelvin load board contact blade 410B with the test load board contact blade 410A can allow an offset between the load board Kelvin and test pads 172, which can allow the customer more freedom for routing traces and lowers cost of manufacturing to maintain distance between traces. Additionally, increasing the load board interface offset can reduce the probability of conductive debris shorting the load board pads or blades. It will be appreciated that the single interface contact can be either Kelvin or test contact blades (i.e., either 410B or 410A).

FIG. 10 is a side view of a contact assembly 400, according to an embodiment. As shown in FIG. 10, when being assembled, the opening(s) 442 of blade(s) 430 faces a direction opposite to a direction the opening(s) 422 of blade(s) 410 is facing. As such, the elastomer 460 is enclosed entirely by the guide arm(s) 436, the guide arm(s) 416, the retention arm(s) 412, the retention arm(s) 432, the body/bottom(s) of the blade(s) 410, and the body/bottom(s) of the blade(s) 430 in a plan view. During assembling, the elastomer 460 is to be received in the apertures of the blades 430 (or the blades 410) via their corresponding openings from a first direction, and then to be received in the apertures of the blades 410 (or the blades 430) via their corresponding openings from a second direction opposite to the first direction.

It will be appreciated that for configurations like FIG. 6, where all the blades (410, 430) having the openings (422, 442) of apertures (420, 440) oriented in a same direction, the elastomer 460 can expand into the openings (422, 442) and can be constrained by the housing contact body slot 550 front end 553 (see FIGS. 14A-14F). Such embodiment can have advantages of low stress on the elastomer 460 by giving the elastomer 460 room to expand and additionally the vertical elastomer force on the blades (410, 430) is more near in the horizontal direction to the tip DUT vertical forces. This can allow minimal amplification of forces due to the retention arm effect causes by offset forces acting on a beam.

Back to FIG. 10, if the load board contact blade 410 is reversed, the guide arm 416 of the load board contact blade 410 shorts to the DUT contact blade 430 and is nearest to the DUT 110. Such embodiment can significantly reduce the electrical path minimum distance between the DUT 110 and the load board 170. It will be appreciated that the aperture width may be reduced, when compared to other contact assembly configurations of the same total width; and the increased elastomer stresses may reduce the life of the elastomer 460.

Figure 11A:
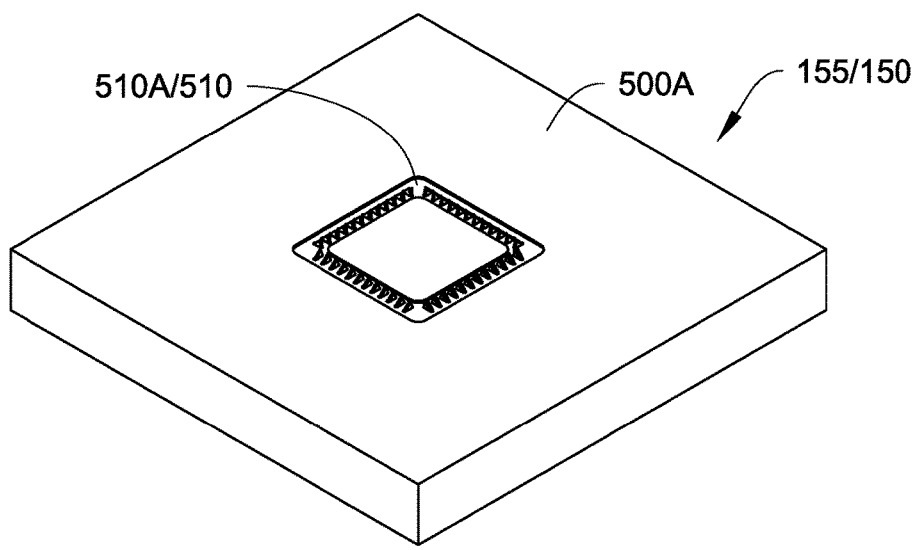
FIG. 11A is a perspective angled top view of a housing of a socket, according to an embodiment.
Figure 11B:
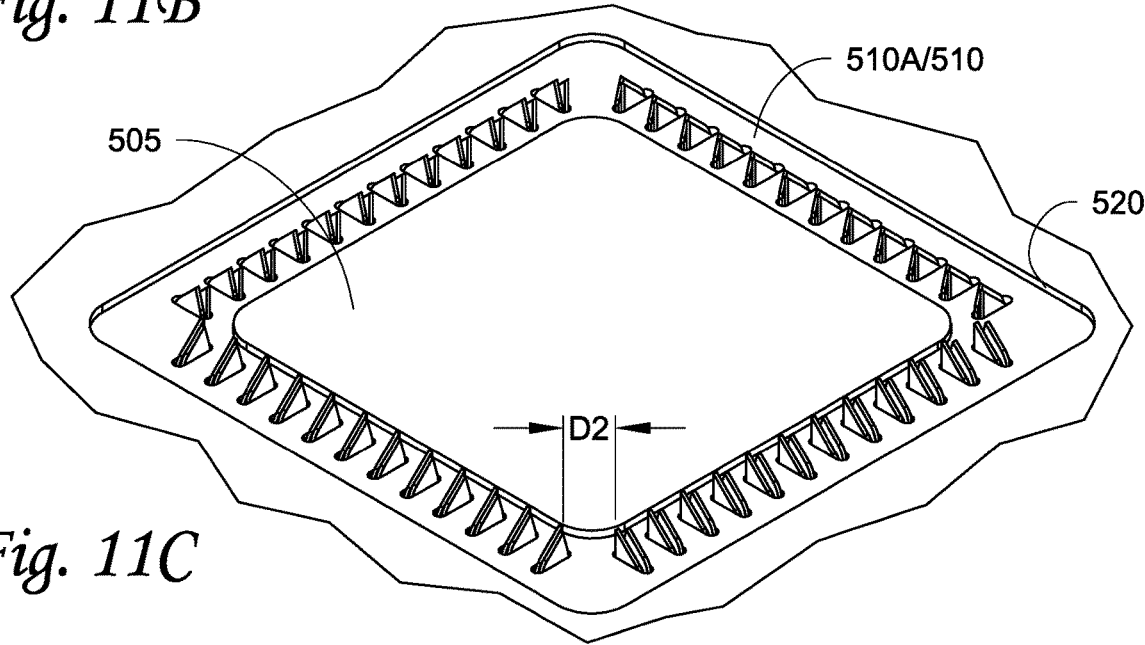
FIG. 11B is an enlarged view of an area of FIG. 11A, according to an embodiment.
Figure 11C:
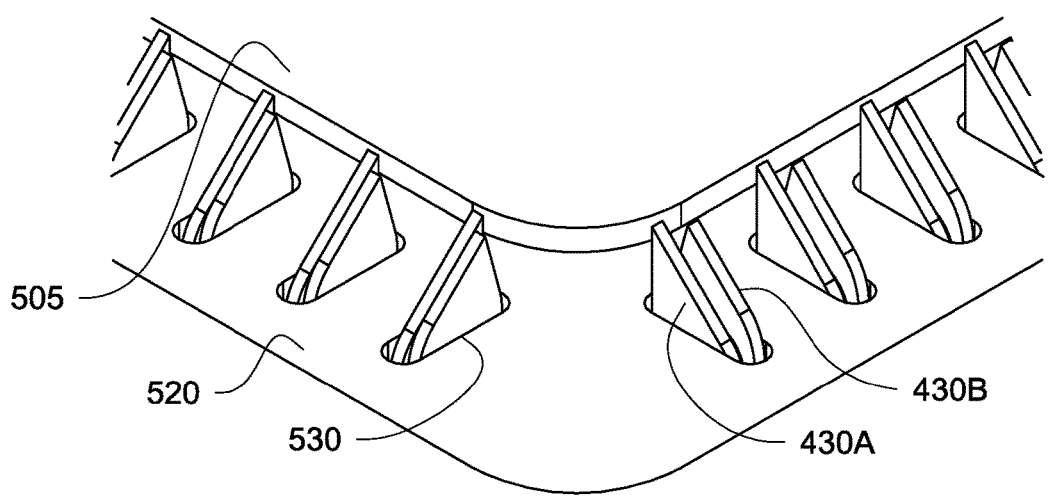
FIG. 11C is an enlarged view of a portion of the area of FIG. 11B, according to an embodiment.

FIG. 11A is a perspective angled top view of a housing 155 of a socket 150, according to an embodiment. FIG. 11B is an enlarged view of an area 510 of FIG. 11A, according to an embodiment. FIG. 11C is an enlarged view of a portion of the area 510 of FIG. 11B, according to an embodiment.

Figure 13A:
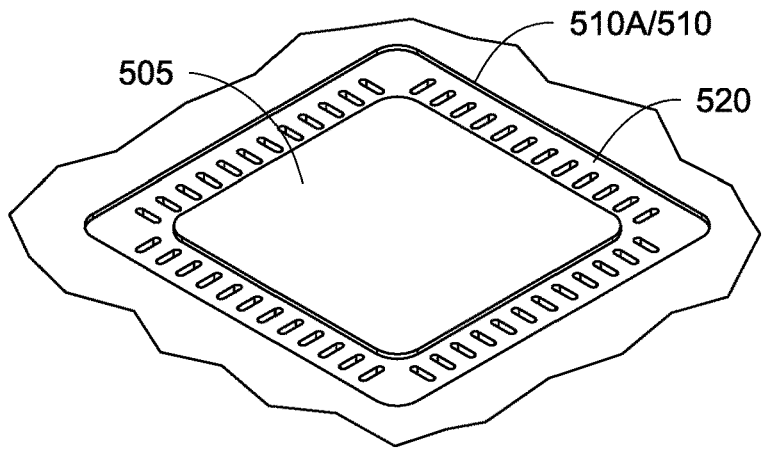
FIG. 13A is a perspective angled top view of the area of FIG. 11B without the contact assembly being installed, according to an embodiment.
Figure 13B:
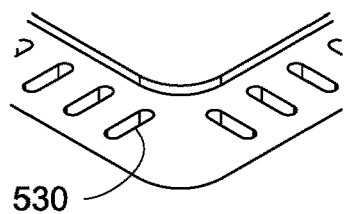
FIG. 13B is an enlarged view of a portion of the area of FIG. 13A, according to an embodiment.

FIG. 13A is a perspective angled top view of the area 510 of FIG. 11B without the contact assembly being installed, according to an embodiment. FIG. 13B is an enlarged view of a portion of the area 510 of FIG. 13A, according to an embodiment.

The housing 155 includes a top surface 500A, and the area 510. As shown in FIGS. 11A-11C, contact assemblies 400 are installed in the area 510 of the housing 155 (see also FIGS. 4A and 4B). The area 510 includes a top surface 510A.

The housing 155 includes a recess 520 along a periphery of the area 510. The recess 520 is recessed in the longitudinal/height direction (Z direction). A top surface of the middle portion 505 of the area 510 flushes with the rest of the top surface 500A excluding the recess 520. Along the recess 520, each side of the area 510 of the housing 155 includes a plurality of tip slots 530. Each slot 530 is configured to accommodate the stem(s) 444 (see FIG. 5B) and/or tip(s) 445 of the blade(s) 430 of a contact assembly 400. The tip(s) 445 of the blade(s) 430 extend above/beyond the top surface 500A in the Z direction (to be contacted with the DUT terminal(s)/pad(s) 112). As shown in FIG. 11B, there is a minimal tip to tip distance D2 at ends of perpendicular rows of contact assemblies 400.

Figure 12B:
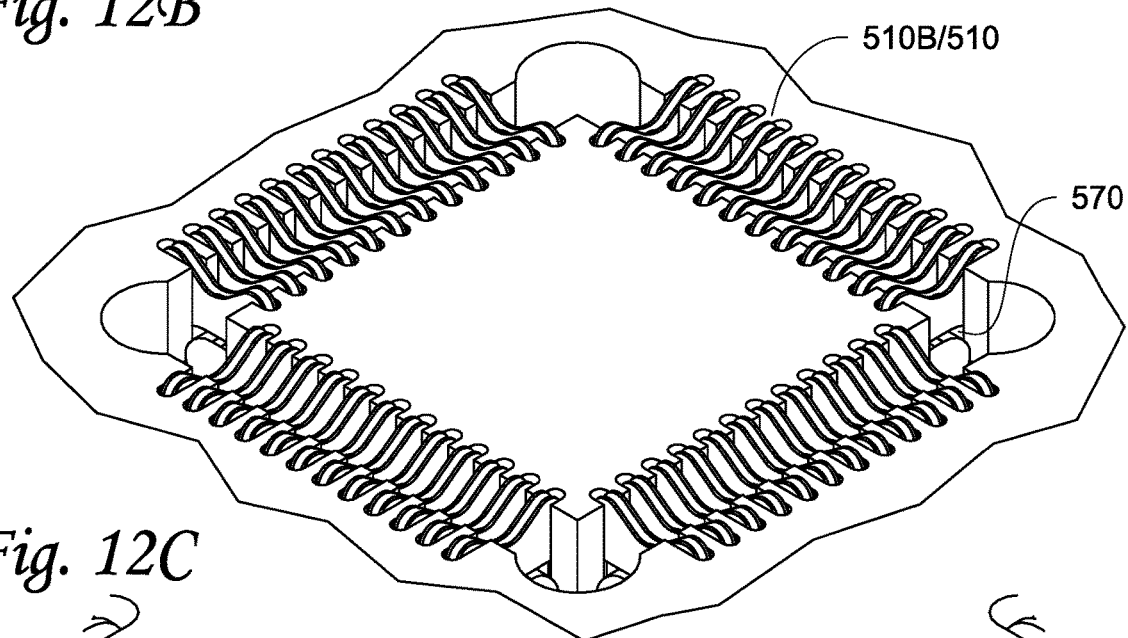
FIG. 12B is an enlarged view of an area of FIG. 12A, according to an embodiment.
Figure 12C:
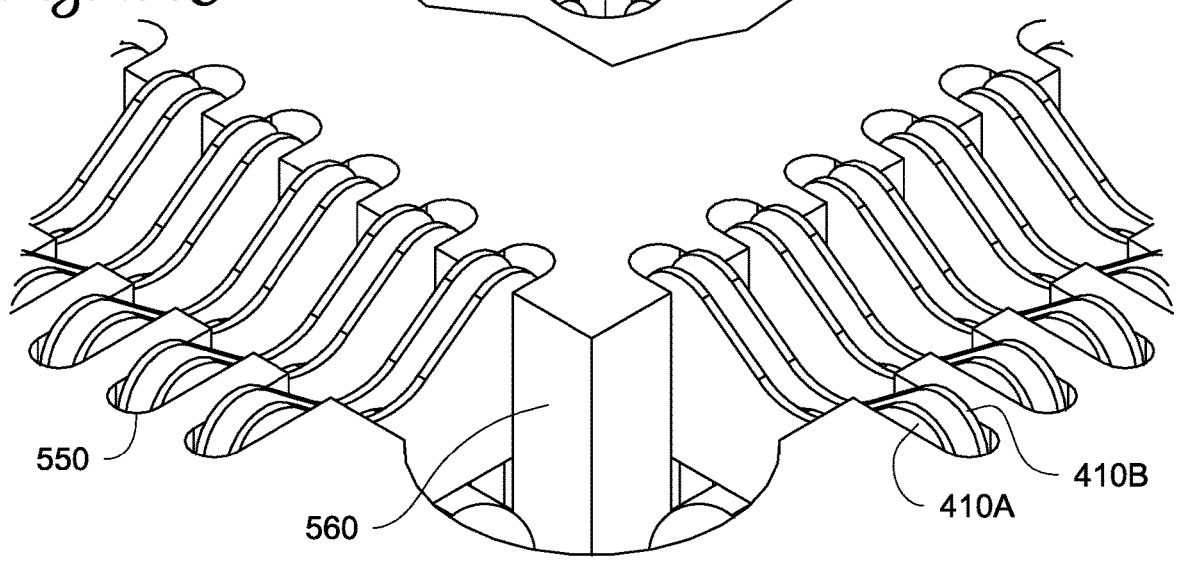
FIG. 12C is an enlarged view of a portion of the area of FIG. 12B, according to an embodiment.

FIG. 12A is a perspective angled bottom view of a housing 155 of a socket 150, according to an embodiment. FIG. 12B is an enlarged view of an area 510 of FIG. 12A, according to an embodiment. FIG. 12C is an enlarged view of a portion of the area 510 of FIG. 12B, according to an embodiment.

Figure 13C:
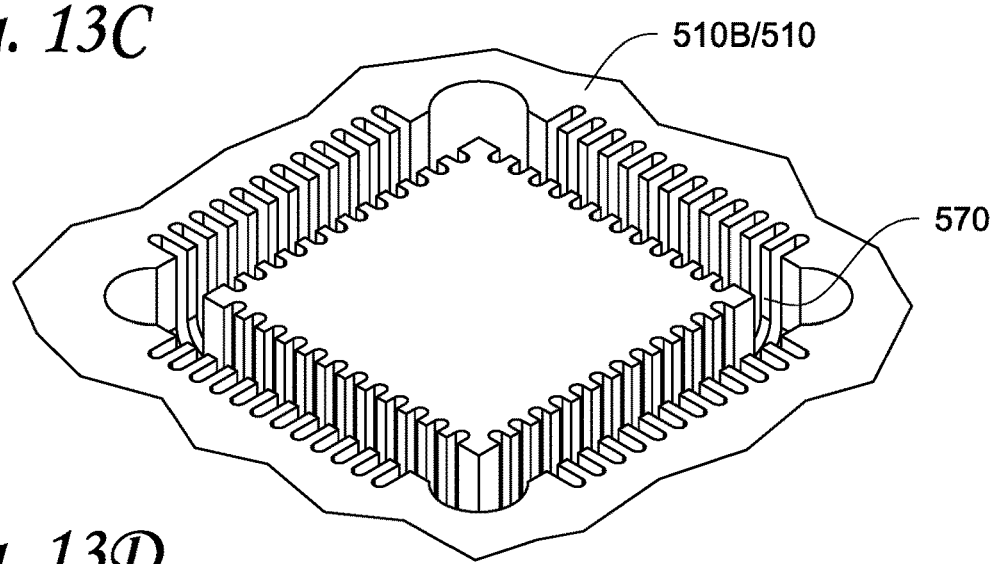
FIG. 13C is a perspective angled bottom view of the area of FIG. 12B without the contact assembly being installed, according to an embodiment.
Figure 13D:
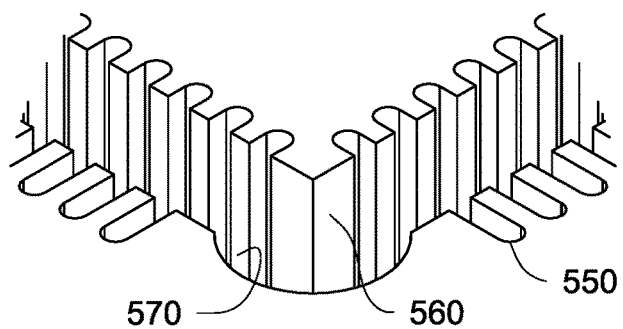
FIG. 13D is an enlarged view of a portion of the area of FIG. 13C, according to an embodiment.

FIG. 13C is a perspective angled bottom view of the area 510 of FIG. 12B without the contact assembly being installed, according to an embodiment. FIG. 13D is an enlarged view of a portion of the area 510 of FIG. 13C, according to an embodiment.

The housing 155 includes a bottom surface 500B, and the area 510. The area 510 includes a bottom surface 510B. The housing 155 includes elastomer slots 570 along a periphery of the area 510. The elastomer slots 570 is recessed in the Z direction and configured to install/accommodate the elastomer(s) 460. The elastomer slots 570 also extend along the sides of the area 510, such that each side of the area 510 includes a recess that is configured to accommodate an elongated elastomer 460 (shared by a row of contact assemblies 400, see also FIGS. 4A and 4B). Along the recess of each side of the area 510, the housing 155 includes a plurality of body slots 550 and corner structure(s) 560. Each slot 550 is configured to accommodate the bodies/bottoms (including hump-shaped protrusion(s) 418 and recess 424) of the blade(s) 410 of a contact assembly 400. The protrusion(s) 418 of the blade(s) 410 extend below/beyond the bottom surface 500B in the Z direction (to be contacted with the load board terminal(s)/pad(s) 172). A width of the body slot 550 is greater than a width of the elastomer slot 570 in the width direction of the blade(s) 410.

FIGS. 14A-14F are angled cross sectional views of a contact assembly 400 being stacked in a housing 155 of a socket 150, according to some embodiments. It will be appreciated that FIGS. 14A-14F do not mean to illustrate how the contact assembly 400 is installed into the housing 155. Instead, FIGS. 14A-14F show what the contact assembly 400 being stacked in the housing 155 may look like, in a piece by piece fashion.

Figure 14C:
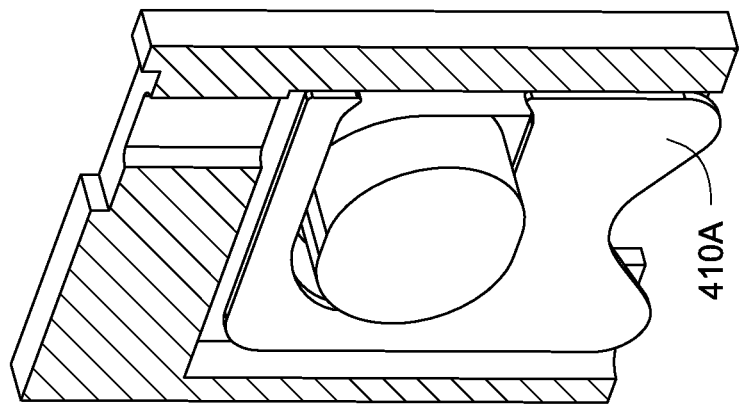
FIGS. 14A-14F are cross sectional views of a contact assembly being stacked in a housing of a socket, according to some embodiments.

The area 510 of the housing 155 includes a plurality of contact assembly slots. Each contact assembly slot is configured to accommodate a contact assembly 400. As shown in FIG. 14A, each contact assembly slot includes a tip slot 530, a body slot 550, and an elastomer slot 570. The middle portion 505 of the housing 155 serves as a hard-stop for the DUT 110. A width (from a first end 531 to a second end 532) of the tip slot 530 is smaller than a width of the recess (DUT burr clearance slot) 520. A width (from a first end 552 to a second end 553) of the body slot 550 is larger than the width of the recess 520. The elastomer slot 570 is formed within the body slot 550 in a plan cross sectional view. The body slot 550 includes an up-stop 551. The elastomer slot 570 includes an elastomer interface 571 and an opening (elastomer access) 572.

Figure 14B:
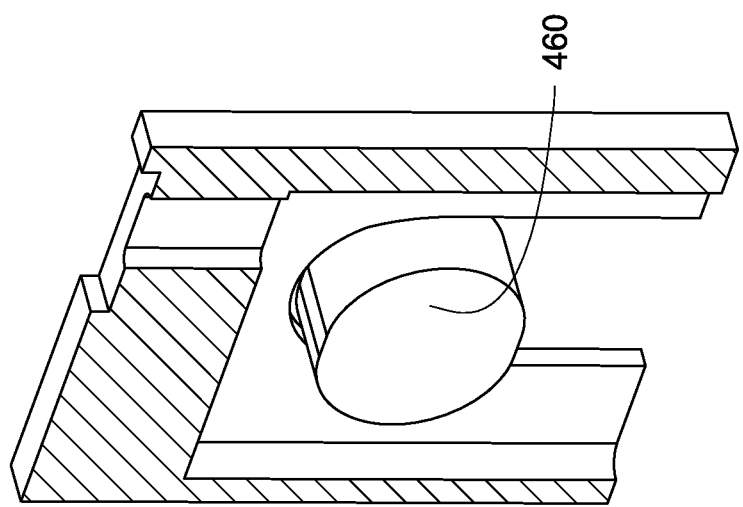
Figure 14A:
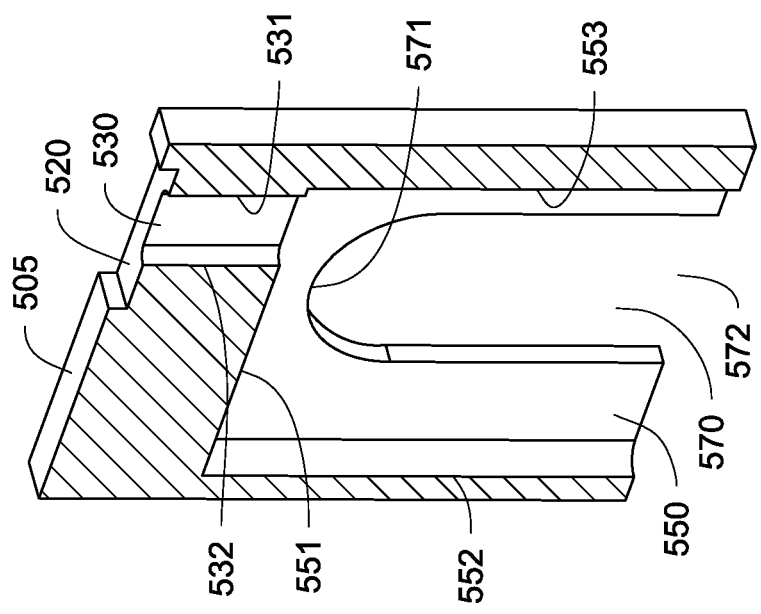

As shown in FIG. 14B, an elastomer 460 is stacked into the contact assembly slot of the housing 155 via e.g., the opening (elastomer access) 572. The elastomer 460 contacts the elastomer interface 571 of the elastomer slot 570.

As shown in FIG. 14C, a load board contact blade 410A is stacked into the body slot 550, with its aperture 420 receiving the elastomer 460. The up-stop 551 of the body slot 550 is configured to prevent the retention arm 412 of the blade 410A from moving up into the tip slot 530. It will be appreciated that in an embodiment, there is a vertical gap between the up-stop 551 and the retention arm 412 of the blade 410A in all states (see FIGS. 15A-15C). A width of the blade 410A is slightly smaller than the width of the body slot 550, and is larger than the width of the tip slot 530. The hump-shaped protrusion(s) 418 of the blade 410A protrude below/beyond a bottom surface of the housing 155.

Figure 14D:
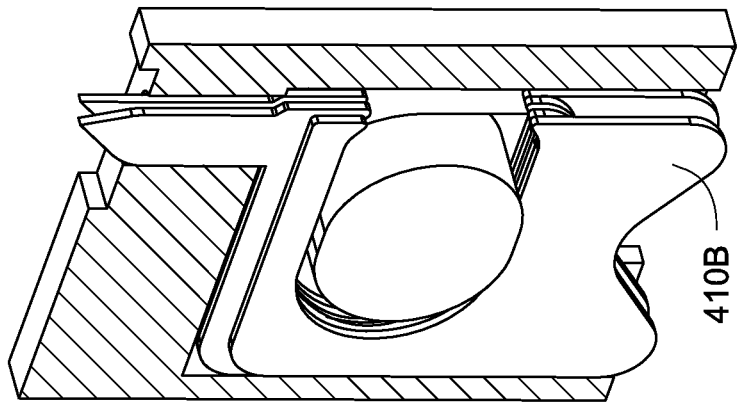

As shown in FIG. 14D, a DUT contact blade 430A is stacked on top of the blade 410A, with its aperture 440 receiving the elastomer 460. An insulation layer 450 is attached on a side surface 446 of the blade 430A. In another embodiment, the insulation layer 450 can be attached on a side surface 446 of the blade 430B or a side surface of other blade(s). The stem 444 of the blade 430A is accommodated in the tip slot 530 of the housing 155, with the tip 445A of the blade 430A protruding above/beyond the top surface of the recess (DUT burr clearance slot) 520 and above/beyond the top surface of the middle portion 505. The body/bottom of the blade 430A is accommodated within the body slot 550, with the hump-shaped protrusion 438 of the blade 430A being kept above the bottom surface of the housing 155. A width of the body of the blade 430A is similar to or the same as a width of the blade 410A, is slightly smaller than the width of the body slot 550, and is larger than the width of the tip slot 530. The up-stop 551 of the body slot 550 is configured to prevent the retention arm 432 (and/or the up-stop 448) of the blade 430A from moving up into the tip slot 530.

Figure 14E:
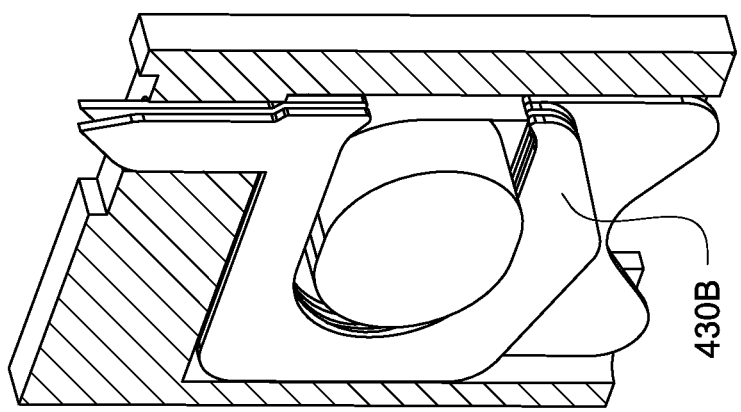

As shown in FIG. 14E, another DUT contact blade 430B is stacked on top of the blade 430A. The configuration of the blade 430B can be identical to the configuration of the blade 430A, except that there can be an offset between the tip 445A of the blade 430A and the tip 445B of the blade 430B (see FIG. 8A).

Figure 14F:
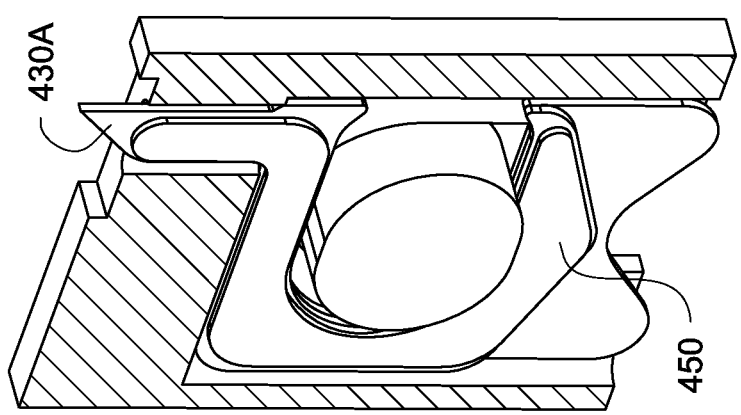

As shown in FIG. 14F, another load board contact blade 410B is stacked on top of the blade 430B. The configuration of the blade 410B can be identical to the configuration of the blade 410A. It will be appreciated that the apertures (420, 440) of the blades (410, 430) can be similar to each other or be the same in a plan cross sectional view.

FIGS. 15A-15C are cross sectional views of a contact assembly 400 being installed in a housing 155 of a socket 150 and being in different states, according to some embodiments.

FIG. 15A illustrates a contact assembly 400 being installed in the housing 155 of a socket 150 and being in a free state. A free state of the contact assembly 400 can be a state when there is no force being exerted on the contact assembly 400 either from the DUT 100 or the load board 170. When the contact assembly 400 is installed in the housing 155, in the free state, the elastomer 460 is slightly compressed by the blades (410, 430) and the elastomer slot 570 such that the contact assembly 400 can be retained in the housing 155.

In the free state, the height H1 for accommodating the elastomer 460 (or the height limit the elastomer 460 can expand into when the elastomer 460 is compressed) is at the maximum, set by the apertures (420, 440). The width D3 for accommodating the elastomer 460 (or the width limit the elastomer 460 can expand into when the elastomer 460 is compressed) can also be set by the width of the apertures (420, 440), plus a distance between the edge/side of the blades (410, 430) and the second end 553 of the body slot 550. It will be appreciated that when the elastomer 460 is compressed, the elastomer 460 can also expand/bulge into the space/clearance defined by thickness of the body slot 550, the elastomer slot 570, and/or the blades (410, 430). In the free state, the gap G1 between the up-stop 551 of the body slot 550 and the retention arm 412 of the blade 410 is at the maximum.

It will be appreciated that the width D3 is larger than the width of the elastomer 460 such that the elastomer 460 fills the width of the apertures (420, 440) when the elastomer 460 is deformed by compression. The front of the apertures (420, 440) is open to the housing 115 such that the center of elastomer force can be biased towards the tips 445 without the blades (410, 430) or elastomer 460 extending far in front of the tips 445. The asymmetrical distribution of the blades (410, 430) material on the rear side of the tip 445, can minimize the distance between the row contact assemblies 400 outside blades (410, 430) when the row contact assemblies 400 are placed perpendicular to each other (see FIG. 11B).

The height H (H1, H2, H3) changes through the actuation sequence of the contact assembly 400 and interacts with the elastomer 460 in shear to provide the DUT electrical interface and load board electrical interface forces. FIG. 15B illustrates a contact assembly 400 being installed in the housing 155 of a socket 150 and being in a preload state.

The contact assembly 400 can be in a preload state during installation of the socket housing 155 on to a load board, which compresses the load board contact blades 410 into the housing 155 (so that the protrusions 418 of the blades 410 flush with the bottom of the housing 155). The blades 410 also exert a force on the elastomer 460 which drives the centroid of the elastomer 460 up towards an upper end of the elastomer slot 570. The shift of the elastomer centroid can exert force on the DUT contact blades 430 to bias the up-stop 448 of the DUT contact blades 430 against the housing up-stop 551 of the body slot 550. The height H is reduced (from H1) to H2 at the preload state and the height H2 at this state controls the force at the up-stop interface. In the preload state, the gap between the up-stop 551 of the body slot 550 and the retention arm 412 of the blade 410 is also reduced (from G1) to G2.

FIG. 15C illustrates a contact assembly 400 being installed in the housing 155 of a socket 150 and being in a load state. The contact assembly 400 can be in a load state when the DUT 110 engages the tips (445) of the DUT contact blades 430 and shifts the DUT contact blades 430 down towards the load board 170, while the load board contact blades 410 are fixed against the load board 170. The relative movement of the DUT contact blades 430 and the load board contact blades 410 reduces the height H (from H2) to H3 and loads the elastomer 460 in shear to provide the contact assembly 400 vertical force and compliance. In the load state, the gap between the up-stop 551 of the body slot 550 and the retention arm 412 of the blade 410 is also reduced (from G2) to G3 (e.g., a non-zero value). It will be appreciated that in any states (free, preload, load), the protrusion 438 of the blade 430 is within the body slot 550 and may not below/beyond the bottom of the housing 155 to contact the load board 170.

Figure 16:
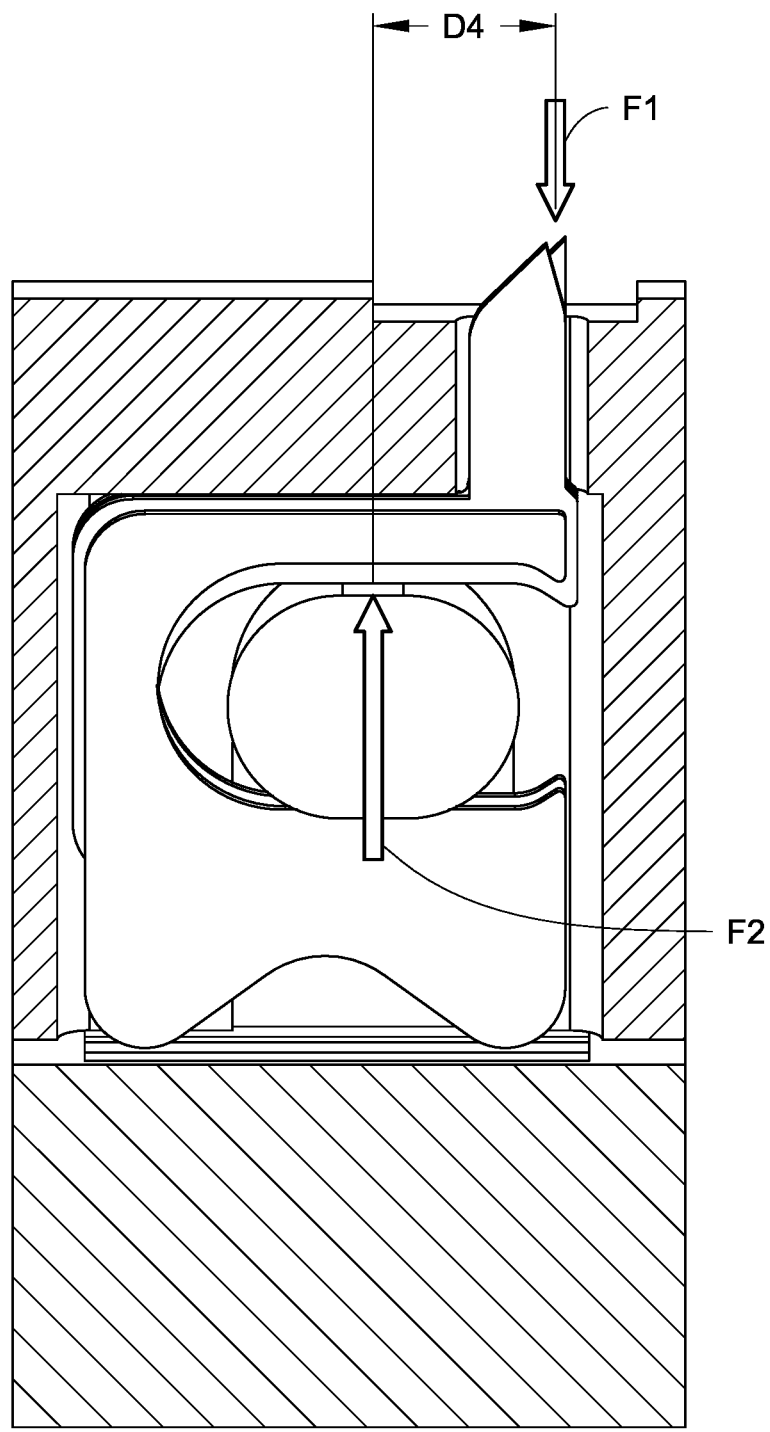
FIG. 16 illustrates an offset in distance between vertical DUT and elastomer forces on the DUT contact blades, according to an embodiment.

FIG. 16 illustrates an offset in distance between vertical DUT 110 and elastomer forces on the DUT contact blades 430, according to an embodiment. As shown in FIG. 16, the force exerted on the tips 445 of the blades 430 of the contact assembly 400 from the DUT 100 is F1. The force exerted on the blades (410, 430) of the contact assembly 400 from the elastomer 460 is F2. The offset in distance (D4) between vertical DUT 110 and elastomer forces on the DUT contact blades 430 can affect the rotational motion of the DUT contact blades 430. The contact assembly 400 is in a free state.

It will be appreciated that FIG. 8A shows a tip offset D1 between tips 445A and 445B. In another embodiment, D1 can be removed. For example, in an embodiment, the blades 430A and 430B can be identical. Removal of the tip offset D1 can have advantages for manufacturability. For example, if the tip (445A, 445B) geometry matches, then the perimeter of the DUT test contact blade 430A and the DUT Kelvin contact blade 430B can match, and thus the blades (430A, 430B) can share manufacturing processes. In addition, when combined such embodiment with other alternatives to have e.g., a separate insulation component, then the contact assembly 400 may reduce potential errors with interchange of the DUT test contact blade 430A and DUT Kelvin contact blade 430B.

Back to FIG. 16, the contact tip distance (D4) to the centroid of the elastomer 460, and center of force can affect the tilting retention arm(s) of the contact blades. As such, removing the contact tip offset D1 can also pair the rotational motion of the DUT test contact blade 430B and the DUT 110.

Figure 17A:
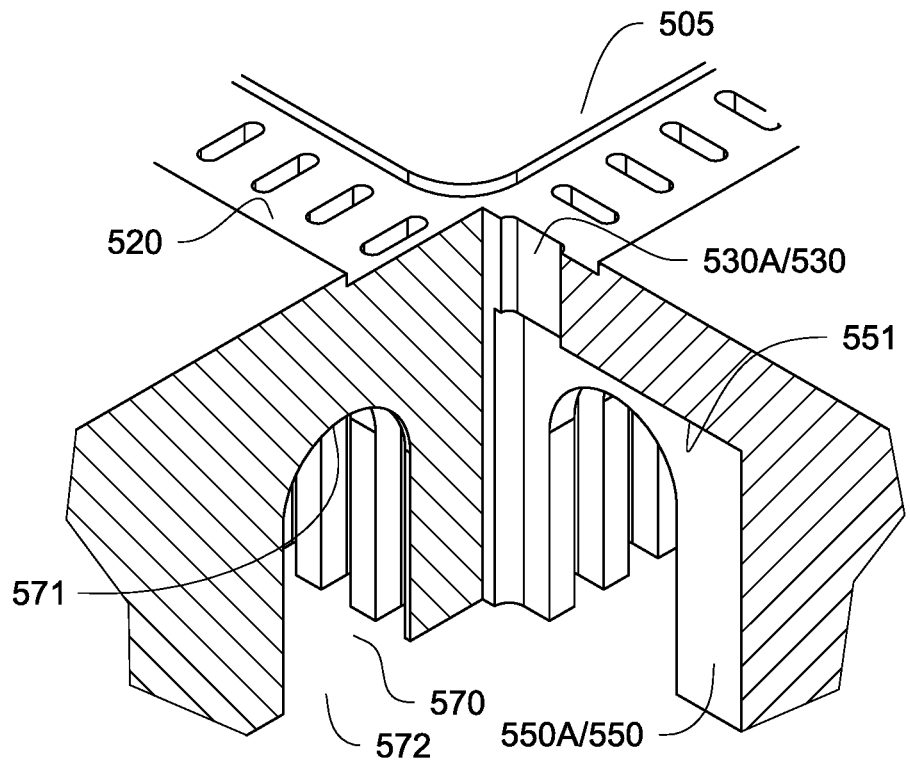
FIG. 17A is a cutaway perspective view of a housing of a socket, according to an embodiment.
Figure 17B:
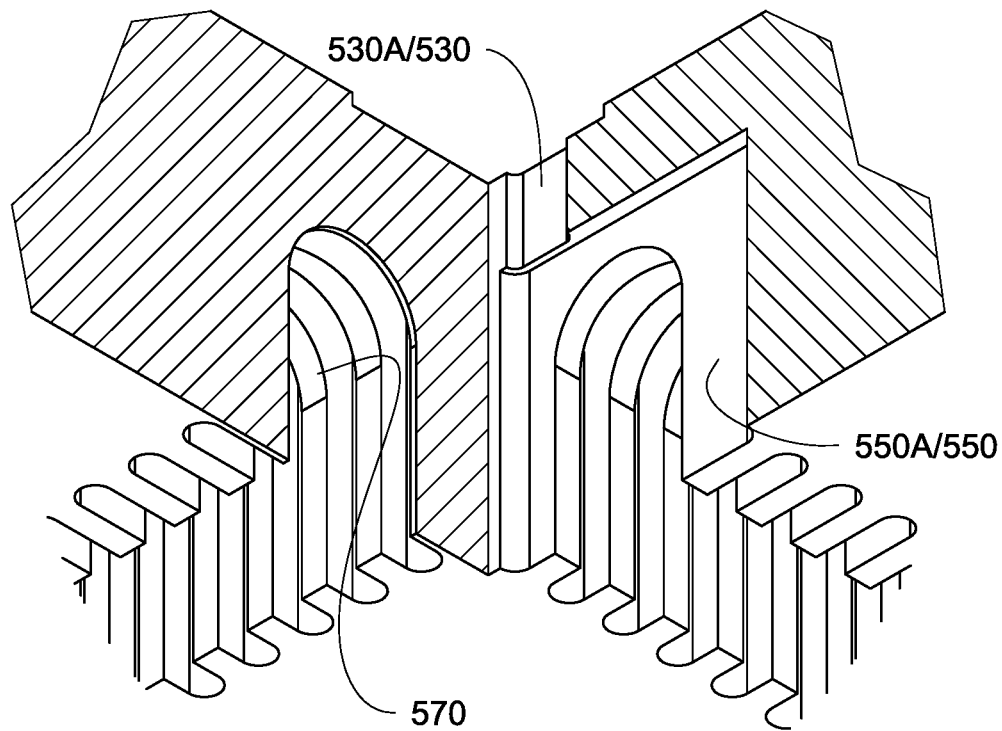
FIG. 17B is FIG. 17A viewed in a different angle, according to an embodiment.

FIG. 17A is a cutaway perspective view of a housing 155 of a socket 150, according to an embodiment. FIG. 17B is FIG. 17A viewed in a different angle, according to an embodiment. See FIGS. 14A-14F for the detailed description on the structures of the components of the housing 155. The tip slot 530 includes fine locating faces (530A, opposite side in the thickness direction is not shown). The body slot 550 includes rough locating faces (550A, opposite side in the thickness direction is not shown). The elastomer slot 570 extends in the thickness direction from an end to another end of a side of the area 510 (see FIG. 4A) to receive an elongated elastomer 460 shared by a row of contact assemblies 400.

It will be appreciated that the contact assemblies 400 can be assembled or stacked, and then installed in to the housing 155 from the bottom side of the housing 155 to form a test contactor or a part of the test contactor. The test contactor is then aligned visually on alignment pins, the test contactor alignment pins engage on load board alignment holes, the test contactor load board contact blades engage the load board and is partially compressed. Fastening bolts can be inserted in test contactor and through the load board, and fastening nuts can be tightened fully. As the housing 155 and the load board 170 are forced together at fastener locations, then the load board contact blades complete compression. Some gap can be left between the housing 155 and the load board 170 near contact blade locations due to housing 155 and load board 170 flex. The load board 170 and the contact assembly 400 can be then connected to automated or manual test system.

It will also be appreciated that the DUT actuation and/or the contact assembly actuation can include automated or manual test system initiating the DUT contact blade with highest one to three contact blade tips in the test contactor, with the number of blade tips initially contacted depends on rotational constraints of the DUT 110 in the test system. Actuation also includes continued actuation of the DUT into the test contactor engaging and compressing the DUT contact blades, internally forces from the system on the DUT 110 being transferred within the test contactor and the load board 170. In such step, the DUT contact blade shoulder 432/448 disengages with the housing up-stop 551; the DUT contact blade body translates vertically guided by housing body slot 550 walls and roughly by body slot 550 end geometry; the DUT contact blade tips displace or compress DUT pad material and debris; the DUT contact blades elastomer shear interface compresses the elastomer 460 vertically; the vertical compression of the elastomer 460 transfers some forces outward and the elastomer 460 horizontal forces transfer to the elastomer slot 570 end and to the housing 155; the horizontal forces of the elastomer 460 on the contact blade bias the contact blade towards the end of the housing slot; the elastomer 460 compresses and transfers some vertical shear forces to the neighboring load board contact blade elastomer shear interface; and the vertical force of the load board contact blade on the load board pad increases from the preload state, further deforming, compressing the load board pad and/or debris. Actuation further includes compression of the contact blades stop when the DUT 110 is stopped by a hard-stop in the machine or the compression continues when the DUT 110 engages the housing hard-stop 505. If the DUT 110 engages the housing hard-stop 505 then the DUT contact blades translate nearly vertically, and housing flexes vertically together until the housing bottom engages the load board; or the test system forces reach equilibrium with the contact assembly actuation, housing flex, and/or load board flex forces. See also FIGS. 15A-15C regarding the actuation.

FIGS. 18A-18D illustrate different configurations of the elastomer slot 570, according to some embodiments. As shown in FIGS. 18A-18D, the elastomer slot 570 can have an arched door-shape (FIG. 18A), a rectangular shape (FIG. 18B), a key-hole shape (FIG. 18C), a T-shape (FIG. 18D), or any other suitable shape in a cross-sectional view. The elastomer may also be non-circular/cylindrical such as oval or rectangular. The elastomer(s) may also be notched or the like to allow extra cavity space for compression.

Figure 18A:
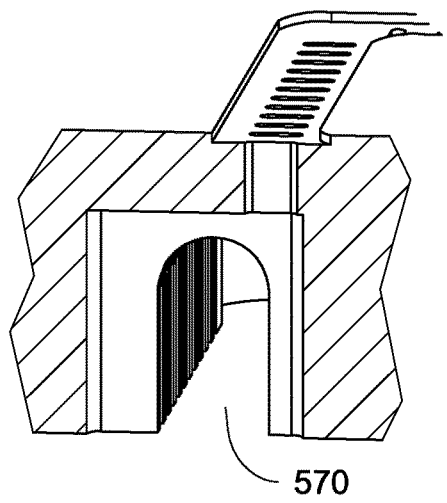
FIGS. 18A-18D illustrate different configurations of the elastomer slot, according to some embodiments.

FIG. 18A shows an elastomer slot 570 with a radius end and two parallel faces tangent to the radius end that provide access to install the contact assembly 400. The width of the elastomer slot 570 can be smaller than the width of the elastomer 460 so the elastomer slot 570 positions and retains the elastomer 460 after installation. The access to the elastomer slot 570 is perpendicular to the load board and has a constant width. The constant width access of the elastomer slot 570 can be low cost to manufacture, and can be optimal to avoid elastomer 460 damage during install and removal due to lack of external corners to catch and tear the elastomer 460.

Figure 18B:
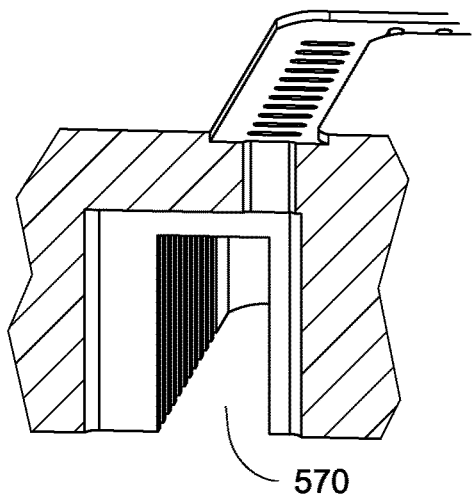

FIG. 18B shows a box ended elastomer slot 570, which has more vertical space for the elastomer 460 to expand into during deformation due to DUT 110 actuations. Such embodiment can have the elastomer less compress and can reduce the force variation and nominal. Additionally, during use of the contact assembly 400 at high temperature, the expansion of the elastomer 460 can have less impact on force, because the elastomer 460 can expand more into the corners of the body slot 550.

Figure 18C:
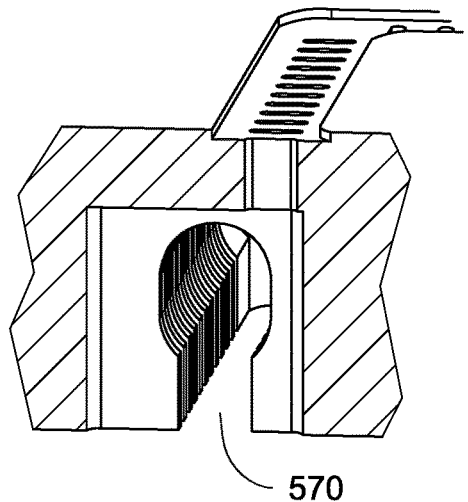

FIG. 18C shows a keyhole shape elastomer slot 570 that retains the elastomer 460 due to the width of the access opening of the elastomer 460, and therefore the horizontal compression of the elastomer 460 due to the housing 155 can be controlled independently of the retention mechanism. Such embodiment can lower stress on the elastomer 460 and extend life the elastomer 460. The interface opening size of the elastomer slot 570 can be optimized larger than the elastomer 460 displaced during contact assembly actuation. The elastomer 460 displaced horizontally grows into the space without interfacing with the elastomer slot 570, and can be only limited by the aperture(s) (420, 430) formed by the blades (410, 430) and the end of the body slot 550.

Figure 18D:
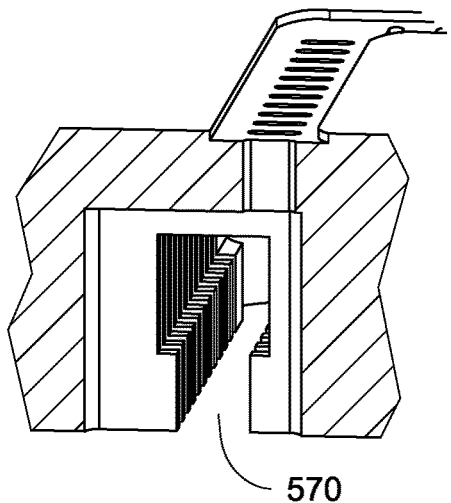

FIG. 18D shows a "T" shape elastomer slot 570 that has similar benefits to the keyhole shape elastomer slot of FIG. 18C, with the added benefit of easier to control manufacturing, and tooling shape. It will be appreciated that the sharp corner of the elastomer slot 570 in the transition from the elastomer interface opening to the elastomer access opening is a sharp corner which can catch and tear the elastomer 460 upon installation or removal.

Figure 19A:
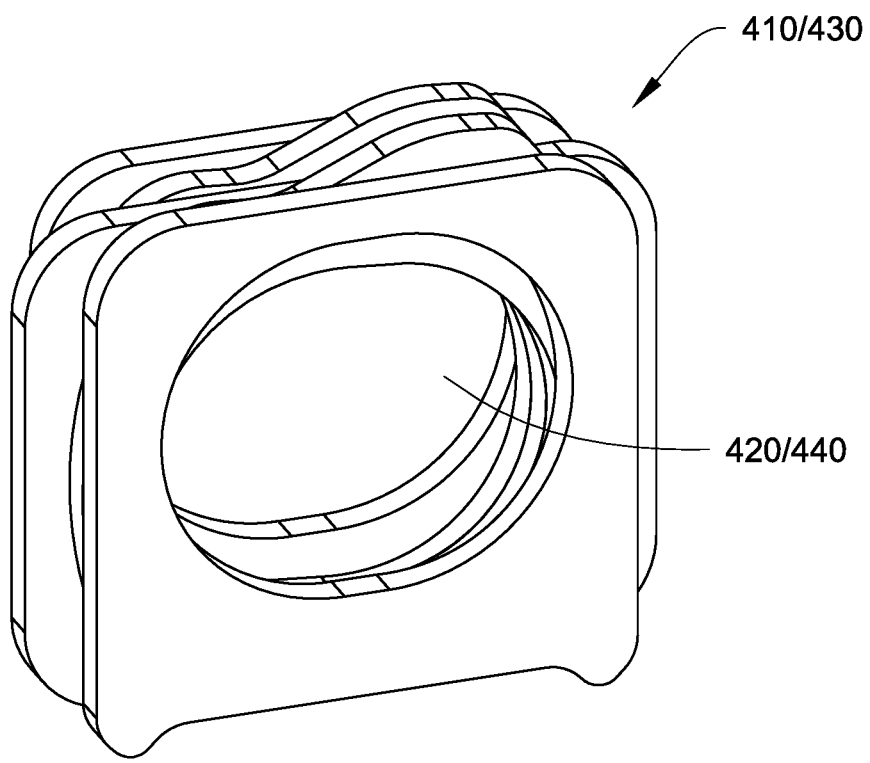
FIG. 19A illustrates different configurations of the blades, according to an embodiment.
Figure 19B:
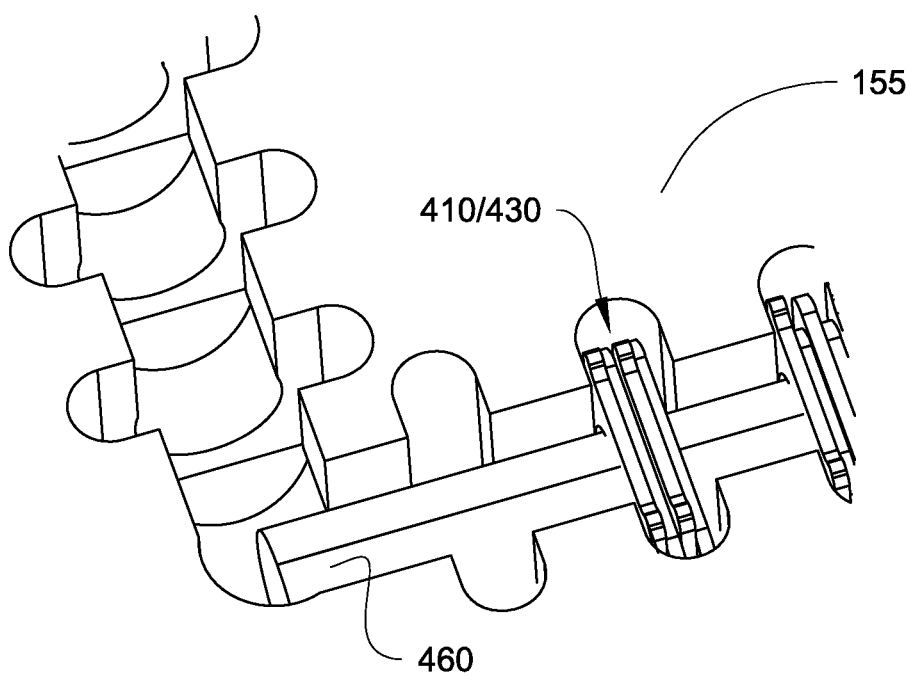
FIG. 19B illustrates the blades of FIG. 19A and an elastomer accommodated in a housing, according to an embodiment.

FIG. 19A illustrates different configurations of the blades (410, 430), according to an embodiment. FIG. 19B illustrates the blades of FIG. 19A and an elastomer 460 accommodated in a housing 155, according to an embodiment.

As shown in FIG. 19A, the blades (410, 430) can have closed apertures (420, 440). In such embodiment, a shorter electrical path length can be achieve. It will be appreciated that the elastomer center of force can move farther relative to the tip(s) of the blades (410, 430) at the edge of the blade(s) width, therefore the side force on the tip(s) due to rotation is higher from the retention arm(s) distance between the DUT interface and the elastomer interface of the blades (410, 430). In an embodiment, the DUT tip can be centered over the elastomer center of force, which may result in fit issues near the intersection of perpendicular contact assembly 400.

Figure 20A:
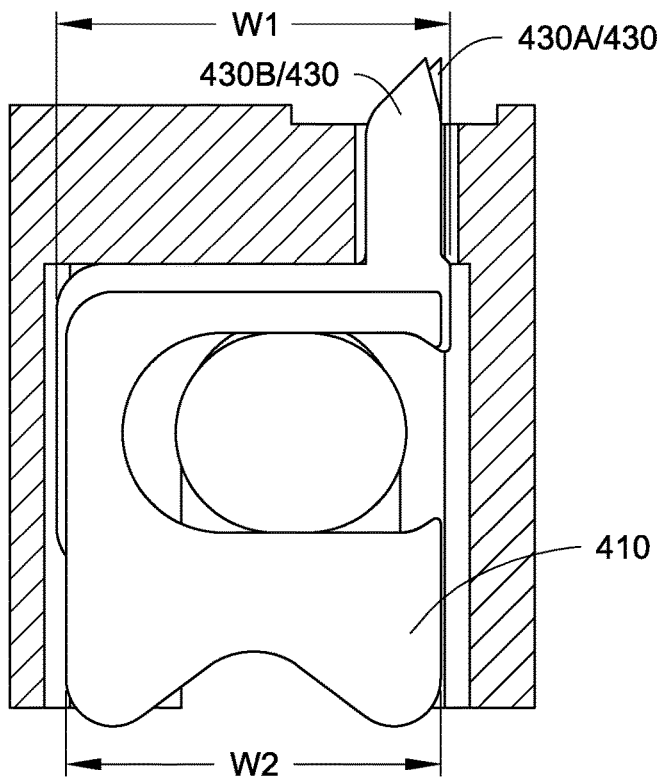
FIG. 20A is a cross sectional view of a contact assembly installed in the housing, according to an embodiment.
Figure 20B:
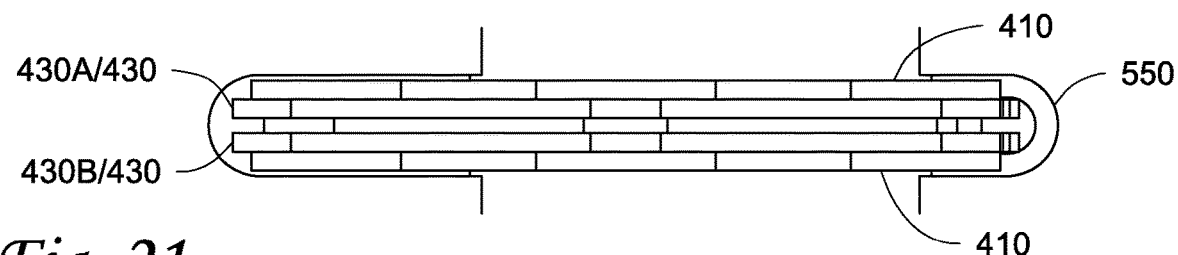
FIG. 20B is a bottom view of a body slot of the housing accommodating blades, according to an embodiment.

FIG. 20A is a cross sectional view of a contact assembly 400 installed in the housing 155, according to an embodiment. FIG. 20B is a bottom view of a body slot 550 of the housing 155 accommodating blades (410, 430), according to an embodiment. It will be appreciated that the C-opening/recesses in the blades can be reversed resulting in the elastomer being completely surrounded but also providing a shorter path from DUT to load board for lower inductance.

In an embodiment, the width W1 of the DUT contact blade 430 and the width W2 of the load board contact blade 410 can be different. In another embodiment, W1 can be the same as W2. The width (W1, W2) can be modified to control fit of the width of the blades (410, 430) in the body slot 550 depending on the radius end(s) (see FIG. 20B shows the radius ends of the body slot 550) of the body slot 550. As shown in FIG. 20B, due to the radius at the end(s) of the body slot 550, any blade (430) in the center of the body slot 550 needs to be longer than the blade 410 at the edge of the body slot 550 to maintain the clearance or locating fit of the blades (410, 430) in the slot body 550. It will be appreciated that a clearance fit can allow more tilting of the blades (410, 430), which may enable control of scrub length on DUT 110. A locating fit can minimize scrub length on DUT 110, which can be optimal depending on the DUT pad 112 material and presence of oxide and contamination. Changing the order of the blades (410, 430) configuration can also change the optimum width of the blades (410, 430), depending on desired fit in the body slot 550.

In an embodiment, the width W2 of the load board contact blade 410 is greater than the width W1 of the DUT contact blade 430 to maintain the same fit of the blades (410, 430) in the body slot 550. The ends of the body slot 550 can be rounded, therefore since the load board contact blades 410 are to the outside of the contact assembly 400, there is a need to be shorter width than the DUT contact blade 430 to maintain the same fit. It will be appreciated that in an embodiment, the thickness of the blades (410, 430) can be slightly smaller than a thickness of the body slot 550 for easy installation and for a clearance fit.

Figure 21:
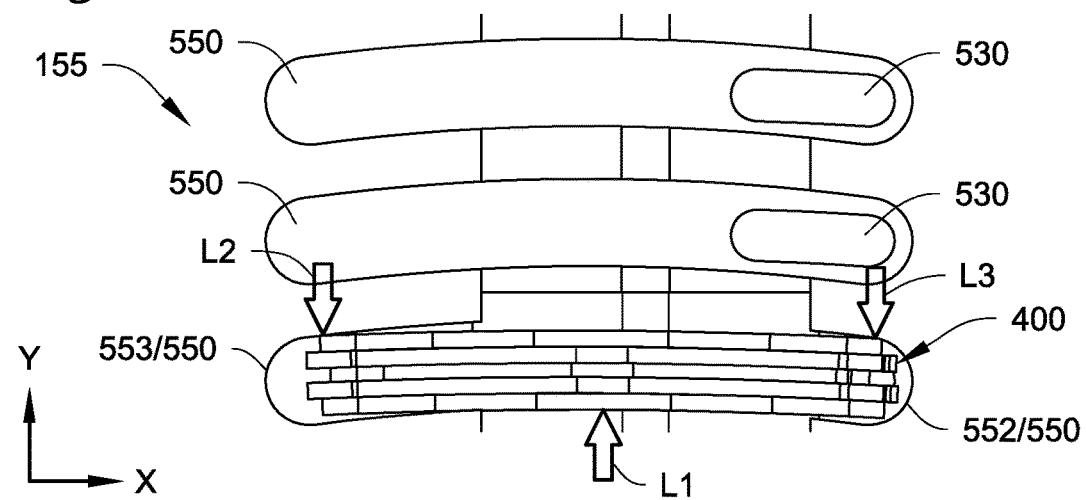
FIG. 21 is a bottom view of the housing accommodating contact assemblies, according to an embodiment.

FIG. 21 is a bottom view of the housing 155 accommodating contact assemblies 400, according to an embodiment.

The housing 155 of a socket 150 includes body slot(s) 550 and tip slot(s) 530. Each body slot 550 includes two ends (552 and 553, see also FIGS. 14A-14F). The tip slot 530 is configured to accommodate the stem(s) 444 and/or tip(s) 445 of the blade(s) 430 of a contact assembly 400. The body slot 550 is configured to accommodate the blades (410, 430) and the insulation layer 450. In FIG. 21, only one contact assembly 400 is shown in the housing 155 as an example. The contact assembly 400 includes the blades (410, 430), the insulation layer 450, and the shared elongated elastomer (not shown, see FIG. 4A).

As shown in FIG. 21, the shape of the body slot 550 of the housing 155 is designed to be curved. Such embodiment can increase and control the normal force at the internal electrical interfaces (e.g., side 446 of blade 430 and/or side 426 of blade 410 that electrically contact with adjacent side, see FIGS. 5A and 5B) by using the contact blades as flexible members of the contact assembly 400. In such embodiment, the body slot 550 of the housing 155 can flex the contact blades (410, 430) along with the insulation layer 450 such that a centerline (in the width X direction in the bottom view) of the contact assembly 400 can be at or nearly parabolic.

It will be appreciated that the shape of the centerline of the contact assembly 400 can be controlled by three lines of contact (L1, L2, and L3) for the two contact blades on the outside (in the thickness Y direction) of the contact assembly 400. One side of the contact assembly 400 interfaces with the body slot 550 along two lines of contact (L2, L3) near the ends (close to ends 552 and 553 of the body slot 550) of the contact blade. On the contact blade on the opposite side of the contact assembly 400 (in Y direction), there is one line of contact L1 with the body slot 550 of the housing 155.

It will be appreciated that a perpendicular distance from a plane between the two lines of contact (L2, L3) on one side of the contact assembly 400 to the line of contact L1 on the opposite side of the contact assembly 400 in Y direction is less than the thickness of the blade stack (410, 430, 450), so that the contact assembly 400 is flexed by the normal force of the housing 155 in the middle of the contact assembly 400 pushing one contact blade while supported on the opposite side at two interfaces (see also L2, L3) of another blade, similar to a supported beam.

It will also be appreciated that the magnitude of the normal force can be controlled by adjusting the perpendicular distance from a plane through the two supports (see also L2 and L3) to the single support (see also L1) on the opposite side of the contact assembly 400, the distance (in X direction) between the two supports (see also L2 and L3) on the same side of the contact assembly 400, and/or the thickness and material properties of each component (410, 430, 450) in the contact assembly 400. It will be appreciated that such embodiment may reduce the electrical resistance, with the added difficulty for assembly and the potential failure mode that the friction between the insulation layer 450 and the neighboring contact blade (410 or 430) may not allow for independent movement of the neighboring contact blades. It will further be appreciated that one embodiment to achieve the three point contact (L1, L2, L3) can be modifying the shape of the housing body slot 550 into slot that follows an arc that achieves the desired interference, constrained by the two ends of the outside arc and apex of inside arc between the two ends. It will be appreciated that any suitable embodiments or designs can be applied to provide the three lines of contacts (L1, L2, L3), regardless of if done with an arc shape or with other suitable features.

Figure 22A:
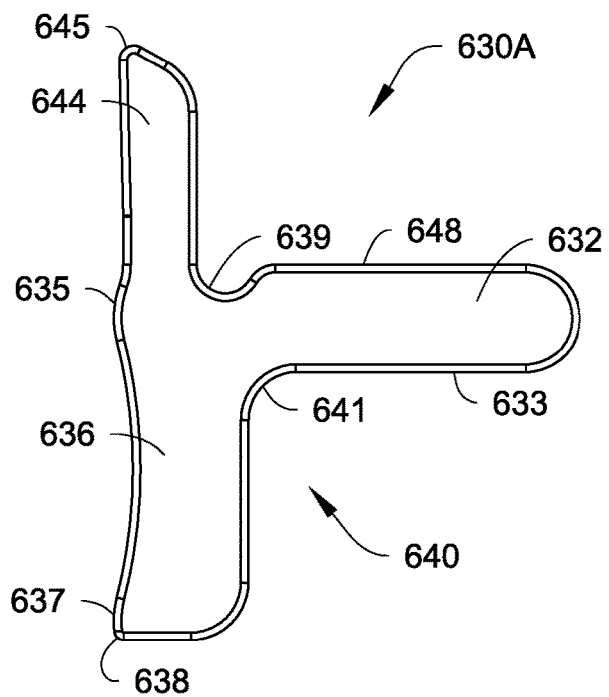
FIG. 22A is a side view of a DUT contact blade, according to an embodiment.
Figure 22B:
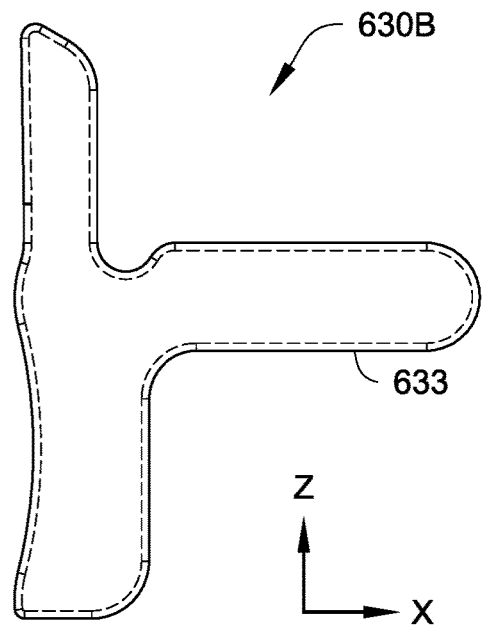
FIG. 22B is a side view of a DUT contact blade, according to another embodiment.

FIG. 22A is a side view of a DUT contact blade 630A, according to an embodiment. FIG. 22B is a side view of a DUT contact blade 630B, according to another embodiment. In an embodiment, the blade 630A can be a force blade and the blade 630B can be a sense blade each configured to electrically connect to a DUT terminal/pad (e.g., a terminal 112 on the DUT 110 of FIG. 2A). In another embodiment, the blade 630A can be a sense blade and the blade 630B can be a force blade. It will be appreciated that unless explicitly specified otherwise, the material, structure, and/or arrangement of blades 630A and/or 630B can be the same as or similar to those of the DUT contact blade 430 (430A, 430B). It will also be appreciated that unless explicitly specified otherwise, the material, structure, and/or arrangement of the blade 630A can be the same as or similar to those of blade 630B.

The blade 630A includes an upper stem 644, a lower stem 636, and an arm 632. The upper stem 644, the lower stem 636, and the arm 632 can be integral parts of a body of the blade 630A. An entire periphery or edge of the body of the blade 630A includes radius 633 (i.e., the circumference of the blade 630A is in a rounded form). It will be appreciated that in FIG. 22A, the radius 633 is shown as solid lines being rounded out of the paper. In FIG. 22B, the radius 633 is shown as dotted lines being rounded into the paper.

In an embodiment, the upper stem 644 is substantially aligned with the lower stem 636 in the Z direction (longitudinal/height/vertical direction). A width (in the width X direction) of the upper stem 644 can be smaller than a width of the lower stem 636. The upper stem 644 includes a tip 645 tapered toward an upper end of the upper stem 644. In operation, the tip 645 is configured to electrically connect to a contact terminal/pad (e.g., a terminal 112 on the DUT 110 of FIG. 2A). The lower stem 636 includes protrusions 635 and 637 at a first side (in the X direction) and at each end (in the Z direction) of the lower stem 636. A middle portion of the first side of the lower stem 636 can be curved in the X direction away from the protrusions 635 and 637. The lower stem 636 includes a bottom 638 tapered toward a lower end of the lower stem 636.

In an embodiment, the arm 632 extends from the lower stem 636 in the X direction away from the protrusions 635 and 637 and includes a rounded side in the X direction. The arm 632 and the lower stem 636 form a recess 640 having an opening and a rounded corner 641. The recess 640 is configured to receive an elastomer. The arm 632 includes a generally flat up-stop 648 configured to work with an up-stop of a housing slot (see FIG. 24) to prevent the arm 632 from moving up towards the DUT. The arm 632 and the upper stem 644 form a recess having an opening and a rounded corner 639.

Figure 22C:
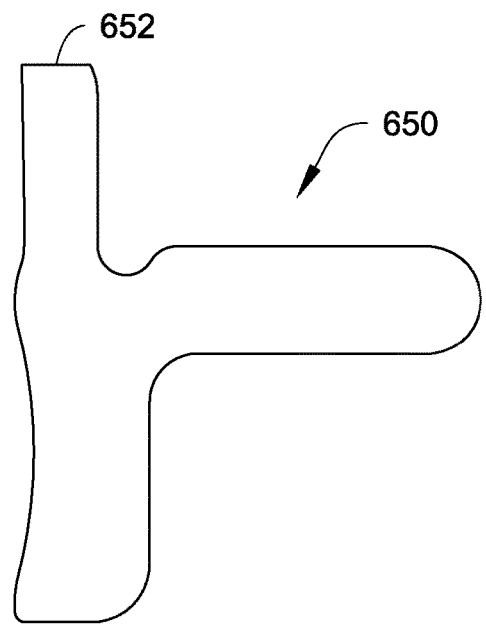
FIG. 22C is a side view of an insulation layer, according to an embodiment.
Figure 22D:
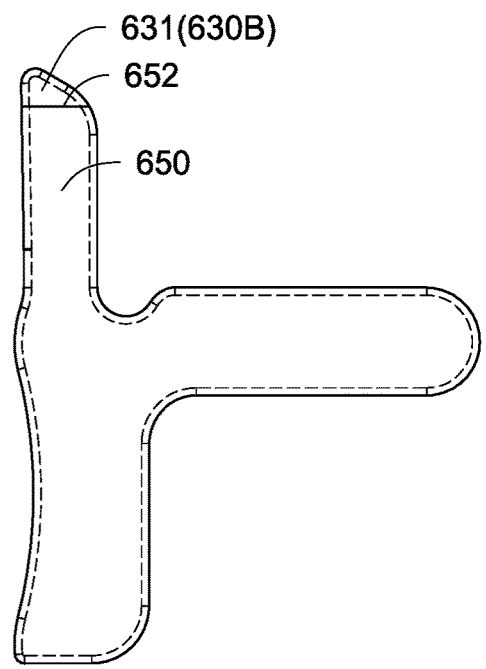
FIG. 22D is a side view of an insulation layer attached to a DUT contact blade, according to an embodiment.

FIG. 22C is a side view of an insulation layer 650, according to an embodiment. FIG. 22D is a side view of an insulation layer 650 attached to a DUT contact blade 630B, according to an embodiment. It will be appreciated that unless explicitly specified otherwise, the material, structure, and/or arrangement of the insulation layer 650 can be the same as or similar to those of the insulation layer 450.

As shown in FIG. 22C, the insulation layer 650 includes a flat end 652. As shown in FIG. 22D, the insulation layer 650 is attached to the blade 630B. The insulation layer 650 overlaps the entire blade 630B except that a portion 631 of the upper stem 644 is exposed from the insulation layer 650. Except the portion 631 of the upper stem 644, the shape of the insulation layer 650 can be substantially the same as or similar to the shape of the blade it attaches to. In an embodiment, the insulation layer 650 can overlap the entire blade it attaches to or overlap a portion of such blade.

It will be appreciated that the insulation layer 650 can also be attached to the blade 630A, the blade 610A, or the blade 610B. In some embodiments, the insulation layer 650 can be non-conductive and be glued, fixed, attached, coated, plated, painted, sprayed, made of photoresist, or by any other suitable attaching means, to the blade 610A/610B or 630A/630B, as long as the insulation layer 650 has mechanical robustness and/or strength to electrically isolate the two contact elements (force and sense). In an embodiment, the insulation layer 650 can be attached on a side of the blade (610A/610B or 630A/630B), covering at least a part of the entire side of the blade (610A/610B or 630A/630B). In another embodiment, the insulation layer 650 can be loose insulator (independent to the blade (610A/610B or 630A/630B), see FIG. 7E) instead of being attached to the blade (610A/610B or 630A/630B).

Figure 23A:
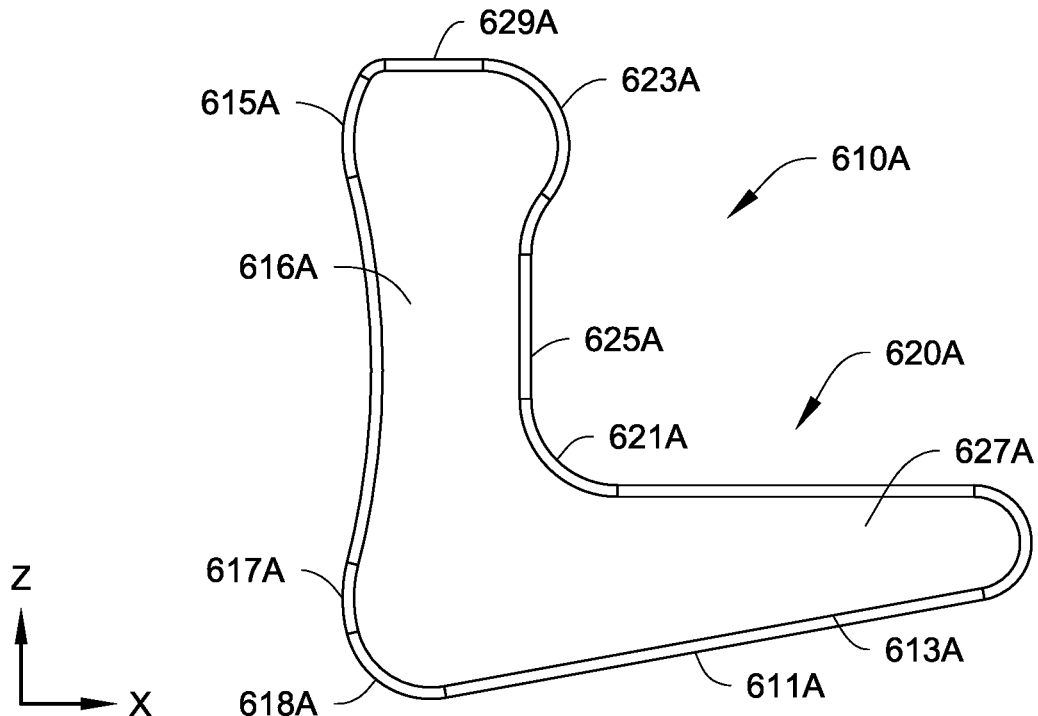
FIG. 23A is a side view of a load board contact blade, according to an embodiment.
Figure 23B:
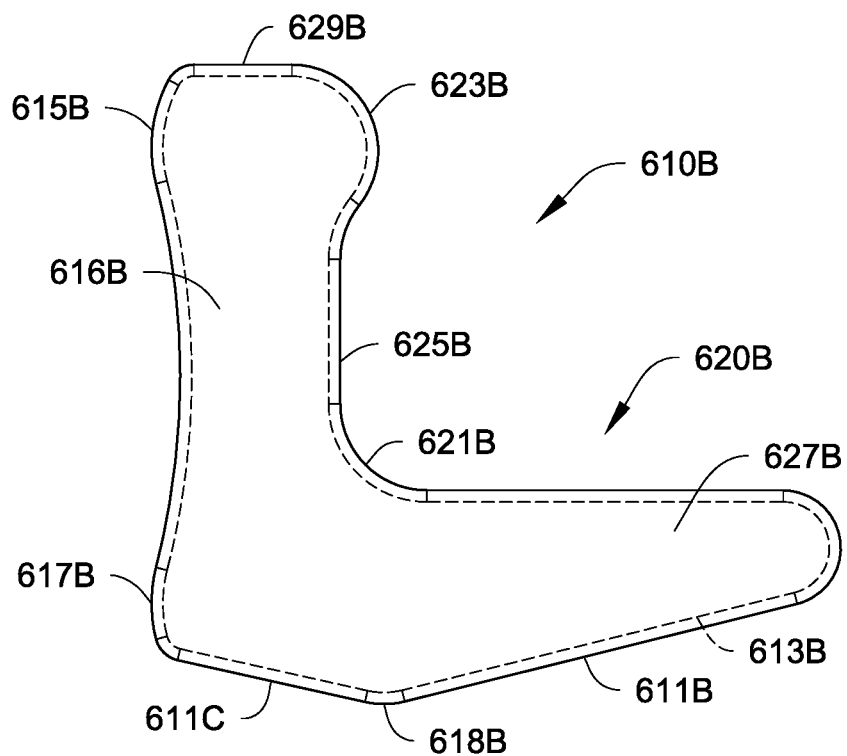
FIG. 23B is a side view of a load board contact blade, according to another embodiment.

FIG. 23A is a side view of a load board contact blade 610A, according to an embodiment. FIG. 23B is a side view of a load board contact blade 610B, according to another embodiment. In an embodiment, the blade 610A can be a force blade and the blade 610B can be a sense blade each configured to electrically connect to a load board terminal/pad (e.g., a force pad or a sense pad of a pair of pads 172 on the load board 170 of FIG. 2A). In another embodiment, the blade 610A can be a sense blade and the blade 610B can be a force blade. It will be appreciated that unless explicitly specified otherwise, the material, structure, and/or arrangement of blades 610A and/or 610B can be the same as or similar to those of the DUT contact blade 410 (410A, 410B). It will also be appreciated that unless explicitly specified otherwise, the material, structure, and/or arrangement of the blade 610A can be the same as or similar to those of blade 610B.

The blade 610A includes a stem 616A and an arm 627A. The stem 616A and the arm 627A can be integral parts of a body of the blade 610A. An entire periphery or edge of the body of the blade 610A includes radius 613A (i.e., the circumference of the blade 610A is in a rounded form). It will be appreciated that in FIG. 23A, the radius 613A is shown as solid lines being rounded out of the paper.

The stem 616A includes protrusions 615A and 617A at a first side (in the X direction) and at each end (in the Z direction) of the stem 616A. The stem 616A also includes a top end 629A. A middle portion of the first side of the stem 616A can be curved in the X direction away from the protrusions 615A and 617A. The stem 616A also includes a retention 623A protruding in the X direction away from the protrusions 615A and 617A. A generally vertical second side 625A is opposite to the first side in the X direction.

The arm 627A extends from the stem 616A in the X direction away from the protrusions 615A and 617A and includes a rounded side in the X direction. The arm 627A, the retention 623A, and the second side 625A form a recess 620A having an opening and a rounded corner 621A. The recess 620A is configured to receive an elastomer. The arm 627A includes a generally flat top and a bottom 611A having a clearance to the load board side in the Z direction. The arm 627A tapers toward the round side in the X direction.

The stem 616A includes an end 618A near the protrusion at the first side. The end 618A is connected to the bottom 611A of the arm 627A. The end 618A is the lowest of the blade 610A in the Z direction and is configured to electrically connect to a contact terminal/pad (e.g., one of a pair of contact pads 172 on the load board 170 of FIG. 2A). See also FIGS. 9A and 9B.

The blade 610B includes a stem 616B and an arm 627B. The stem 616B and the arm 627B can be integral parts of a body of the blade 610B. An entire periphery or edge of the body of the blade 610B includes radius 613B (i.e., the circumference of the blade 610B is in a rounded form). It will be appreciated that in FIG. 23B, the radius 613B is shown as dotted lines being rounded into the paper.

The stem 616B includes protrusions 615B and 617B at a first side (in the X direction) and at each end (in the Z direction) of the stem 616B. The stem 616B also includes a top end 629B. A middle portion of the first side of the stem 616B has a clearance in the X direction away from the protrusions 615B and 617B. The stem 616B also includes a retention 623B protruding in the X direction away from the protrusions 615B and 617B. A generally vertical second side 625B is opposite to the first side in the X direction.

The arm 627B extends from the stem 616B in the X direction away from the protrusions 615B and 617B and includes a rounded side in the X direction. The arm 627B, the retention 623B, and the second side 625B form a recess 620B having an opening and a rounded corner 621B. The recess 620B is configured to receive an elastomer. The arm 627B includes a generally flat top and a bottom 611B having a clearance to the load board side in the Z direction. The arm 627B tapers toward the round side in the X direction.

The stem 616B includes a bottom 611C having an end 618B at the second side of the stem 616B. The bottom 611C has a clearance to the load board side in the Z direction. The end 618B is connected to the bottom 611B of the arm 627B. The end 618B is the lowest of the blade 610B in the Z direction and is configured to electrically connect to a contact terminal/pad (e.g., one of a pair of contact pads 172 on the load board 170 of FIG. 2A). See also FIGS. 9A and 9B.

Figure 24:
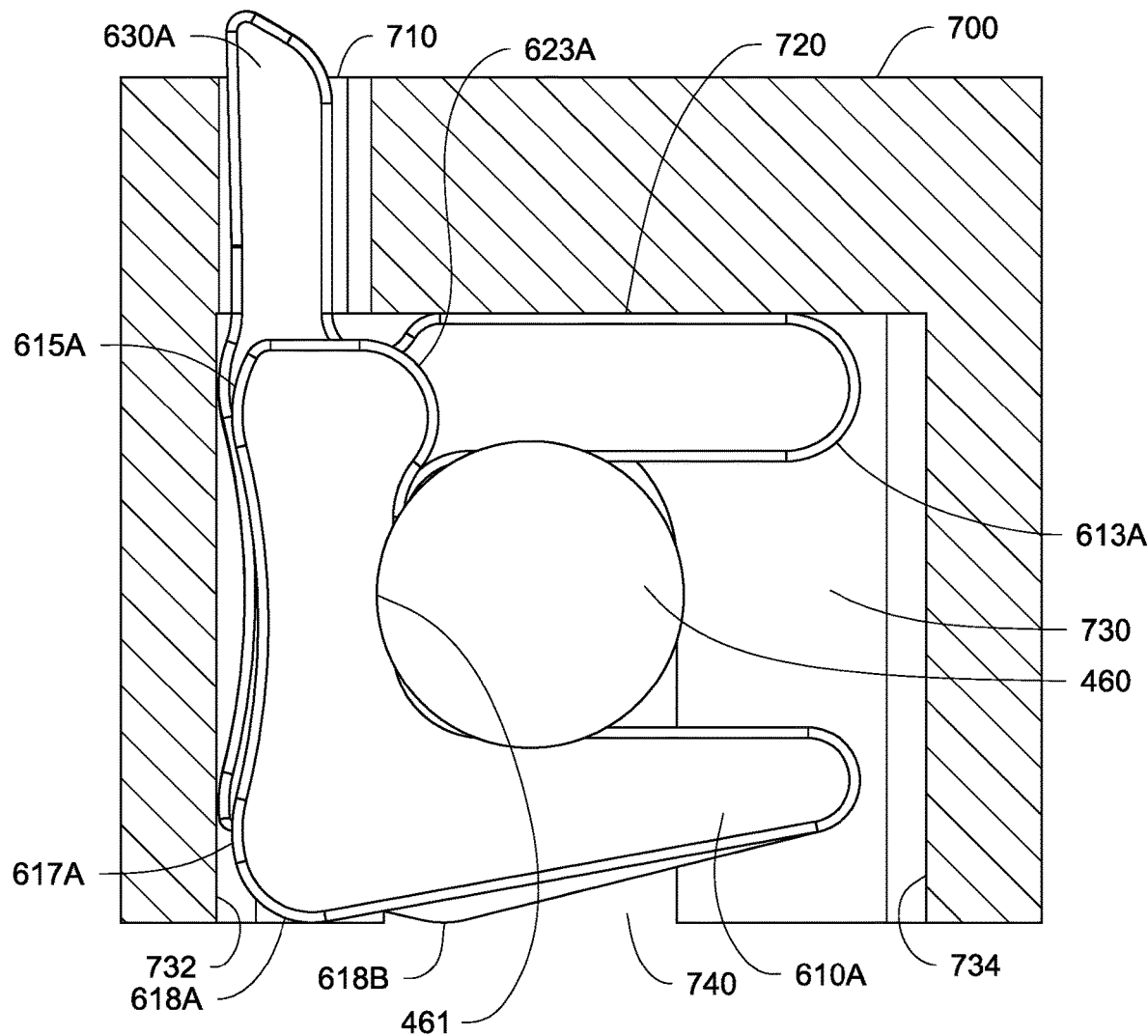
FIG. 24 is a cross sectional side view of a contact assembly being stacked in a housing of a socket, according to an embodiment.
Figure 25:
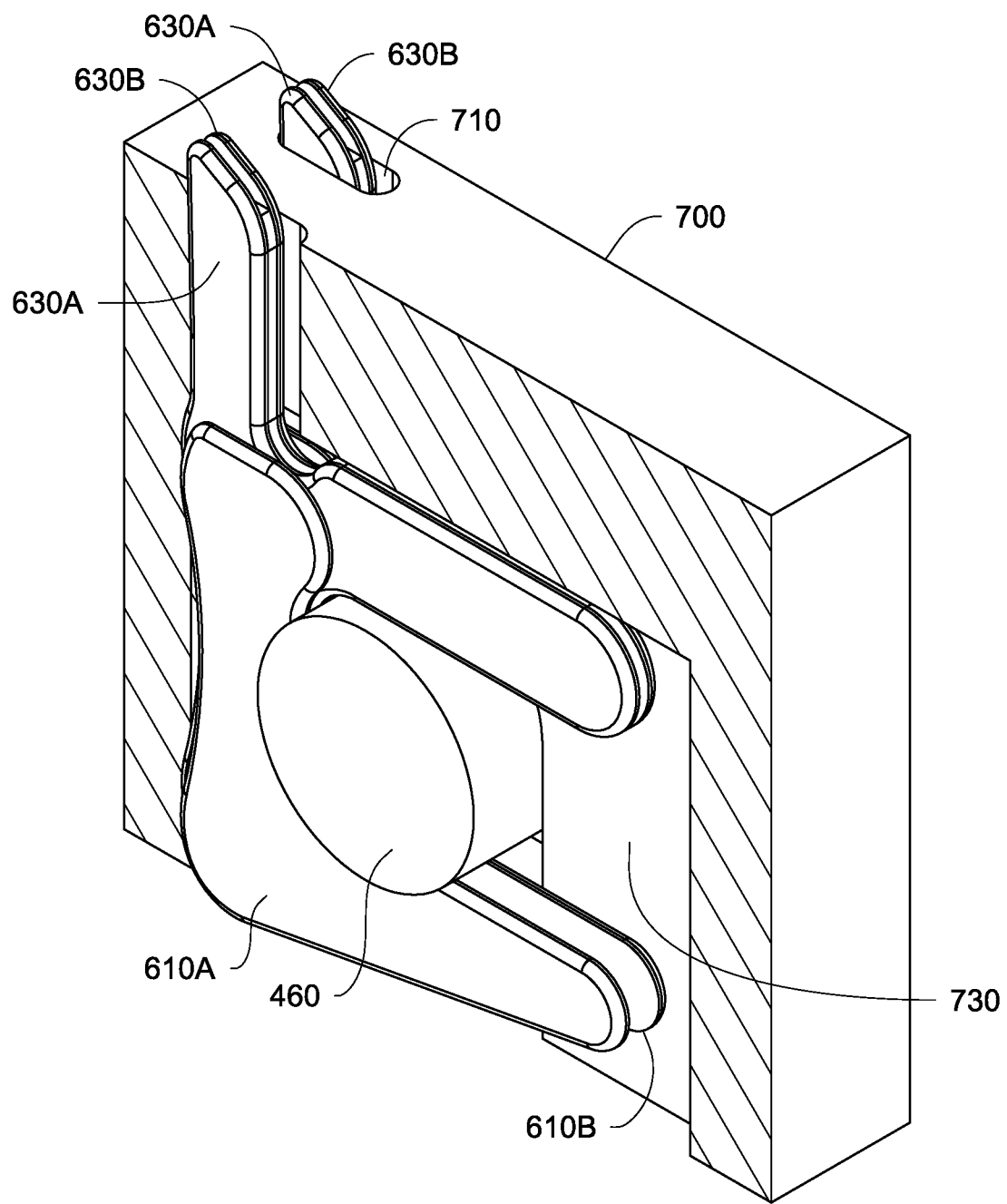
FIG. 25 is a perspective view of FIG. 24, according to an embodiment.
Figure 26A:
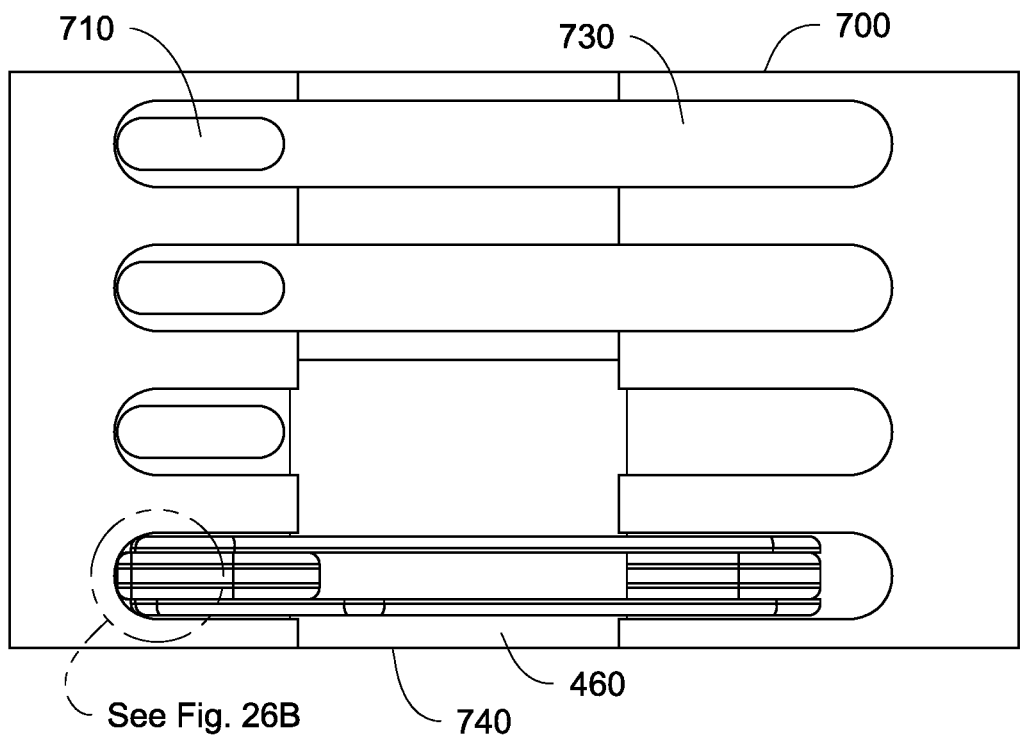
FIG. 26A is a bottom view of FIG. 24, according to an embodiment.
Figure 26B:
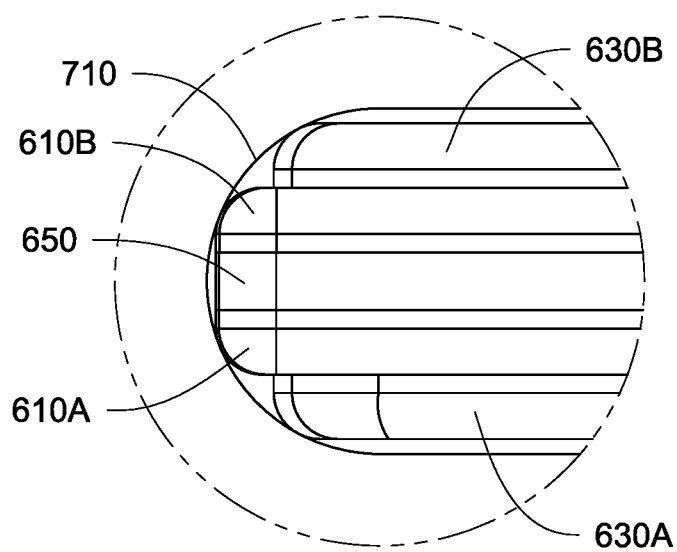
FIG. 26B is an enlarged portion of FIG. 26A, according to an embodiment.

FIG. 24 is a cross sectional side view of a contact assembly (610A, 630A, 650, 630B, 610B, and 460) being stacked in a housing 700 of a socket, according to an embodiment. See also FIG. 7A for a similar configuration. FIG. 25 is a perspective view of FIG. 24, according to an embodiment. FIG. 26A is a bottom view of FIG. 24, according to an embodiment. FIG. 26B is an enlarged portion "AT" of FIG. 26A, according to an embodiment. Unless explicitly specified otherwise, the contact assembly ((610A, 630A, 650, 630B, 610B) in the order and in a direction from the surface of the paper into the paper, and 460) can be the same as or similar to the contact assembly 400 described herein with the circumferential radius on each blade moved to the face to ensure tangency with the housing slot depending on the order of the blades. Unless explicitly specified otherwise, the housing 700 can be the same as or similar to the housing 155 described herein.

The housing 700 includes a tip slot 710 and a body slot 730. Each of the tip slot 710 and the body slot 730 has a stadium shape (or a pill shape, which is a two-dimensional geometric shape constructed of a rectangle with semicircles at a pair of opposite ends) in a bottom view (see FIG. 26A).

In an embodiment, a thickness of the tip slot 710 (in the Y direction) can be slightly larger than a combination of a thickness of the upper stem 644 of the blade 630A, a thickness of the insulation layer 650, and a thickness of the upper stem 644 of the blade 630B to e.g., facilitate installation. A thickness of the body slot 730 (in the Y direction) can be slightly larger than a combination of a thickness of the blade 610A, a thickness of the lower stem 636 of the blade 630A, a thickness of the insulation layer 650, a thickness of the lower stem 636 of the blade 630B, and a thickness of the blade 610B to e.g., facilitate installation. In another embodiment, the thickness of the body slot 730 can be slightly larger than a combination of the thickness of the tip slot 710, a thickness of the blade 610A, and a thickness of the blade 610B to e.g., facilitate installation.

In an embodiment, a width of the tip slot 710 (in the X direction) can be slightly larger than a width of the upper stem 644 of the blade 630A (or a width of the upper stem 644 of the blade 630B, or a width of an upper stem of the insulation layer 650), but less than a width of the blade 630A (or 630B) so that an up-stop 720 of the housing 700 can work with the up-stop 648 and be configured to prevent the arm 632 of the blade 630A (or 630B) from moving up towards the DUT. The width of the tip slot 710 can be less than a width of the top end 629A of the blade 610A (or the top end 629B of the blade 610B) so that an up-stop 720 of the housing 700 can be configured to prevent the end 629A (and/or 629B) from moving up towards the DUT. A width of the body slot 730 (in the X direction) can be larger than a width of the blade 630A/630B (or a width of the blade 610A/610B, or a width of the insulation layer 650).

The housing 700 also includes an elastomer slot 740 (in around a middle of the body slot 730) extending through an entire thickness of the housing 700 (see FIG. 26A) to receive the elongated elastomer 460 (which can be shared among a row/column of contact assemblies). As shown in FIG. 24, the elastomer 460 can be received in the elastomer slot 740 and enclosed by the elastomer slot 740, the recess 620A/620B, and the recess 640 of the blades 630A and 630B. A width of the elastomer slot 740 can be slightly larger than, the same as, or slightly smaller than a width of the elastomer 460, to e.g., facilitate the installation or provide bias against the blades (610A/610B/630A/630B).

In an embodiment, a location of the elastomer slot 740 and the width of the elastomer slot 740 can be configured so that the elastomer 460 (see the portion 461) can bias the blades towards a first side 732 (the front side) of the body slot 730, and away from a second side 734 (the back side) of the body slot 730. See also FIG. 26B where the periphery/edge radius (613A, 613B, and 633) is biased by the elastomer 460 against the inside front radius (the radius at the first side 732) of the body slot 730 and the inside front radius of the tip slot 710.

As shown in FIG. 26A, the tip slot 710 and the body slot 730 are tangent at the first side (see 732 of FIG. 24) with the location of the tip slot 710 and body slot 730 being adjustable when simultaneous changes in the mating contact feature locations; and the tip slot 710 is disposed within the body slot 730 in the bottom view.

As shown in FIGS. 24 and 25, the contact assembly is stacked into slots of the housing 700, with tip(s) 655 protruding upwards from a top surface of the housing 700 in the longitudinal direction (Z direction), and with two ends 618A and 618B spaced apart and protruding downwards from a bottom surface of the housing 700 in the longitudinal direction (Z direction). The ends 618A and 618B can be staggered and each configured to contact one pad 172 of a pair of contact pads on the load board 170.

Embodiments disclosed herein can provide snap in retention (see e.g., the retentions 623A and 623B) for less material and removal of electrical stub, compared with those with retention arms. As shown in FIG. 24, when assembled in the housing, the retentions 623A and 623B extend from a side of the elastomer in the X direction up to at or about a quarter or at or about a third (and less than at or about a half) of the width of the elastomer. In addition, with the snap in retention, there can be no need for preassembly of elastomer sub-assembly (e.g., the contact assemblies with the shared elastomer), and there can be simultaneously aligning contact sub-assemblies (e.g., the contact assemblies without the shared elastomer) into the respective housing slots, such that contact assembly components can be individually installed into the housing slots.

Embodiments disclosed herein can also provide contact edge radius (see e.g., radius 633, 613A, and 613B) that can reduce pressure of contact edge wearing on housing to extend housing life. Embodiments disclosed herein can further provide load board contacts with a contact group have staggered load board interface feet (see e.g., the ends 618A and 618B) that can increase the distance between contact points by adding diagonal component to make it easier to design load board layout. The location of the contact edge radius can be adjusted when the order of the contact stack is adjusted.

Embodiments disclosed herein can also bias contacts/blades to the front of body slot to counteract twisting of the contacts/blades under load to stay mostly vertical. Embodiments disclosed herein can further provide contacts/blades that each has two protrusions (see e.g., 635 and 537, or 615A and 617A, or 615B and 617B) in front contact to front of housing slot, with elastomer biasing force between the two interface patches. Such embodiments can help avoid failure mode when front profile deviates from line and creates a single interface patch, which may create a state of unstable equilibrium, with elastomer force potentially on either side of the interface to cause tilting and incorrect position of the contact tip.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A contact assembly for a Kelvin testing system for testing integrated circuit devices, comprising:
at least one grouping of blades including a first force blade, a second force blade, a first sense blade, and a second sense blade; the first force blade, the second force blade, the first sense blade, and the second sense blade being disposed in a side by side generally parallel relationship; the first force blade, the second force blade, the first sense blade, and the second sense blade being configured to be longitudinally slidable with respect to each other; the second force blade and the second sense blade being disposed between the first force blade and the first sense blade; the first force blade and the second force blade being staggered in a longitudinal direction; the first sense blade and the second sense blade being staggered in the longitudinal direction; the second force blade and the second sense blade being disposed between the first force blade and the first sense blade;
an electrical insulation layer disposed between the second force blade and the second sense blade; and
an elongated elastomer, the elastomer being configured to be retained by the first force blade, the second force blade, the first sense blade, and the second sense blade;
wherein each of the first force blade, the second force blade, the first sense blade, and the second sense blade includes an aperture having an opening and retention bumps and sized to receive and retain at least a portion of the elastomer;
wherein the first force blade, the second force blade, the first sense blade, and the second sense blade are electrically conductive; the insulation layer and the elastomer are non-conductive.

Aspect 2. The contact assembly according to aspect 1, wherein the aperture of each of first force blade, the second force blade, the first sense blade, and the second sense blade is generally C-shaped; and the elastomer has a generally cylindrical shape.

Aspect 3. The contact assembly according to aspect 1 or aspect 2, wherein the first force blade and the first sense blade are generally identical to each other, and the second force blade and the second sense blade are generally identical to each other.

Aspect 4. The contact assembly according to aspect 3, wherein each of the first force blade and the first sense blade has a general flat top, and a bottom having two hump-shaped protrusions and a recess between the protrusions.

Aspect 5. The contact assembly according to aspect 3 or aspect 4, wherein each of the second force blade and the second sense blade has a general flat up-stop, a stem protruding from the up-stop in the longitudinal direction, a generally triangle tip disposed above the stem, and a bottom having a hump-shaped protrusion.

Aspect 6. The contact assembly according to aspect 5, wherein the tip is a radius tip.

Aspect 7. The contact assembly according to any one of aspects 1-6, wherein each of the first force blade and the first sense blade has a general flat top, one of the first force blade and the first sense blade has a bottom having two hump-shaped protrusions and a recess between the protrusions, the other of the first force blade and the first sense blade has a bottom having one hump-shaped protrusion.

Aspect 8. The contact assembly according to any one of aspects 1-7, wherein an offset is provided between a tip of the second force blade and a tip of the second sense blade.

Aspect 9. The contact assembly according to any one of aspects 1-8, wherein the insulation layer is attached to an inner surface of the second force blade or an inner surface of the second sense blade to separate the first and second force blades from the first and second sense blades.

Aspect 10. The contact assembly according to aspect 9, wherein the insulation layer covers at least a portion of the inner surface of the second force blade or at least a portion of the inner surface of the second sense blade.

Aspect 11. The contact assembly according to any one of aspects 1-10, wherein the insulation layer is separated from the first force blade, the second force blade, the first sense blade, and the second sense blade.

Aspect 12. The contact assembly according to any one of aspects 1-11, further comprising one or more force blades.

Aspect 13. The contact assembly according to any one of aspects 1-12, wherein the openings of the first force blade, the second force blade, the first sense blade, and the second sense blade face a same direction.

Aspect 14. The contact assembly according to any one of aspects 1-13, wherein the openings of the first force blade and the first sense blade face a direction opposite to the openings of the second force blade and the second sense blade, such that the elastomer is enclosed and surrounded by a body of each of the first force blade, the second force blade, the first sense blade, and the second sense blade in a plan view.

Aspect 15. A Kelvin testing system for testing integrated circuit devices, comprising:
a device under test;
a load board; and
a contact assembly including:
at least one grouping of blades including a first force blade, a second force blade, a first sense blade, and a second sense blade; the first force blade, the second force blade, the first sense blade, and the second sense blade being disposed in a side by side generally parallel relationship; the first force blade, the second force blade, the first sense blade, and the second sense blade being configured to be longitudinally slidable with respect to each other; the second force blade and the second sense blade being disposed between the first force blade and the first sense blade; the first force blade and the second force blade being staggered in a longitudinal direction and disposed side by side; the first sense blade and the second sense blade being staggered in the longitudinal direction and disposed side by side;

an electrical insulation layer disposed between the second force blade and the second sense blade; and an elongated elastomer, the elastomer being configured to be retained by the first force blade, the second force blade, the first sense blade, and the second sense blade;

wherein each of the first force blade, the second force blade, the first sense blade, and the second sense blade includes an aperture having an opening and retention bumps and sized to receive and retain at least a portion of the elastomer;

wherein the first force blade, the second force blade, the first sense blade, and the second sense blade are electrically conductive; the insulation layer and the elastomer are non-conductive.

Aspect 16. The testing system according to aspect 15, wherein the device under test is quad-flat no-leads device or a dual-flat no-leads device.

Aspect 17. The testing system according to aspect 15 or aspect 16, further comprising:
a housing,
wherein the contact assembly is disposed inside the housing,
the elastomer is wedged into the housing to retain the contact assembly in the housing.

Aspect 18. The testing system according to aspect 17, wherein the housing includes at least one elastomer slot at the bottom of the housing, the elastomer slot has an arched door-shape, a key-hole shape, a rectangular shape, or a T-shape in a cross-sectional view.

Aspect 19. The testing system according to any one of aspects 15-18, further comprising:
a socket;
wherein the socket is configured to provide a pathway from inputs and outputs of the device under test to inputs and outputs of the load board, respectively.

Aspect 20. A method of assembling and positioning a contact assembly in a Kelvin testing system for testing integrated circuit devices, the method comprising:
attaching an insulation layer to an inner surface of a second force blade or an inner surface of a second sense blade to separate first and second force blades from first and second sense blades;
disposing the first force blade, the second force blade, the first sense blade, and the second sense blade in a side by side generally parallel relationship with the second force blade and the second sense blade being between the first force blade and the first sense blade;
orienting an opening of an aperture of each of the first force blade, the second force blade, the first sense blade, and the second sense blade to face a first direction;
retaining an elastomer into the aperture of each of the first force blade, the second force blade, the first sense blade, and the second sense blade from the opening in a second direction opposite to the first direction;
installing the contact assembly into a housing from a bottom of the housing;
loading the housing having the contact assembly onto a load board; and
loading a device under test on the housing.

Aspect 21. A contact assembly insertable into a contact housing, for conducting Kelvin testing of integrated circuit devices, comprising:

at least one grouping of blades including at upper force blade, an upper sense blade, a lower force blade, and a lower sense blade; the upper and lower force blade being disposed in and a side by side slideable relationship; the upper and lower sense blades being disposed in a side by side slideable relationship; an insulator being disposed between the upper and lower force blades and the upper and lower sense blades; the force and sense blades being laterally offset from each other by at least said insulator; force and sense blades each having recess aperture for receiving and retaining an elongated elastomer; and the elongated elastomer, the elastomer being configured to be retained by said blades;

wherein the upper force and sense blades each including a stem configured to engage a device under test (DUT), the upper force blade stem and the upper sense blade stem each including a contact tip, said force and sense tips being offset from each other;

wherein the upper force blade, the lower force blade, the upper sense blade, and the lower sense blade are electrically conductive; the insulator and the elastomer are non-conductive.

Aspect 22. The assembly of aspect 21, wherein said insulator is in contact with a sidewall of at least one blade.

Aspect 23. The assembly of aspect 21, wherein said insulator includes an insulating material and an airspace surrounding the insulator on its sidewalls and wherein the blades are not in direct contact with the insulator.

Aspect 24. The assembly of any one of aspects 21-23, wherein said tips have distal ends which are rounded.

Aspect 25. The assembly of any one of aspects 21-23, wherein said tips include a bulbous angled offset extension.

Aspect 26. The assembly of any one of aspects 21-25, wherein said stem extends upwardly, wherein said blades have a central vertical axis, and wherein said stem is located off said vertical axis so as to create a turning moment when said stem engages the DUT.

Aspect 27. The assembly of any one of aspects 21-26, wherein said tips include tip extensions.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A contact assembly for a Kelvin testing system for testing integrated circuit devices, comprising:
at least one grouping of blades including a first force blade, a second force blade, a first sense blade, and a second sense blade; the first force blade, the second force blade, the first sense blade, and the second sense blade being disposed in a side by side generally parallel relationship; the first force blade, the second force blade, the first sense blade, and the second sense blade being configured to be longitudinally slidable with respect to each other; the first force blade and the second force blade being staggered in a longitudinal direction; the first sense blade and the second sense blade being staggered in the longitudinal direction;
an electrical insulation layer disposed between the first force blade and the first sense blade and between the second force blade and the second sense blade; and
an elongated elastomer, the elastomer being configured to be retained by the first force blade, the second force blade, the first sense blade, and the second sense blade;
wherein each of the first force blade, the second force blade, the first sense blade, and the second sense blade includes a recess having an opening and sized to receive and retain at least a portion of the elastomer;
wherein the first force blade, the second force blade, the first sense blade, and the second sense blade are electrically conductive; the insulation layer and the elastomer are non-conductive, and
wherein the openings of the first force blade and the first sense blade face a direction opposite to the openings of the second force blade and the second sense blade, such that the elastomer is enclosed and surrounded by a body of each of the first force blade, the second force blade, the first sense blade, and the second sense blade in a plan view.

2. The contact assembly according to claim 1, wherein an entire periphery of each of the first force blade, the second force blade, the first sense blade, and the second sense blade includes a radius.

3. The contact assembly according to claim 1, wherein each of the first force blade, the second force blade, the first sense blade, and the second sense blade includes two protrusions at one side of the first force blade, the second force blade, the first sense blade, and the second sense blade.

4. The contact assembly according to claim 1, wherein each of the first force blade and the first sense blade has a general flat top, and a bottom having two hump-shaped protrusions and a recess between the protrusions.

5. The contact assembly according to claim 1, wherein each of the second force blade and the second sense blade has a general flat up-stop, a stem protruding from the up-stop in the longitudinal direction, a generally triangle tip disposed above the stem, and a bottom having a hump-shaped protrusion.

6. The contact assembly according to claim 5, wherein the tip is a radius tip.

7. The contact assembly according to claim 1, wherein each of the first force blade and the first sense blade has a general flat top, one of the first force blade and the first sense blade has a bottom having two hump-shaped protrusions and a recess between the protrusions, the other of the first force blade and the first sense blade has a bottom having one hump-shaped protrusion.

8. The contact assembly according to claim 1, wherein an offset is provided between a tip of the second force blade and a tip of the second sense blade.

9. The contact assembly according to claim 1, wherein the insulation layer is attached to an inner surface of the second force blade or an inner surface of the second sense blade to separate the first and second force blades from the first and second sense blades.

10. The contact assembly according to claim 9, wherein the insulation layer covers at least a portion of the inner surface of the second force blade or at least a portion of the inner surface of the second sense blade.

11. The contact assembly according to claim 1, wherein the insulation layer is separated from the first force blade, the second force blade, the first sense blade, and the second sense blade.

12. The contact assembly according to claim 1, wherein the at least one grouping of blades includes more than two force blades.

13. A Kelvin testing system for testing integrated circuit devices, comprising:
a device under test;
a load board; and
a contact assembly including:
at least one grouping of blades including a first force blade, a second force blade, a first sense blade, and a second sense blade; the first force blade, the second force blade, the first sense blade, and the second sense blade being disposed in a side by side generally parallel relationship; the first force blade, the second force blade, the first sense blade, and the second sense blade being configured to be longitudinally slidable with respect to each other; the first force blade and the second force blade being staggered in a longitudinal direction and disposed side by side; the first sense blade and the second sense blade being staggered in the longitudinal direction and disposed side by side;
an electrical insulation layer disposed between the first force blade and the first sense blade and between the second force blade and the second sense blade; and
an elongated elastomer, the elastomer being configured to be retained by the first force blade, the second force blade, the first sense blade, and the second sense blade;
wherein each of the first force blade, the second force blade, the first sense blade, and the second sense blade includes a recess having an opening and sized to receive and retain at least a portion of the elastomer;
wherein the first force blade, the second force blade, the first sense blade, and the second sense blade are electrically conductive; the insulation layer and the elastomer are non-conductive,
wherein the testing system further comprises a housing,
the contact assembly is disposed inside the housing,
the elastomer is wedged into the housing to retain the contact assembly in the housing,
the housing includes at least one elastomer slot at the bottom of the housing, the elastomer slot has an arched door-shape, a key-hole shape, a rectangular shape, or a T-shape in a cross-sectional view.

14. The testing system according to claim 13, wherein the device under test is quad-flat no-leads device or a dual-flat no-leads device.

15. The testing system according to claim 13, further comprising:
a socket;
wherein the socket is configured to provide a pathway from inputs and outputs of the device under test to inputs and outputs of the load board, respectively.

16. The testing system according to claim 13, wherein the elastomer is configured to bias the first force blade, the second force blade, the first sense blade, and the second sense blade to a first side of a slot of a housing.

* * * * *